United States Patent
Mizuno et al.

(10) Patent No.: US 7,209,842 B2
(45) Date of Patent: Apr. 24, 2007

(54) ACTIVATION SIGNAL OUTPUT CIRCUIT AND DETERMINATION CIRCUIT

(75) Inventors: Kazuo Mizuno, Nagoya (JP); Ryu Kimura, Chita-gun (JP); Yoshiyuki Kago, Nishio (JP); Yukiomi Tanaka, Takahama (JP); Kazuhiko Endo, Anjo (JP); Hisanori Uda, Nagoya (JP); Hiroaki Hayashi, Nagoya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 10/536,338

(22) PCT Filed: Nov. 26, 2003

(86) PCT No.: PCT/JP03/15114

§ 371 (c)(1),
(2), (4) Date: May 25, 2005

(87) PCT Pub. No.: WO2004/055970
PCT Pub. Date: Jul. 1, 2004

(65) Prior Publication Data
US 2006/0071654 A1    Apr. 6, 2006

(30) Foreign Application Priority Data
Nov. 29, 2002 (JP) ............... 2002-346862
Nov. 14, 2003 (JP) ............... 2003-385970

(51) Int. Cl.
*G06F 19/00* (2006.01)
(52) U.S. Cl. ............ 702/64; 702/75; 455/333; 455/334; 455/313; 327/478; 327/490; 327/113; 324/85; 363/52
(58) Field of Classification Search .......... 702/64–66, 702/75; 455/333, 313, 334; 327/478, 490, 327/489, 113; 324/85; 363/52
See application file for complete search history.

(56) References Cited

U.S. PATENT DOCUMENTS 5,929,710 A * 7/1999 Bien .................. 330/301

(Continued)

FOREIGN PATENT DOCUMENTS

EP    0 119 060    9/1984

(Continued)

OTHER PUBLICATIONS

Huang et al., 'A 0.5 mW Passive Telemetry IC for Biomedical Applications', Sep. 1997, IEEE Publication, pp. 172-175.*

(Continued)

*Primary Examiner*—Marc S. Hoff
*Assistant Examiner*—Elias Desta
(74) *Attorney, Agent, or Firm*—Harness, Dickey & Pierce, PLC

(57) ABSTRACT

A start signal output circuit having an RF/DC conversion circuit to which radio frequency power (RF) of specified frequency is inputted and from which a direct current potential (DC) is outputted, comprises a detection/amplification circuit 210 which includes a voltage doubler wave-detector circuit 10 configured including a sensing diode Q1 (Tr34) for sensing the RF power, a differential amplifier including differential pair transistors Tr31 and Tr32, and a current mirror circuit. A base current of one Tr31 of the differential pair transistors is brought into substantial agreement with a DC component of a current flowing through the sensing diode Q1 (Tr34). A total of currents flowing through the differential pair transistors Tr31 and Tr32 is regulated to a substantially constant value by the current mirror circuit. Thus, the start signal output circuit which is small in size, high in sensitivity and low in power consumption can be realized.

29 Claims, 35 Drawing Sheets

U.S. PATENT DOCUMENTS 6,993,314 B2 * 1/2006 Lim et al. .................. 455/333

FOREIGN PATENT DOCUMENTS

| GB | 1 274 166 | | 5/1972 |
|---|---|---|---|
| GB | 1 501 730 | | 2/1978 |
| JP | 61-237504 | A | 2/1986 |
| JP | 61-148903 | A | 7/1986 |
| JP | 63-91572 | A | 4/1988 |
| JP | 4-35308 | A | 2/1992 |
| JP | 40291167 | A | 10/1992 |
| JP | 2561023 | B2 | 9/1996 |
| JP | 2605827 | B2 | 2/1997 |
| JP | 10-56333 | A | 2/1998 |
| JP | 3202624 | A | 6/2001 |
| JP | 2002-517929 | A | 6/2002 |
| JP | 2002-314341 | A | 10/2002 |

OTHER PUBLICATIONS

Jones et al., 'Simple Radio Frequency Power Source for Ion Guides and Ion Traps', 1997, AIP, pp. 3357-3362.*

Boone et al., 'Current approaches to analogue instrumentation design in electrical impedance tornography', 1996, IOP Publication, pp. 229-247.*

European Office Action for corresponding European Application No. 03 813 294.0 dated Nov. 10, 2006.

* cited by examiner

INPUT −60 dBm

DETECTION/
AMPLIFICATION
CIRCUIT (210)

DETERMINATION
CIRCUIT (220)

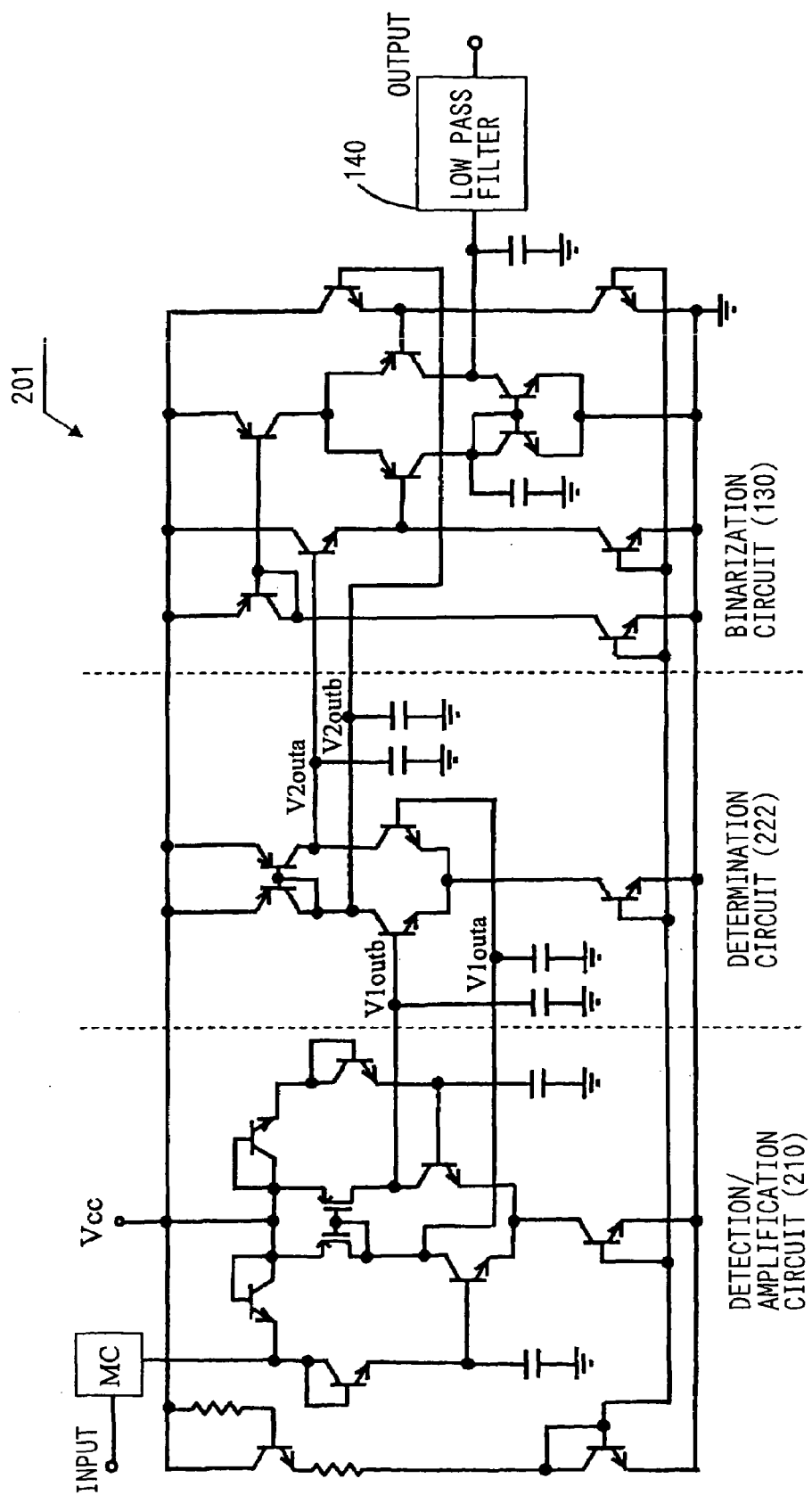

WAVE-DETECTOR AND DETECTION CIRCUIT

- Ⓒ CERAMIC CAPACITOR
- Ⓔ ELECTROLYTIC CAPACITOR
- Ⓕ FILM CAPACITOR
- Ⓜ MULTILAYER CERAMIC CAPACITOR

DETECTION CIRCUIT

FIGURE 6.26 SCHEMATIC DIAGRAM OF THE 725 LOW-DRIFT OPERATIONAL AMPLIFIER.

ACTIVATION SIGNAL OUTPUT CIRCUIT AND DETERMINATION CIRCUIT

TECHNICAL FIELD

The present invention relates to a start signal output circuit having an RF/DC conversion circuit, which inputs radio frequency power (RF) of specified frequency and outputs direct current potential (DC), and a determination circuit very useful for the start signal output circuit and the like.

Herein, the direct current potential (DC) signifies an output potential which is generated on the basis of a detection potential from a sensing diode as developing during a time period for which the level (amplitude) of a waveform determined by the envelope of the waveform of the radio frequency power (RF) has a substantially constant value or above.

Accordingly, in a case where the RF power arrives intermittently or where the arrival is periodic, the waveform of the DC potential can become periodic. Even in a case, for example, where the DC potential fluctuates periodically or intermittently in such a manner, the present invention is, of course, useful.

That is, in the case where the power level itself of the RF power to be detected is fluctuant or intermittent, the DC potential is consequently fluctuant or intermittent. Hereinbelow, such a potential shall be included in the above DC potential.

BACKGROUND ART

Inventions described in Japanese Patent No. 2,561,023, Japanese Patent No. 2,605,827, and JP-A-4-291167 relate to radio-frequency detection techniques based on diode wave detection. FIGS. 36 and 37 are circuit diagrams exemplifying radio-frequency detection circuits in the prior art. In order to convert radio frequency power into a direct current, a half-wave rectification operation achieved by a diode D in FIG. 36 or FIG. 37 is utilized by way of example. On this occasion, in order to limit a DC bias to, for example, about 1 µA in consideration of low power consumption, a resistor in the order of several MΩ is required as a resistor for use in the detection circuit, in either of the cases of FIGS. 36 and 37 when a supply voltage of 3 V is employed.

FIG. 38 is a circuit diagram exemplifying the arrangement of a general or typical start signal output circuit in the prior art, and the circuit arrangement is such that the wave-detector circuit in FIG. 37 and a general differential amplifier are combined. Regarding such a prior art device, applications are also found in, for example, Japanese Patent No. 3,202,624 and JP-A-10-56333. In the circuit arrangement in FIG. 38, a capacitor $C_{00}$ in FIG. 37 is arranged in series on a signal transfer line within a matching circuit (MC).

Meanwhile, as a prior art determination circuit which determines the level of an input potential, there has been generally and widely known, for example, a circuit which is described in "Guide to Electronic circuit Work for Learning by Fabrication" (authored by Seiichi Inoue and published by Sougou-Denshi Shuppan). Shown in FIGS. 39A and 39B is a prior art determination circuit (a wave-detector and detection circuit). Further, FIG. 39C is a waveform diagram showing the situation of the change of the output of the detection circuit shown in the circuit diagram of FIG. 39B. This circuit diagram shows the detection circuit of an ultrasonic distance measurement apparatus. As shown in FIG. 39B by way of example, a determination process in the prior art is executed by a comparator which is configured using an operational amplifier that requires a current of mA order.

Under the premise of a battery operation or the like, however, lowering power consumption as desired is difficult when the operational amplifier requiring the current of mA order is adopted. Further, when well-known heterodyne wave detection, for example, is performed, radio wave power at a low level of about −60 dBm can be detected. In such an apparatus, however, a signal generator, a LNA, a mixer, etc. must be always operated, and power consumption during a standby time period is therefore difficult to be suppressed. Thus, the target lower power consumption is not attained, either. On the other hand, the prior art sensing scheme based on the diode is difficult to enhance a sensing sensitivity. These circumstances will be major causes for making difficult the compatibility between the higher sensitivity and lower power consumption of the wave-detector circuit.

Moreover, in order to manufacture and put into practical use a start signal output circuit of wider applications, the following two problems will need be solved in addition to the above various problems:

(1) Problem of Adaptability to Temperature Environment

In a case where the start signal output circuit is to be utilized for, for example, an ETC or a "smart plate," it should desirably be applicable within a temperature range of about −30° C. to +60° C.

(a) Immunity Against Lowering of Supply Voltage

FIG. 40 is a graph exemplifying the discharge-temperature characteristics of a lithium battery which is commercially available. The battery is a cylindrical manganese-dioxide lithium battery. Its nominal voltage is 3 V, supposed continuous standard load is 20 mA, and service temperature range is −40° C. to +70° C. Shown in the graph are results obtained when, with a discharge load set at 60ω, output potentials were measured over about 30 hours. As seen from FIG. 40, the output voltage of the dry cell depends greatly upon the temperature, and it becomes drastically lower than the initial voltage of the battery at normal temperatures, in some situations of use thereof.

It is accordingly understood that, in a case where the battery operation is intended, especially in a case where the use of the battery in a cold district, for example, is also supposed for the desired start signal output circuit, an intense immunity against the lowering of the supply voltage is required.

Meanwhile, when a circuit operation is considered, the DC component of the sensing diode need be amplified in the start signal output circuit. Therefore, the output point P1 of the diode detection circuit and the input point P2 of the amplifier in the prior art example (FIG. 38) need be directly connected. As a result, the biases of the sensing diode and amplifier cannot be made independent. Accordingly, in order to hold a sensed output constant even when the supply voltage Vcc fed by the battery has lowered, the potential of the output point P1 of the diode detection circuit, the potential of the input point P2 on the amplifier side and the bias voltage Vbb for use in the amplifier need be lowered with the lowering of the supply voltage versus time, while they are always kept in balanced fashion.

In, for example, the start signal output circuit 900 shown in FIG. 38, even in a case where the resistances of resistors R1 and R2 are properly set so that the diode detection circuit and the amplifier may appropriately operate at a certain value of the supply voltage Vcc, a biased state changes when the supply voltage Vcc lowers.

On this occasion, however, unless the bias of the amplifier properly lowers in balanced fashion likewise to the bias of the diode detection circuit, the start signal output circuit 900 does not appropriately operate as a whole when the supply voltage Vcc lowers greatly. That is, the circuit of the prior art arrangement (example: start signal output circuit 900 in FIG. 38), which does not have a flexible corresponding mechanism (balancing function) capable of coping with such a problem relevant to the lowering of the output voltage of the power supply, is apprehended to erroneously operate in some cases.

Even if a precise operation is possible, the appropriate range of the supply voltage on that occasion narrows, and hence, a serviceable time period shortens in the case of using the battery as the power supply.

(b) Immunity Against Noise

Further, in a high-temperature environment, thermal noise, flicker noise, etc. are liable to develop within a circuit as is often observed in case of using, for example, MOSFETs for the circuit. Therefore, the start signal output circuit needs to have a predetermined immunity against the noises which develop within the circuit. That is, in order to realize the start signal output circuit whose sensitivity is high even in the environment of, for example, the wide range of temperatures as described above, a high S/N ratio need be secured in relation to the internal noises.

(2) Problem of Power Consumption of Determination Circuit

The determination circuit is required to determine ON/OFF (whether or not a signal has arrived) after the conversion from the RF into the DC. As also seen from the foregoing circuit arrangement in FIG. 39B, the addition of such a determination circuit leads to increase of power consumption. That is, it is not easy to operate the desired start signal output circuit as a whole, always at a low voltage and at a low current.

Considered as peripheral devices which require currents of mA order as can be supposed in the case of fabricating the RF/DC converter are, for example, a DC—DC converter or a regulator for ensuring a bias voltage, and an operational amplifier or a voltage comparator for amplifying and binarizing a result outputted from the RF/DC converter. However, when an apparatus configuration in which also the peripheral devices must be always operated is adopted, the start signal output circuit of very low power consumption cannot be eventually constructed as the whole apparatus.

Moreover, such a problem becomes an issue or is actualized especially in cases of battery drive, etc. In order to suppress the power consumption of the whole circuit to a low level, accordingly, the start signal output circuit will need to include a special determination circuit of low power consumption by itself.

Further, the problem of a high resistance need be taken into consideration. When the high resistance of about several MΩ is formed on an IC chip as shown in FIG. 37 by way of example, the resistance element becomes long, and hence, a large space is necessitated. As a result, the area of the resistance element facing the ground enlarges. Thus, a parasitic capacitance and a parasitic resistance appear between the resistance on the chip and the ground within a substrate, and radio frequency power leaks to the substrate. With such a simple configuration, therefore, radio frequency power at, for example, a frequency of 5.8 GHz and a low level of −60 dBm cannot be converted into a direct current by the diode.

Further, as other problems concerning the diode wave detection, it is pointed out that, in a case where the load resistance becomes high, the applied voltage between the anode and cathode of the diode becomes small, so radio frequency power cannot be converted into a direct current, and that, even in a case where the radio frequency power is successfully converted into the direct current, it is indistinguishable whether the output potential fluctuation of the diode is ascribable to the fluctuation of a bias or the DC conversion of the RF power.

The present invention is made in order to solve the above problems, and has an object to realize a start signal output circuit which is small in size, high in sensitivity and low in power consumption.

A further object of the invention is to realize a start signal output circuit whose serviceable temperature range is wide even in case of battery drive.

However, each object mentioned above may be individually accomplished by any and at least one of inventions to be described later, and the individual inventions of the present application shall not necessarily guarantee that means capable of simultaneously solving all the above problems be existent.

DISCLOSURE OF THE INVENTION

The first invention of the present application resides in a start signal output circuit having an RF/DC conversion circuit to which radio frequency power (RF) of specified frequency is inputted and from which a direct current potential (DC) is outputted. This conversion circuit includes a detection/amplification circuit which includes a sensing diode Q1 for sensing the radio frequency power; a transistor TrL for amplifying a direct current component $I_{Q1}$ of a current outputted by the sensing diode Q1; and a current mirror circuit including the transistor TrL as a circuit element; a base current $I_B$ of the transistor TrL being in substantial agreement with the direct current component $I_{Q1}$; an emitter current $I_E$ of the transistor TrL being confined by the current mirror circuit.

Further, the second invention of the present application resides in, in the current mirror circuit in the first invention, a reference transistor which has its emitter terminal connected to a predetermined ground point or feed point, and which is endowed with a predetermined load, thereby to determine a current quantity of the whole start signal output circuit; and a plurality of subsidiary transistors which have their emitter terminals connected to the emitter terminal of the reference transistor, and which have their base terminals connected to a base terminal of the reference transistor, thereby to pass currents in quantities substantially identical to a current quantity of the reference transistor, respectively.

Further, the third invention of the present application resides in, in the first or second invention, a differential amplifier. A transistor TrL forms one of differential pair transistors which are arranged in a signal input portion of the differential amplifier. A total of currents flowing through the differential amplifier is regulated to a substantially constant value by the current mirror circuit.

Further, the fourth invention of the present application resides in, in the third invention, a non-sensing diode Q2 which does not sense the radio frequency power. This diode Q2 is disposed in substantial symmetry to the sensing diode Q1 at least logically. While the radio frequency power is not inputted to the start signal output circuit, a cathode terminal of the non-sensing diode Q2 outputs the same voltage as a cathode terminal voltage of the sensing diode Q1, to a base terminal of the other TrR of the differential pair transistors.

The expression "in substantial symmetry at least logically" here signifies that a circuit need not always be in substantial symmetry physically, but that a circuit form which is substantially symmetric on a circuit diagram suffices.

Further, the fifth invention of the present application resides in that, in the fourth invention, a whole circuit of a differential circuit centering around the differential amplifier is configured in substantial symmetry.

Further, the sixth invention of the present application resides in that, in any of the third through fifth inventions, active loads of current mirror circuit are configured of two MOSFETs adopted as loads of the differential amplifier.

Further, the seventh invention of the present application resides in that, in the sixth invention, each of the MOSFETs is set at a gate length of at least 1 µm, and at a gate width of at least 2 µm.

Further, the eighth invention of the present application resides in, in any of the first through seventh inventions, a matching circuit, which is connected to the first terminal side of the sensing diode Q1 to which the radio frequency power is inputted, for efficiently inputting the radio frequency power.

Further, the ninth invention of the present application resides in that, in any of the first through eighth inventions, a stub or a resonator is connected to that second terminal side of the sensing diode Q1 to which the radio frequency power is outputted, so that both terminals of the stub or the resonator may be short-circuited for the specified frequency.

Further, the tenth invention of the present application resides in that, in any of the first through ninth inventions, the sensing diode Q1 is constructed of a transistor of N-P-N type or P-N-P type whose base and collector are directly connected as that first terminal of the sensing diode Q1 to which the radio frequency power is inputted, and whose emitter is used as that second terminal of the sensing diode Q1 to which the radio frequency power is outputted.

Further, the eleventh invention of the present application resides in, in any of the first through tenth inventions, the detection/amplification circuit includes a voltage doubler wave-detector circuit which is configured in such a way that an output end of a capacitor C1 located in an input portion for the radio frequency power, and a cathode end of a diode D1 having its anode end grounded radio-frequency-wise are connected to an anode end of the sensing diode Q1, and that one end of a capacitor C2 having its other end grounded radio-frequency-wise is connected to a cathode end of the sensing diode Q1.

Herein, the capacitor C1 may be arranged between the detection/amplification circuit and a predetermined matching circuit, it may be constructed as the radio frequency power input portion of the detection/amplification circuit, or it may be constructed as part of a predetermined matching circuit. Such discrimination ends in the problem of the mere definition (division) of what the matching circuit extends to or what the detection/amplification circuit extends from.

Further, the twelfth invention of the present application resides in that, in any of the first through eleventh inventions, a binarization circuit using CMOS is disposed at a succeeding stage of the start signal output circuit, and an output signal of the start signal output circuit is binarized by the binarization circuit.

Further, the thirteenth invention of the present application resides in a determination circuit which is configured including a differential amplifier that is in substantial symmetry logically, and which compares an input level with a reference potential. The determination circuit is characterized in that regarding a pair of load resistances Ra and Rb which oppose to each other in substantial symmetry at least logically, and which regulate currents to flow through the differential amplifier, while constituting a load portion of the differential amplifier, the load resistance Ra on an input fluctuation side whose input level fluctuates in correspondence with existence or nonexistence of an input of the radio frequency power is set lower than the load resistance Rb on a determination criterion input side.

Further, the fourteenth invention of the present application resides in that, in the thirteenth invention, a difference $\Delta R$ ($=Rb-Ra>0$) between the load resistance Ra and the load resistance Rb is adjusted as desired, thereby to freely set a sensitivity of an output potential to an input potential.

Further, the fifteenth invention of the present application resides in that, in a determination circuit which is configured including a differential amplifier that is in substantial symmetry logically, and which compares an input level with a reference potential, a load portion of the differential amplifier for regulating currents to flow through the differential amplifier has a current mirror circuit configuration, and the load portion is configured of asymmetric active loads.

Further, the sixteenth invention of the present application resides in that, in the fifteenth invention, the active loads consist of two bipolar transistors.

Further, the seventeenth invention of the present application resides in that, in any of the thirteenth through sixteenth inventions, the differential amplifier includes two sets of amplification circuits each of which is configured by Darlington-connected two transistors, the two sets being opposed to each other in substantial symmetry at least logically.

Further, the eighteenth invention of the present application resides in that, in any of the thirteenth through seventeenth inventions, a binarization circuit using CMOS is disposed at a succeeding stage of the determination circuit, and the binarization circuit binarizes a determined result outputted by the determination circuit.

Further, the nineteenth invention of the present application resides in that, in a start signal output circuit having an RF/DC conversion circuit to which radio frequency power (RF) of specified frequency is inputted, and from which a direct current potential (DC) is outputted, the determination circuit defined in any of the thirteenth through eighteenth inventions is provided.

Further, the twentieth invention of the present application resides in that, in any of the first through twelfth inventions, the determination circuit as defined in any of the thirteenth through eighteenth embodiments is provided.

Further, the twenty-first invention of the present application resides in that, in any of the first through twelfth inventions or in the nineteenth or twentieth invention, a low-pass filter or a low-band amplification circuit using a stub, a resonator, an inductor or a smoothing capacitor is provided. Thus, regarding a transfer function of the direct current potential (DC) for a detected potential ($\delta v$) of the sensing diode Q1, a low-pass filter characteristic of narrow band as abruptly monotonously decreases especially in a vicinity of a direct current versus frequency values is afforded.

Owing to the above inventions of the present application, the problems described above can be solved effectively or reasonably. Advantages which are attained by the inventions of the present application are as described below.

As the most important featuring part of the present invention, it is of importance (major feature 1) that the wave-detector circuit is incorporated into the differential amplifier by adopting the circuit arrangement in which the diode for regulating the bias voltage or bias current of the differential amplifier is used also as the sensing diode, and (major feature 2) that the bias current of the wave-detector circuit is configured by using the current mirror circuit.

Now, in conformity with the sequence in which the individual inventions are stated, the major feature 2 which is provided by the first and second inventions of the present application will be first described before the description of the functions and advantages of the major feature 1.

According to the first invention of the present application, bias currents which flow through the sensing diode Q1 and the transistor TrL are stably controlled by constant currents which are determined by the current mirror circuit. That is, the above circuit elements are operated by the currents which are stably fed by the current mirror circuit from the single supply voltage, so that even when the bias currents lowers due to the lowering of the supply voltage, the circuit elements are fed with the bias currents which have lowered relatively. As a result, the operable lower-limit value of the supply voltage can be made lower. Therefore, the start signal output circuit becomes immune against temperature changes, and the operable time period thereof can be lengthened.

Further, the transistor TrL and the sensing diode Q1 are connected so that the base current of the transistor TrL may become the current which flows through the sensing diode Q1. Therefore, the bias current flowing through the sensing diode Q1 can be decreased to 1/(current amplification factor $\beta$) of the current to flow through the transistor TrL. That is, the current to flow through the transistor TrL is limited to a small value by the current mirror circuit, whereby the bias current of the sensing diode Q1 can be controlled to the very small value equal to $1/\beta$ of the limited current value, and a stable control is permitted by the current mirror circuit. As a result, a region of higher nonlinearity in the V-I characteristic of the sensing diode Q1 can be used, and hence, the rectified value of radio frequency power enlarges. That is, detection sensitivity can be enhanced.

Further, to make the bias current of the sensing diode Q1 very small by the configuration is equivalent to make the load resistance of the sensing diode Q1 very large. Herein, since the load resistance is realized by the connectional relation of the sensing diode Q1 and the transistor TrL, the large load resistance is successfully formed by a minute area, and a stray capacitance which forms a cause for lowering the sensitivity can be decreased.

Thus, according to the first invention of the present application, it is not necessary to employ the large-area resistance of M$\Omega$ order as described above, having the parasitic components, so that the problem of the radio frequency leakage can be eliminated.

By way of example, the current mirror circuit can be realized by including as in the second invention of the present application, the reference transistor which determines the current quantity of the whole start signal output circuit by having its emitter terminal connected to the predetermined ground point or feed point and being endowed with the predetermined load, and the plurality of subsidiary transistors which pass currents in quantities substantially identical to the current quantity of the reference transistor, respectively, by having their emitter terminals connected to the emitter terminal of the reference transistor and having their base terminals connected to the base terminal of the reference transistor.

The transistor Tr6 in FIG. 1, for example, forms part of the current mirror circuit, and it determines the current of the current mirror circuit. Hereinbelow, such a transistor (Tr6) shall be referred to as the "reference transistor" of the current mirror circuit. Further, transistors which pass the currents in substantially the identical quantities in conformity with the reference transistor (Tr6) in the current mirror circuit, for example, the transistors Tr5, Tr9 and Tr11 in FIG. 1, shall be referred to as the "subsidiary transistors" of the current mirror circuit.

Now, the major feature 1 described above will be described.

According to the third invention of the present application, the differential amplifier is disposed, and the transistor TrL is set as one of the differential pair transistors of the differential amplifier. The total of currents which flow through the differential amplifier is controlled to be constant by a current mirror circuit. As in the first invention, therefore, bias currents which flow through the differential amplifier that includes the sensing diode Q1 and the transistor TrL can be stably controlled by the current mirror circuit. Consequently, the bias currents can be fed to the differential amplifier on the basis of the single supply voltage while being stabilized by the current mirror circuit, with the result that the biases of the individual circuit elements change uniformly in accordance with a supply voltage fluctuation. Accordingly, the same advantages as in the first invention are achieved. Further, owing to the use of the differential amplifier, the DC voltage rectified by the sensing diode Q1 can be detected as a difference from the reference voltage which changes in correspondence with the supply voltage, so that the detection sensitivity for the radio frequency signal is enhanced, and the stability of the detection against the supply voltage fluctuation is enhanced.

Further, according to the fourth invention of the present application, in bestowing the reference voltage on the differential amplifier, the non-sensing diode Q2 which does not sense the radio frequency power is connected to the differential amplifier in symmetry to the sensing diode Q1 circuit-wise. Therefore, the differential output can be set as a zero reference during a time period for which the radio frequency signal is not detected. Further, both the sensed voltage based on the sensing diode Q1 and the reference voltage change similarly in correspondence with the fluctuation of the supply voltage and the temperature fluctuation, so that the components of the fluctuations are not involved in the differential output which is determined on the basis of both the voltages, and the detection precision is enhanced. As a result, the operable lower-limit value of the supply voltage can be made still lower.

That is, according to the fourth invention of the present application, in the case where the differential amplifier is introduced into the detection/amplification circuit (wave detection/amplification circuit), both the bias potentials of the differential pair transistors during the time period for which the radio frequency power does not arrive can be always brought into substantial agreement. Therefore, the undesired influences of the drift of the supply voltage on both the bias potentials can be reliably excluded.

However, the circuit arrangement centering around the differential amplifier need not always be a symmetric configuration as exemplified in FIG. 2. In, for example, the circuit arrangement centering around the differential amplifier in FIG. 2, parts enclosed with broken lines (smoothing capacitors Ca and resonators Reso) are located in bilateral arrangement on the basis of the fifth invention of the present application, but the smoothing capacitor Ca and the resonator Reso which are connected to the base terminal of the right transistor TrR of the differential pair transistors are not always required.

Essentially important here is that both the bias potentials of the differential pair transistors during the time period for which the radio frequency power does not arrive are held in approximate agreement. Of course, it is ideal that both the bias potentials are in substantial agreement, but it suffices that they lie within a range in which the circuit operates normally. The resistances of elements having resistors which afford the bias. potentials and which are located in series on a power feed path are held in substantial agreement by, for example, configuring the employed elements in bilateral symmetry as in the fifth invention, whereby both the bias potentials of the differential pair transistors during the time period for which the radio frequency power does not arrive come into substantial agreement surely.

Further, to be strict, the resistances of the elements having such resistors exhibit temperature dependencies. However, when the elements which determine the resistances on the power feed path are afford the bias potentials are located in bilateral symmetry, both the bias potentials of the differential pair transistors always become the same potentials surely during the time period for which the radio frequency power does not arrive. Therefore, it is possible to reliably avoid the drawback as described above that the sign of the difference ((detection side DC)−(referential DC)) of the output potentials is unreasonably reversed due to a drift factor such as the drop of the supply potential.

Further, according to the fifth invention of the present application, it becomes very simple to design the detection/amplification circuit (wave detection/amplification circuit) which is configured centering around the differential amplifier. Also, according to the fifth invention of the present application, the functions and advantages based on the fourth invention can be surely attained owing to the symmetry of the circuit.

Further, according to the sixth invention of the present application, the loads of the differential amplifier can be effectively constructed without employing high resistances of large areas.

Further, according to such a configuration, currents (load currents) flowing toward the differential pair transistors on the detection potential side and the comparison reference side can be always controlled to the same quantities.

Further, regarding MOSFETs, it is well known that flicker noise is heavy. In particular, it is known from, for example, "RF CMOS circuit design technology" (written by Nobuyuki Itoh, and published by Kabushiki-Kaisha Triceps) that the enlargements of gate lengths and gate widths are effective as a countermeasure for lowering the flicker noise by means other than fabricating methods in a manufacturing process. That is, according to the seventh invention of the present application, the flicker noise of the MOSFETs can be effectively suppressed.

Further, in accordance with the eighth invention and ninth invention of the present application, the configuration in which the sensing diode is interposed between, for example, the matching circuit and the resonator is adopted, whereby desired radio frequency power can be efficiently applied to the first terminal side to which the radio frequency power of the sensing diode is inputted.

Further, according to the tenth invention of the present application, the high versatility of the circuit arrangement can be secured. That is, the tenth invention has such wide range of applications that the start signal output circuit can be performed even when transistors of P-N-P type are employed for the sensing diode, etc.

Exemplified in FIG. 1 is the circuit form in which transistors of N-P-N type are adopted for the sensing diode, the reference transistor and the subsidiary transistors. However, in a case where the transistors of the P-N-P type are substantially similarly employed for the sensing diode, reference transistor and subsidiary transistors, and where the alterations of the circuit arrangement, such as the replacement of the feed point and the ground point, are made, the current mirror circuit in which the directions of current flows are reversed to those in FIG. 1 can also be configured. In such a case, the emitter terminal of the reference transistor is connected to the predetermined feed point, whereby the desired start signal output circuit can be similarly configured.

Further, according to the eleventh invention of the present application, as illustratively explained in, for example, "Design and Manufacture of Radio frequency circuit" (written by Kenji Suzuki, and published by CQ Publishing Co., Ltd.), a high detection sensitivity can be attained by the voltage doubler rectification operation which is based on the booster circuit (voltage doubler rectification circuit) employing the sensing diode as one (boosting diode) of circuit elements.

Further, according to the twelfth invention of the present application, the binarization circuit can be configured at low power consumption, so that the start signal output circuit which is of low power consumption as the whole can also be realized. That is, according to the twelfth invention, the circuits preceding to the binarization circuit, such as the detection/amplification circuit, can be enhanced in performance by the configuration of the low power consumption, so that the CMOS circuit requiring the DC potential input of high level can also be employed for the succeeding binarization circuit.

Further, according to the thirteenth invention of the present application, in the determination circuit, it is permitted or facilitated that the relation between the magnitudes of the determination criterion potential and the detection potential, in two outputs which fluctuate in accordance with the existence or nonexistence of the arrival (detection) of radio frequency power, be greatly inverted on the basis of the existence or nonexistence. With such settings, accordingly, it is permitted or facilitated to enhance the detection sensitivity or to sharply decrease erroneous detection. Further, with such settings, it is permitted or facilitated to effectively suppress the number of transistors to be used and power consumption in the whole start signal output circuit.

Further, according to the fourteenth invention of the present application, the sensitivity of the output potential to the input potential can be freely set. When the offset (difference $\Delta R \equiv Rb - Ra > 0$) is made excessively large, the detection sensitivity becomes dull. When it is made excessively small, the erroneous detection becomes liable to occur due to noise. The offset (difference $\Delta R$) should desirably be set at a value which is equal to about ⅓–⅔ of a detection potential $\delta v$ that corresponds to an intensity (standard detection level) to serve as the standard of desired radio frequency power.

Further, the determination circuit affords determination means which is very effective for the start signal output circuit having the RF/DC conversion circuit, and hence, according to the nineteenth or twentieth invention of the present application, it is permitted or facilitated to configure the start signal output circuit of very low power consumption.

Further, according to the twenty-first invention of the present application, the low-pass filtering and amplification are attained only in the vicinity of the direct current with respect to frequency values. The other noises can therefore be effectively eliminated, so that a sensitivity can be enhanced much more than in the prior art diode wave detection.

In a case where these configurations are realized by analog circuits of low power consumption, the transfer function usually becomes a monotonous decrease function versus the frequency.

BRIEF DESCRIPTION OF THE DRAWINGS

FIG. 30 is a circuit diagram of a start signal output circuit 201 in the fourth embodiment.

BEST MODE FOR CARRYING OUT THE INVENTION

Now, the present invention will be described in conjunction with practicable embodiments. The mode for carrying out the invention, however, is not restricted to the individual embodiments given below.

(First Embodiment)

Figure 1:
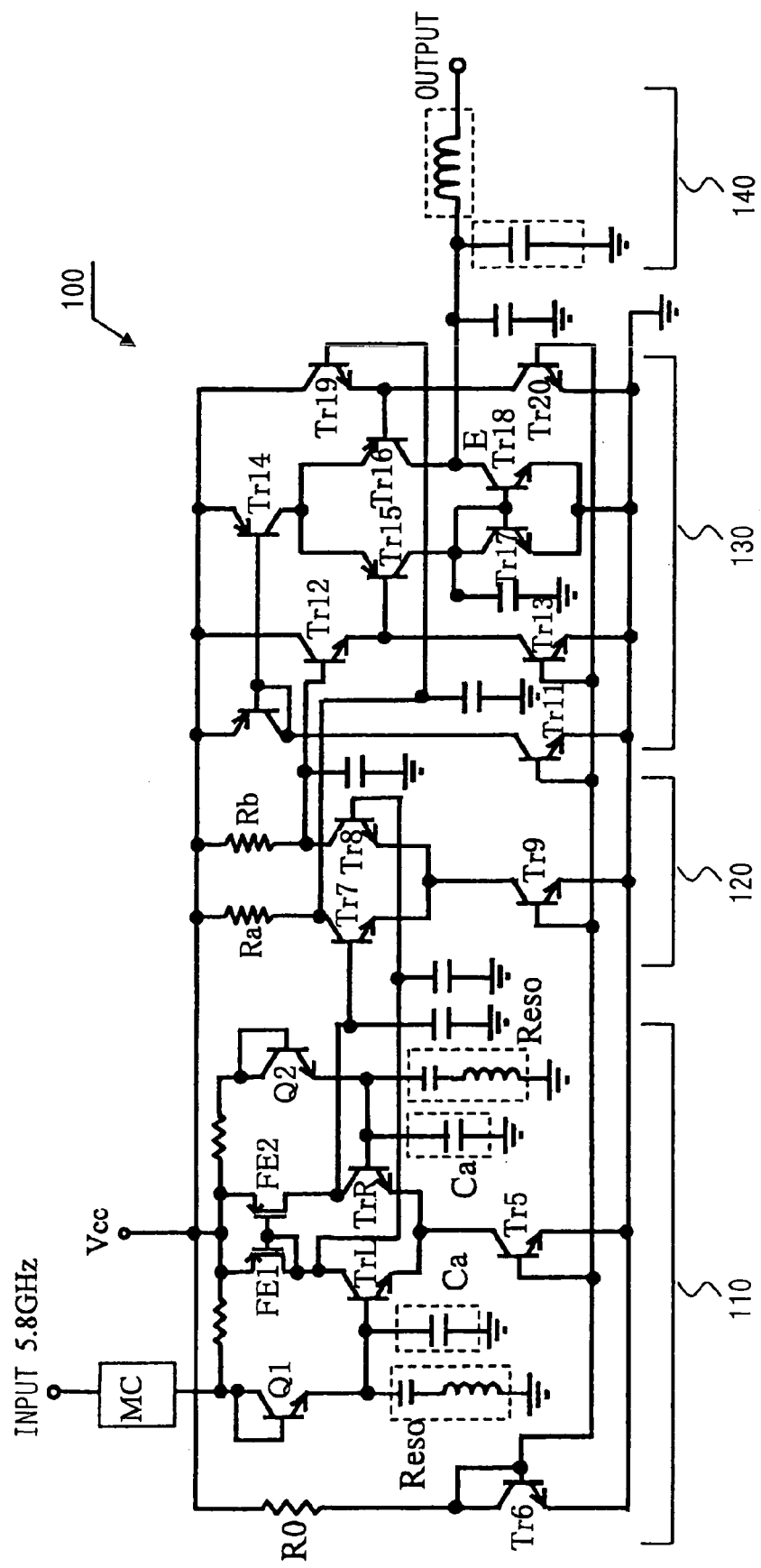
FIG. 1 is a circuit diagram of a start signal output circuit 100 in the first embodiment.

FIG. 1 is a circuit diagram of a start signal output circuit 100 in this embodiment. The start signal output circuit 100 includes an RF/DC conversion circuit to which radio frequency power (RF) of specified frequency is inputted and from which a direct current potential (DC) is outputted.

<Outline of Functions of Whole Start Signal Output Circuit 100>

In the start signal output circuit 100, input power (radio frequency) is first converted into a DC via a matching circuit, a sensing diode Q1 and a low-pass filter (Reso, Ca), and the DC is amplified by a transistor TrL of differential pair transistors, thereby to amplify the potential difference between the collector terminals of the differential pair transistors TrL and TrR. The potential of the base terminal of the transistor TrR is internally set by employing the fifth invention of the present application.

In a determination circuit 120 at a succeeding stage, a threshold value (offset) is set for the DC potential thus detected and amplified in and outputted from a detection/amplification circuit 110. When the outputted DC potential exceeds the threshold voltage (offset), an output stage (a determined-result binarization circuit 130) becomes saturated, and an excitation potential (=start signal) at substantially the same level or in substantially the same order as that of a supply voltage can be obtained.

<Outline of Arrangement of Whole Start Signal Output Circuit 100>

A transistor Tr6 in the start signal output circuit 100 forms part of a current mirror circuit. It determines the current of the current mirror circuit. As described above, such a transistor (Tr6) is referred to as a "reference transistor" of the current mirror circuit. The start signal output circuit 100 is mainly configured of the detection/amplification circuit 110, the determination circuit 120, a determined-result binarization circuit 130, and an LC filter section 140. Further, since the current mirror circuit is utilized as described above, the supply voltage to be prepared consists only of a positive potential Vcc in the figure as can be provided by, for example, a battery, and a special bias power supply circuit or the like for providing any other potential is not required at all.

The start signal output circuit 100 in FIG. 1 forms a multiple output type having a plurality of subsidiary transistors. Similar to a transistor Tr5, transistors Tr9, Tr11, Tr13 and Tr20 are the subsidiary transistors whose reference transistor is the transistor Tr6.

Further, in order to enhance a sensing precision, the start signal output circuit 100 is designed so that almost only the DC component of the potential outputted by the detection diode Q1 may be amplified through the whole circuit.

(Configurations of Respective Stages)

1. Preceding Stage (Detection/Amplification Circuit 110)

Figure 2:
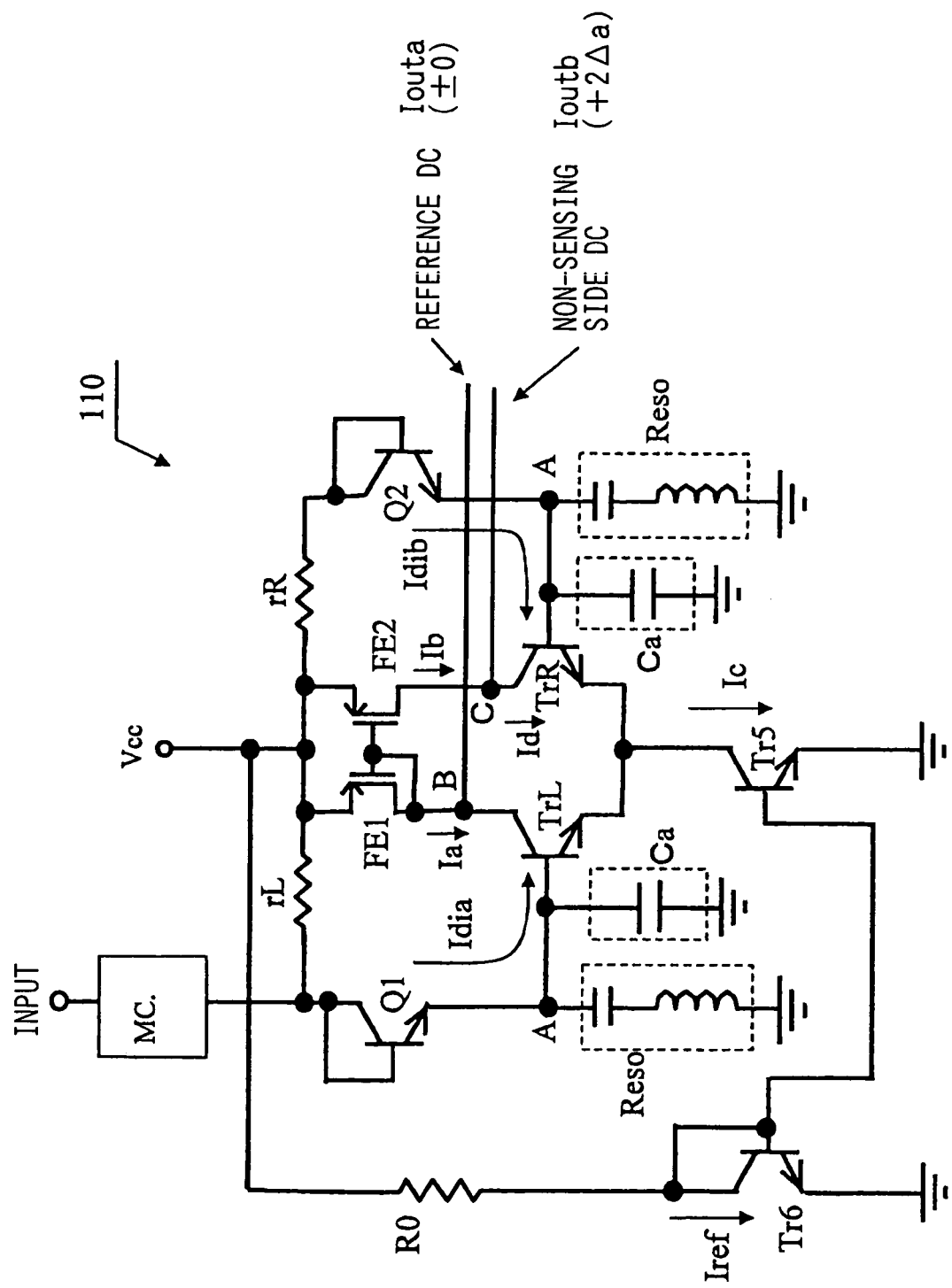
FIG. 2 is a circuit diagram of a detection/amplification circuit 110 of the start signal output circuit 100 in the first embodiment.

FIG. 2 is a circuit diagram of the detection/amplification circuit 110 of the start signal output circuit 100. The current mirror circuit which constitutes the outline of the start signal output circuit 100 in FIGS. 1 and 2 forms the multiple output type which has the plurality of subsidiary transistors (Tr5, Tr9, . . . ) conforming to one reference transistor (Tr6).

Further, the matching circuit MC for efficiently inputting the radio frequency power is connected on the first terminal side to which the radio frequency power of the sensing diode Q1 is inputted. The matching circuit MC has a well-known configuration, and it may well have a known configuration as shown by way of example in the fifth embodiment (FIG. 35) to be described later. Alternatively, a matching circuit in a well-known or desired appropriate aspect may well be used as such a matching circuit.

In the detection/amplification circuit 110, it is characterized in that the sensing diode serves also as a diode which regulates the bias voltage of the differential pair transistor TrL of a differential amplifier.

Figure 35:
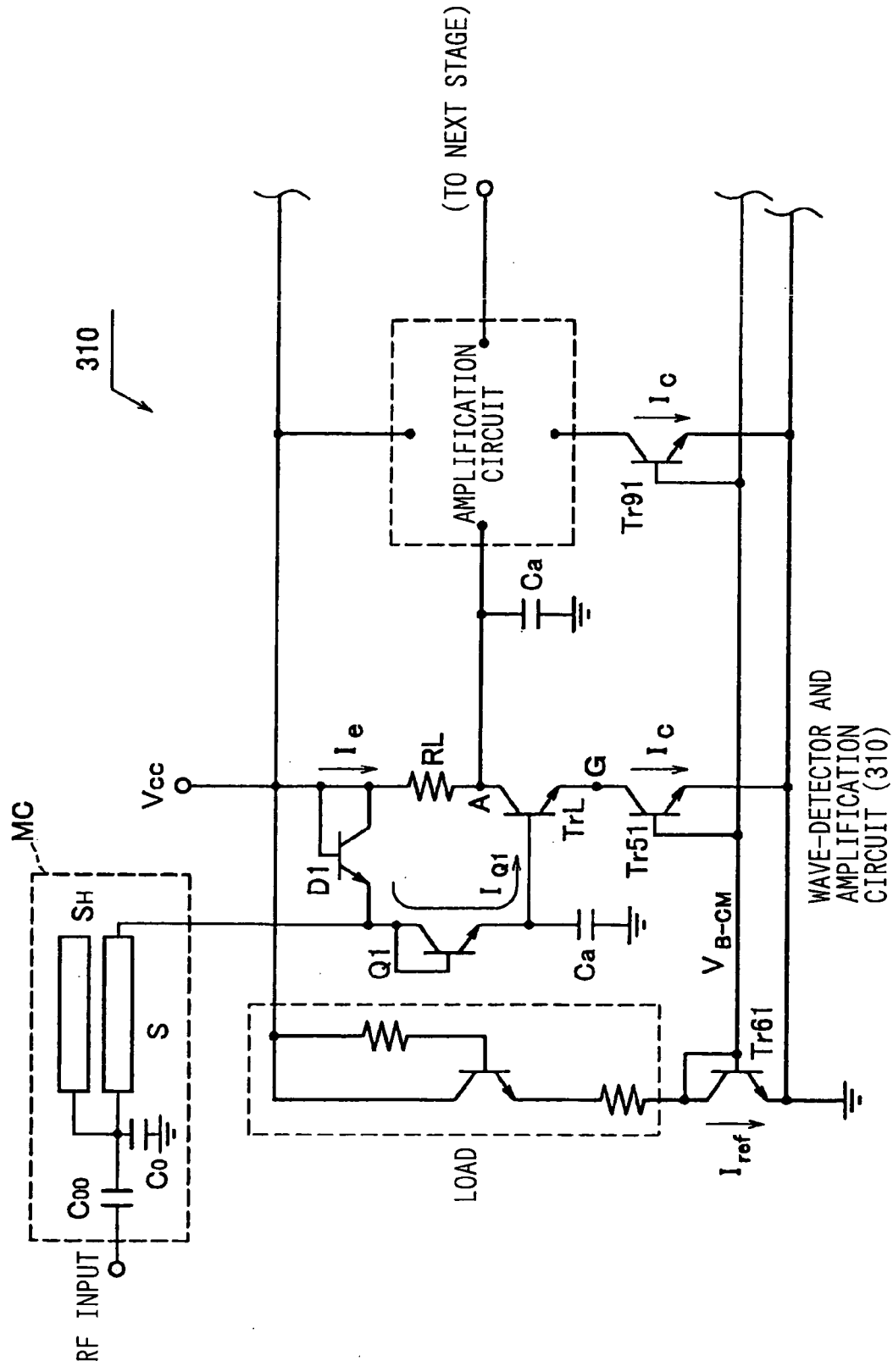
FIG. 35 is a circuit diagram of the detection/amplification circuit 310 of a start signal output circuit 301 in the fifth embodiment.

The series connection of a load resistor R0 and the transistor Tr6 is arranged between the supply voltage Vcc and ground. Herein, the resistor R0 may well be formed by combining a transistor and a resistor as shown in FIG. 35 by way of example. Also disposed between the supply voltage Vcc and the ground is the series connection of the transistor Tr5, and the differential amplifier which is the load of the transistor Tr5 and whose constituents are the transistors TrL and TrR.

On the other hand, the emitter of the sensing diode Q1 formed by the diode connection of a transistor is connected to the base of the transistor TrL. Herein, the "diode connection of a transistor" shall signify that connection form of the transistor in which a collector terminal and a base terminal are directly connected to each other. Further, the collector of the sensing diode Q1 is connected to the supply voltage Vcc through a resistor rL. Likewise, the emitter of a non-sensing diode Q2 is connected to the base of the transistor TrR, and the collector of the non-sensing diode Q2 is connected to the supply voltage Vcc through a resistor rR. Further, smoothing capacitors Ca and resonators Reso are connected to the base terminals (near points A) of the differential pair transistors (TrL, TrR). Those ends of them (Ca, Reso), which are not connected to the base terminals of the differential pair transistors (TrL, TrR), are respectively grounded.

The resonators Reso, however, are not always necessary for detecting the radio frequency power. Especially, the resonator Reso on the non-sensing diode side (Q2 side) does not cause any special drawbacks even when omitted.

The main features of the detection/amplification circuit 110 are as follows:

(1) The reference current Iref (=collector current of the transistor Tr6) and subsidiary current Ic (=collector current of the transistor Tr5) of the current mirror circuit are guaranteed to substantially agree, owing to the function of this current mirror circuit. More specifically, since the bias voltages of the transistors Tr5 and Tr6 are equal, the quantities of currents which flow through both of the transistors come into substantial agreement irrespective of the loads of these transistors. When the current Ic is brought into the order of μA by utilizing the resistor R0, the base current Idia of the transistor TrL and that Idib of the transistor TrR become Ic/β with respect to the current gain β of the transistor TrL, in accordance with the configuration of the above peripheral circuit (differential circuit). Therefore, the base currents become the order of several tens nA surely, and hence, low bias currents can be automatically applied to the differential pair transistors (TrL, TrR). Further, a resistor which corresponds to a high resistance R2 in the order of several MΩ in FIG. 38 can be formed of an input impedance from the base terminal of the transistor TrL, and it becomes a high resistance surely.

(2) The resonator (Reso) is connected to the point A on the cathode side of the sensing diode Q1, whereby the points A in FIG. 2 are set so as to be short-circuited to the ground for the frequency of the predetermined radio frequency power (RF) to be detected. Further, the matching circuit MC is disposed on the first terminal side (anode side) of the sensing diode Q1, whereby the radio frequency power is fed to the input end of the sensing diode Q1 to the maximum. The elements Ca are the smoothing capacitors for the DC conversions.

(3) The peripheral circuit (differential circuit) is configured so that the current of the differential amplification circuit which is configured including the differential pair transistor TrL (sensing side) and the differential pair transistor TrR (non-sensing side) may be regulated by the current mirror circuit which is configured including the reference transistor Tr6, and that the current Idia which assumes substantially a half of the current which flows through the subsidiary transistor Tr5 may substantially agree with the DC component of the current which flows through the sensing diode Q1.

The sensing diode Q1 constructed of the N-P-N type transistor, and the non-sensing diode Q2 constructed similarly thereto are arranged in a substantially symmetric shape in order to prevent the undesired influence of a drift on the supply potential Vcc.

In other words, the detection/amplification circuit 110 is configured so that a radio frequency signal can be sensed on the basis of the difference between the DC potential on the cathode side of the non-sensing diode Q2 and the DC potential on the cathode side of the sensing diode Q1 as forming the reference bias in order to prevent the influence of the fluctuation of the supply voltage Vcc. More specifically, the deviation δv between a referential DC (referential DC potential) and a detection side DC (=referential DC+δv) at the right end of FIG. 2 is outputted on the basis of the difference between the DC potential on the cathode side of the non-sensing diode Q2 and the DC potential on the cathode side of the sensing diode Q1 as forms the reference bias. That is, when the deviation δv is zero, the differential output of the differential amplifier becomes substantially zero ideally.

Figure 38:
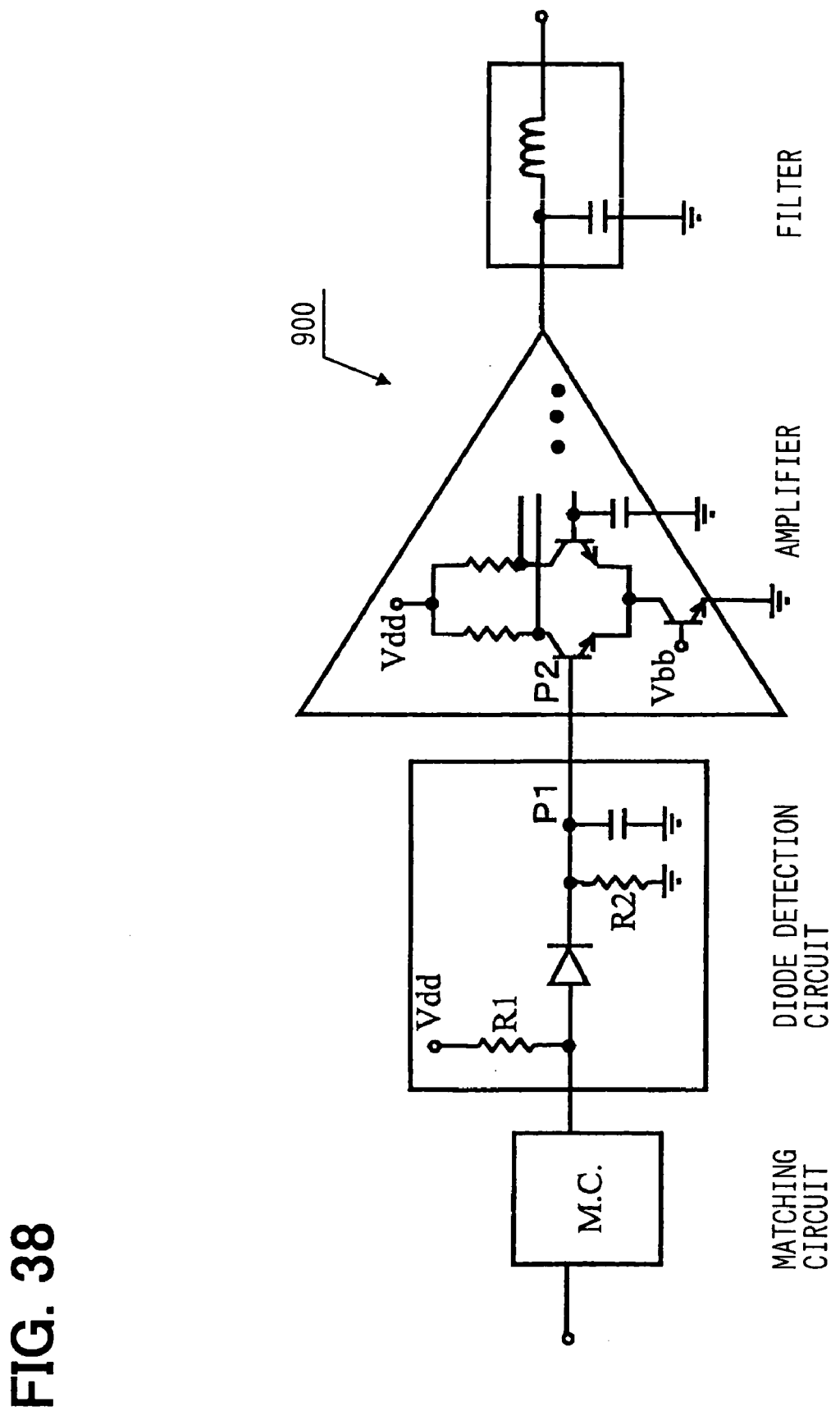
FIG. 38 is a circuit diagram exemplifying a general start signal output circuit (900) in the prior art.
Figure 39A:
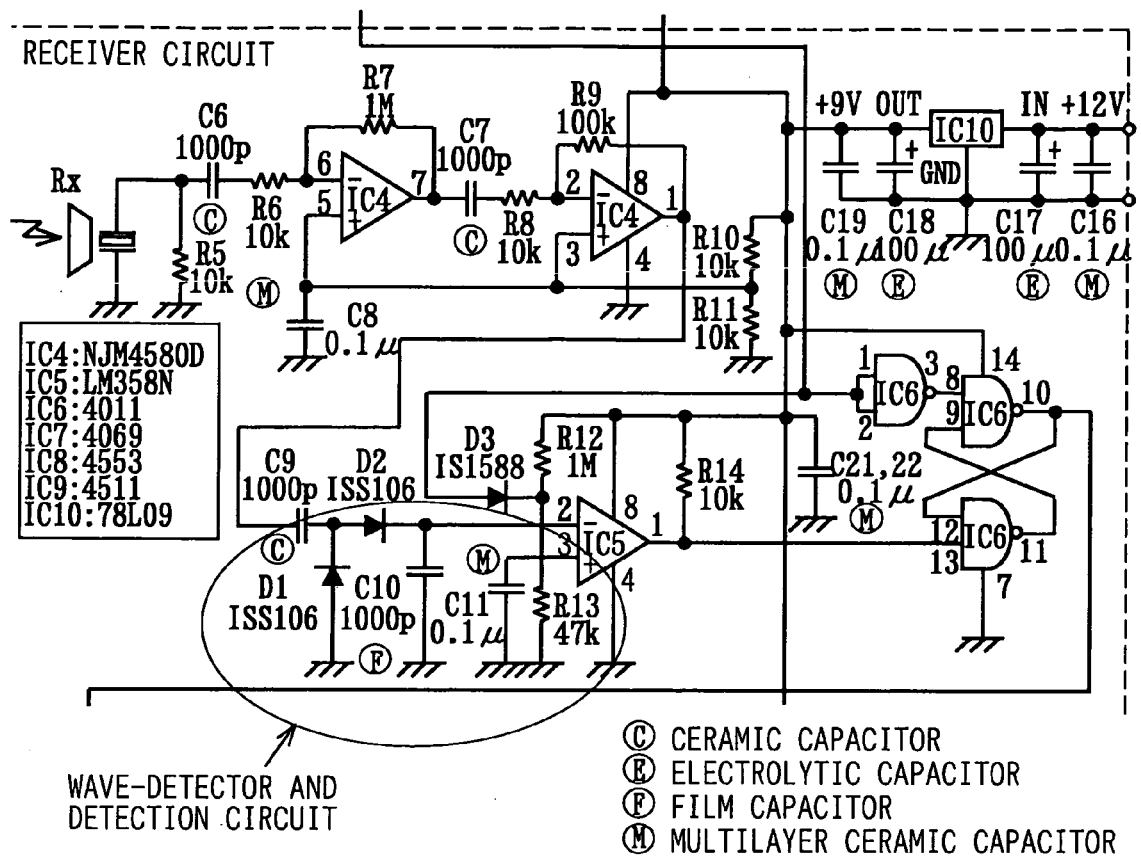
FIG. 39A is a circuit diagram exemplifying a wave-detector and detection circuit in the prior art.
Figure 39B:
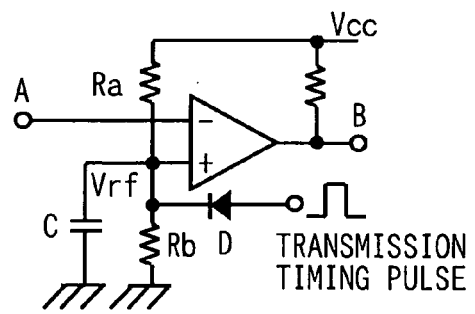
FIG. 39B is a circuit diagram exemplifying a detection circuit in the prior art.
Figure 39C:
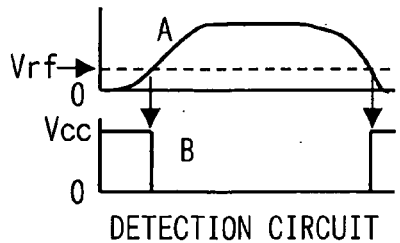
FIG. 39C is a waveform diagram showing the situation of the change of the output of the detection circuit shown in the circuit diagram of FIG. 39B.
Figure 40:
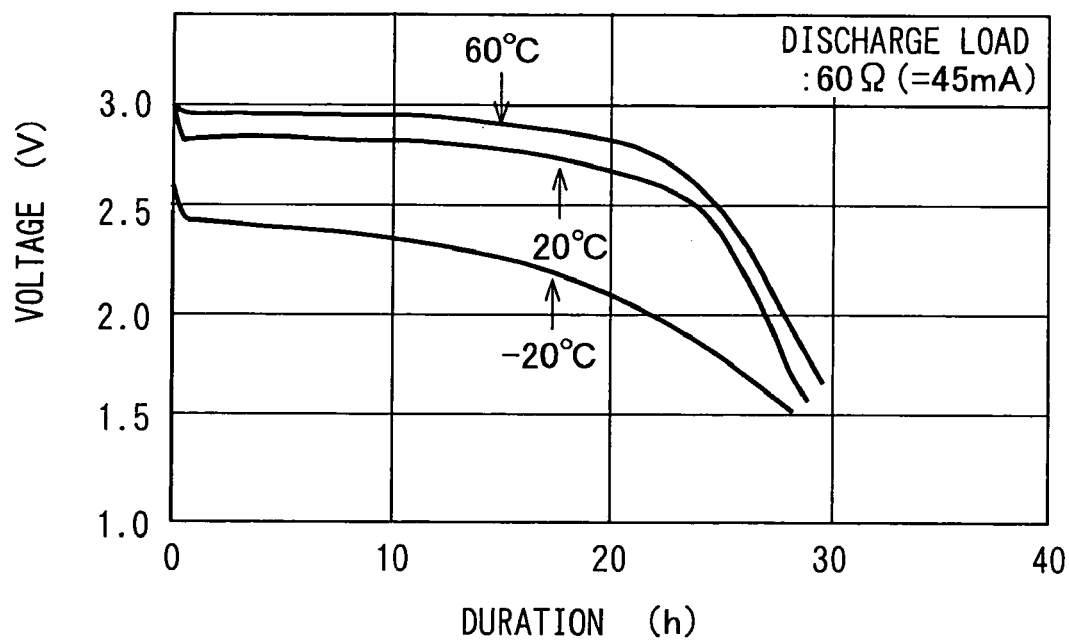
FIG. 40 is a graph exemplifying the temperature characteristics of a lithium dry cell which is commercially available.

In the start signal output circuit 100 (FIG. 1), accordingly, a balancing function which balances potentials; the potential of the output point P1 of the diode detection portion termed in FIG. 38 described above, the potential of the input point P2 of an amplifier side, and a bias voltage Vbb for use in the amplifier can be automatically secured. Consequently, while the undesired influence attendant upon the fluctuation of the voltage Vcc of the DC power supply is excluded, the RF signal can be sensed by the sensing diode Q1, and the potential detected by the sensing diode Q1 can be converted into the direct current by the resistance components included in the differential pair transistor TrL (detection potential side) and the subsidiary transistor Tr5, and the smoothing function of the capacitor Ca.

When the radio frequency signal is received in the above DC bias state, it flows to the ground through the matching circuit MC, the sensing diode Q1 and the resonator Reso (or smoothing capacitor Ca). Since, on this occasion, the sensing diode Q1 is biased by the bias current in the nA order, substantially the half wave component of the positive region of the radio frequency signal can pass through the sensing diode Q1, and the half wave current of each cycle is accumulated and smoothed by the smoothing capacitor Ca. Thus, the DC signal can be obtained from the radio frequency signal.

Owing to the fact that the bias current of the sensing diode Q1 is very small in this manner, power is economized, the efficiency of half wave rectification is enhanced, and detection sensitivity can be remarkably enhanced.

The operation of the detection/amplification circuit 110 in the first embodiment will be quantitatively described in more detail by using mathematical expressions, with reference to FIG. 2. The operating principle of the detection/amplification circuit of the first embodiment utilizing the current mirror circuit as elucidated below, basically holds true also of the second embodiment to be described later.

The base current of the non-sensing side transistor TrR of the differential pair transistors in the detection/amplification circuit 110 in FIG. 2 is substantially in agreement with the DC component of the current flowing through the non-sensing diode Q2. That is, the non-sensing side of the detection/amplification circuit 110 is configured symmetrically to the sensing side thereof.

Owing to the circuit arrangement which utilizes such a current mirror circuit, the reference current Iref and the subsidiary current Ic in FIG. 2 become equal quantities (Iref=Ic). Further, to be in more detail, two elements FE1 and FE2 which are, for example, MOSFETs form a current mirror arrangement, so that currents Ia and Ib which are outputted from the respective elements become equal quantities (Ia=Ib=Iref/2).

Meanwhile, when the radio frequency power is inputted through the matching circuit, it is rectified by the sensing diode Q1, whereby the potential of the point A rises. As a result, the direct current Ia to flow through the transistor TrL increases to the amount of Δa. Further, the potential of the point B becomes a constant value which is lower than the supply voltage Vcc in correspondence with the voltage of a voltage drop across the diode-connected transistor FE1, so that all the current Ia flows through the transistor TrL. Also, regarding the two MOSFETs (FE1, FE2) which construct the active loads of the differential amplifier, the current mirror circuit is constructed, so that the current Ib on the side opposite to the current Ia (on the FE2 side) similarly increases to the amount of Δa. Further, sign Id in FIG. 2 represents the collector current of the differential pair transistor TrR. As explained below, the current Id does not agree with the above current Ib when the radio frequency power is inputted.

(Equation of Currents)

$$Ia=Ib$$

$$Iref=Ic=Ia+Id=\text{constant} \quad (1)$$

On this occasion, the collector current Ic of the subsidiary transistor Tr5 is always equal in quantity to the current Iref owing to the function of the current mirror circuit, and it does not increase.

Accordingly, when the radio frequency input exists, each of the currents Ia and Ib increases to the amount of Δa as described above, and the current Id decreases to the amount of Δa as understood from Eq. (1). In the existence of the radio frequency input, therefore, the current Ioutb in the figure increases to the amount of 2Δa. In other words, in the existence of the radio frequency input, the potential of a point C rises so that the current Ioutb may increase to the amount of 2Δa. This is the basic principle of the detection/amplification circuit 110.

Further, as in the first embodiment (FIG. 2) described above, the desired radio frequency can be efficiently sensed at a high precision, on the basis of the difference between the DC potential (cathode end potential) of the non-sensing diode Q2 and the DC potential (cathode end potential) of the sensing diode Q1. Further, according to such a configuration, even when the supply potential (Vcc) dropps, both bias potentials of the differential pair transistors (example: TrL and TrR in FIG. 2) of the differential amplifier lower in balanced fashion, and hence, it is prevented that the sign of the difference ((detection side DC)−(referential DC)) of the output potential is improperly reversed due to the drop of the supply potential. Owing to this function, therefore, a detection error ascribable to the drift of the supply voltage can be effectively prevented.

2. Succeeding Stage (Determination Circuit 120)

A determination criterion in the differential amplifier (determination circuit 120) at the succeeding stage can be freely set by appropriately adjusting resistances Ra and Rb, whereby the output sensitivity and an inversion width can be adjusted or optimized.

Figure 3:
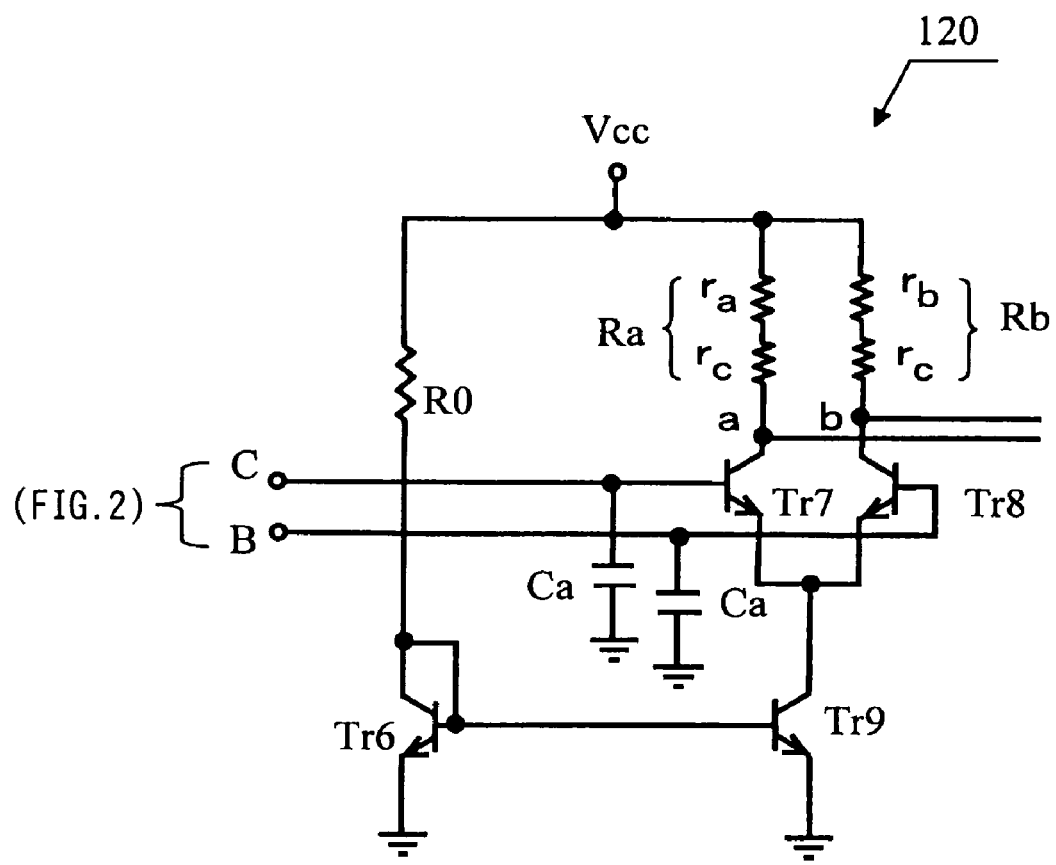
FIG. 3 is a circuit diagram of a determination circuit 120 of the start signal output circuit 100 in the first embodiment.

FIG. 3 is a circuit diagram of the determination circuit 120 of the start signal output circuit 100 in this embodiment. The load resistance Ra (input fluctuation side) of a transistor Tr7 whose base terminal is connected to the point C in FIG. 2 is set to be somewhat smaller than the load resistance Rb (determination-criterion input side) of a transistor Tr8 whose base potential hardly changes irrespective of the existence or nonexistence of the radio frequency input. Thus, the potential of the point a in FIG. 3 in the nonexistence of the radio frequency input is set to be somewhat higher than that of the point b in FIG. 3 in the nonexistence of the radio frequency input. That is, an offset is applied.

More specifically, in FIG. 3, resistances are set as indicated by the following equations (2) and (3):

(Individual Resistances)

rc=45 kΩ ra=4 kΩ rb=5 kΩ  (2)

(Combined Resistances)

∴Ra=45 kΩ+4 kΩ=49 kΩ

Rb=45 kΩ+5 kΩ=50 kΩ  (3)

According to such settings by way of example, when an RF input level is small or when the RF input is nonexistent, the potential of the point a in FIG. 3 is higher than that of the point b, and hence, a transistor Tr18 in the determined-result binarization circuit 130 (FIG. 1) at the succeeding stage becomes an ON state. On the basis of these functions, accordingly, the potential of a point E in FIG. 1 can be lowered near to almost zero V when the RF input level is small or when the RF input is nonexistent.

To the contrary, when the RF input level is large, the potential of the point a in FIG. 3 lowers, and that of the point b rises, and hence, the potential of the point b becomes higher than that of the point a. As a result, transistors Tr15 and Tr17 become ON states, whereas transistors Tr18 and Tr19 become OFF states at the same time. After all, when the RF input level is large, the DC potential of the point E in FIG. 1 rises close to the supply voltage Vcc.

According to such a configuration, an appropriate comparison-criterion potential (reference potential) can be generated within an IC in which the start signal output circuit is mounted. Accordingly, an external circuit for generating the comparison criterion potential outside, or a wiring line for introducing the reference potential is not required. That is, according to such a configuration, the criterion offset can be formed within the IC, and hence, an IC implementation (the integration of a semiconductor circuit) can be easily promoted.

3. Final Stage (Determined-Result Binarization Circuit 130, LC Filter Section 140)

The functions of amplifying an output and converting the amplified output into a DC potential are fulfilled by the final stage. The final stage has its signal oscillated to a saturation level, whereby the final output becomes a level near the supply voltage Vcc when the signal arrives, and it becomes a voltage near zero V when the signal does not arrive or is lower in level than a reference.

Figure 41:
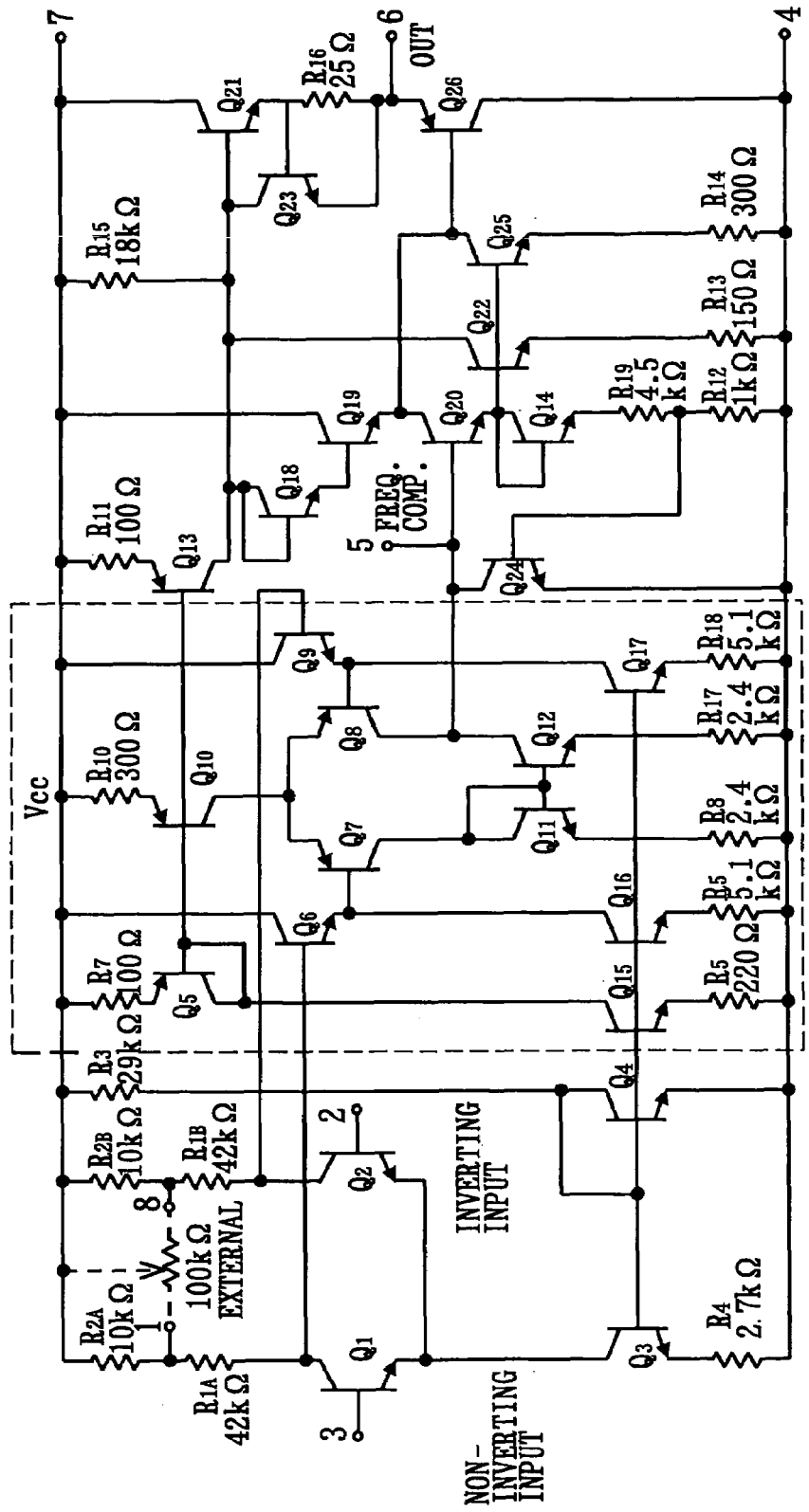
FIG. 41 is a circuit diagram of a known binarization circuit which resembles the determined-result binarization circuit 130 of the start signal output circuit 100.

FIG. 41 is a circuit diagram of a known binarization circuit which resembles the determined-result binarization circuit 130 of the start signal output circuit 100. This circuit diagram is an extraction from "Analysis and Design of Analog Integrated Circuit, Second Edition, Paul R. Gray, Robert G. Meyer, John Wiley & Sons". Such a binarization circuit, for example, is useful in the actual approach of the invention.

(Evaluation of Whole Start Signal Output Circuit)

Figure 4:
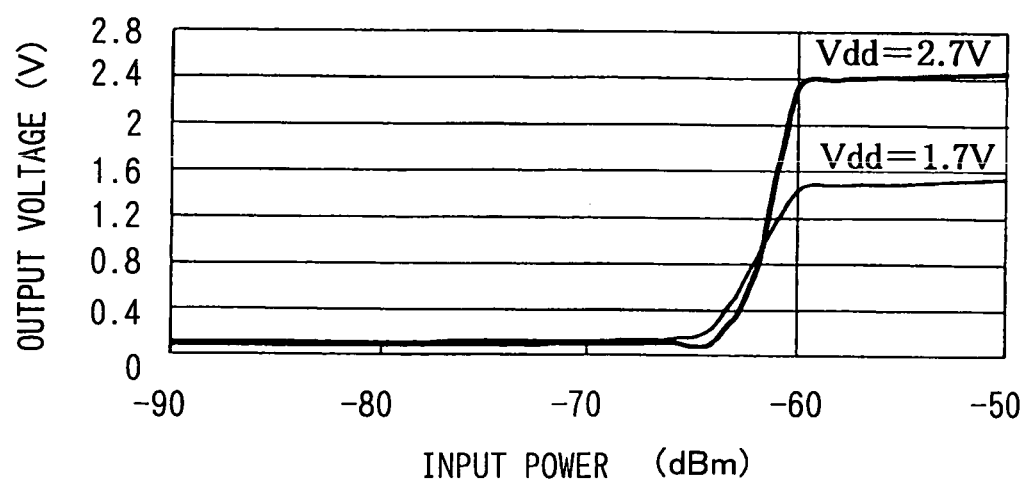
FIG. 4 is a graph exemplifying the output voltage of the start signal output circuit 100 versus the input power thereof.

FIG. 4 is a graph exemplifying the output voltage of the start signal output circuit 100 versus the intensity of the input power (radio frequency power). It is understood from the graph that the output of at least −60 dBm rises to the saturation level, so the arrival of the desired radio frequency power (at about 5.8 GHz) can be sensed. Further, the output of less than −65 dBm is not detected.

The above saturation level of the output potential of the start signal output circuit 100 is about 2.4 V for the supply voltage Vcc of about 2.7 V, and is about 1.5 V for the supply voltage Vcc of about 1.7 V.

Figure 5:
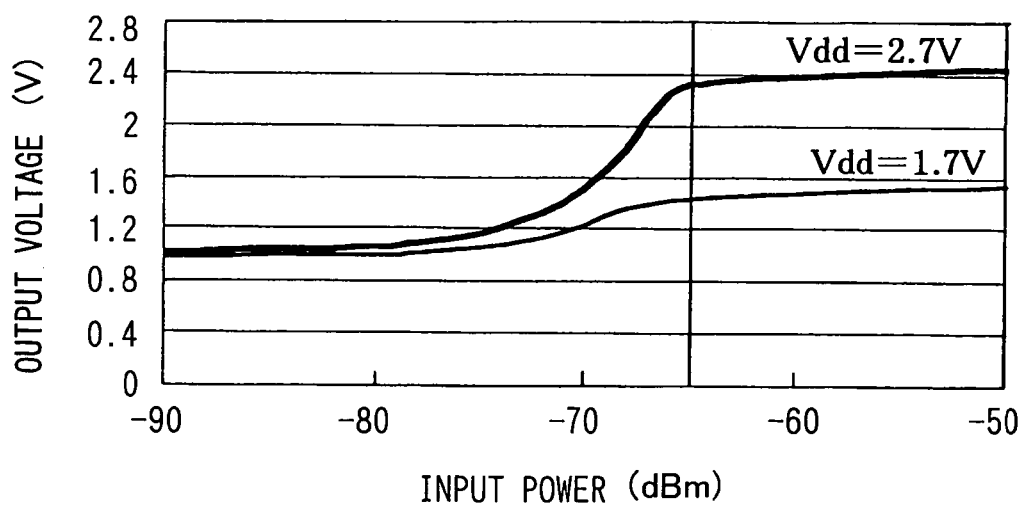
FIG. 5 is a graph exemplifying the output voltage of a start signal output circuit 100' (Ra=Rb) for comparison, versus the input power thereof.

On the other hand, exemplified in FIG. 5 is the output voltage of a start signal output circuit 100' for comparison, versus the input power thereof, in the case where Ra=Rb=50 kΩ is set. This corresponds to a case where rc=45 kΩ and ra=rb=5 kΩ are set in Eq. (2) described above. In this case, however, the output voltage is as high as about 1 V even when it is determined that the radio frequency power does not arrive. As understood from such a comparative example by way of example, the large change width of the output of the binarization circuit can be secured by appropriately setting the difference ΔR (=Rb−Ra>0).

Figure 6:
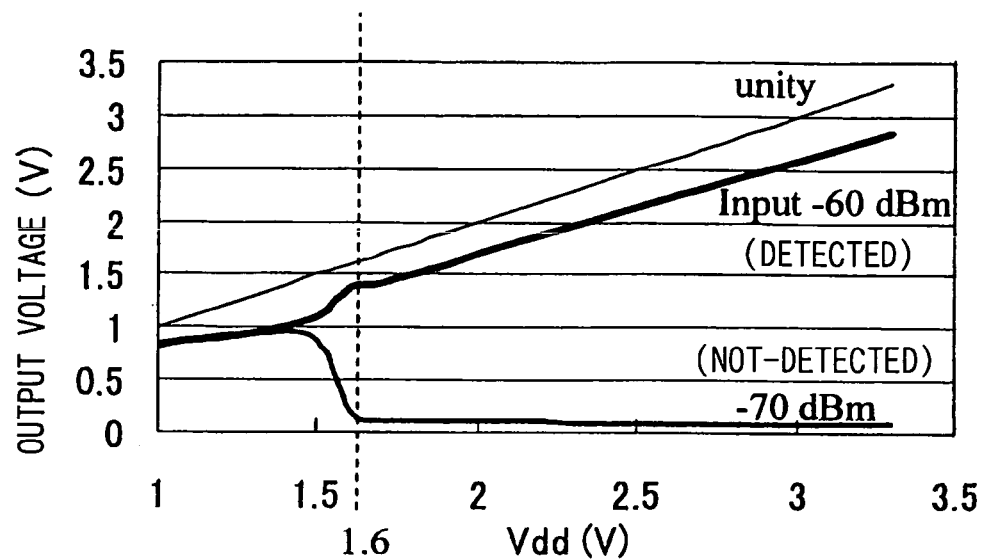
FIG. 6 is a graph exemplifying the output characteristics of the start signal output circuit 100 versus the supply voltage thereof.
Figure 7:
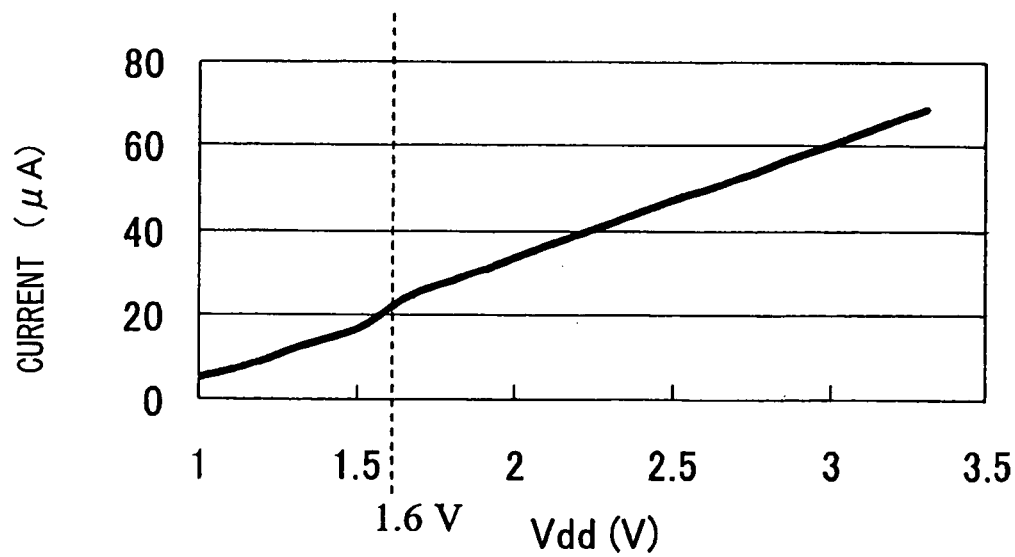
FIG. 7 is a graph exemplifying the supply current of the start signal output circuit 100 versus the supply voltage thereof.

FIGS. 6 and 7 are graphs exemplifying the several characteristics of the start signal output circuit 100 versus the supply voltage Vcc. FIG. 6 represents the output potential (output voltage (V)) of the start signal output circuit 100 versus the supply voltage Vcc. It is understood from the graph that, if Vcc≧1.6 V holds, a satisfactory potential difference can be secured between the output potentials after the binarizations of the detected results (detection/nondetection).

Further, FIG. 7 represents the value of the supply current of the start signal output circuit 100 versus the supply voltage Vcc. In a case, for example, where the start signal output circuit 100 operates at Vcc=1.6 V, the supply current becomes 20 μA, and the power consumption of the whole circuit becomes 32 μW. Thus, it is understood that, according to such a circuit arrangement, the start signal output circuit of remarkably low power consumption, including even the determination circuit, can be configured.

Figure 8:
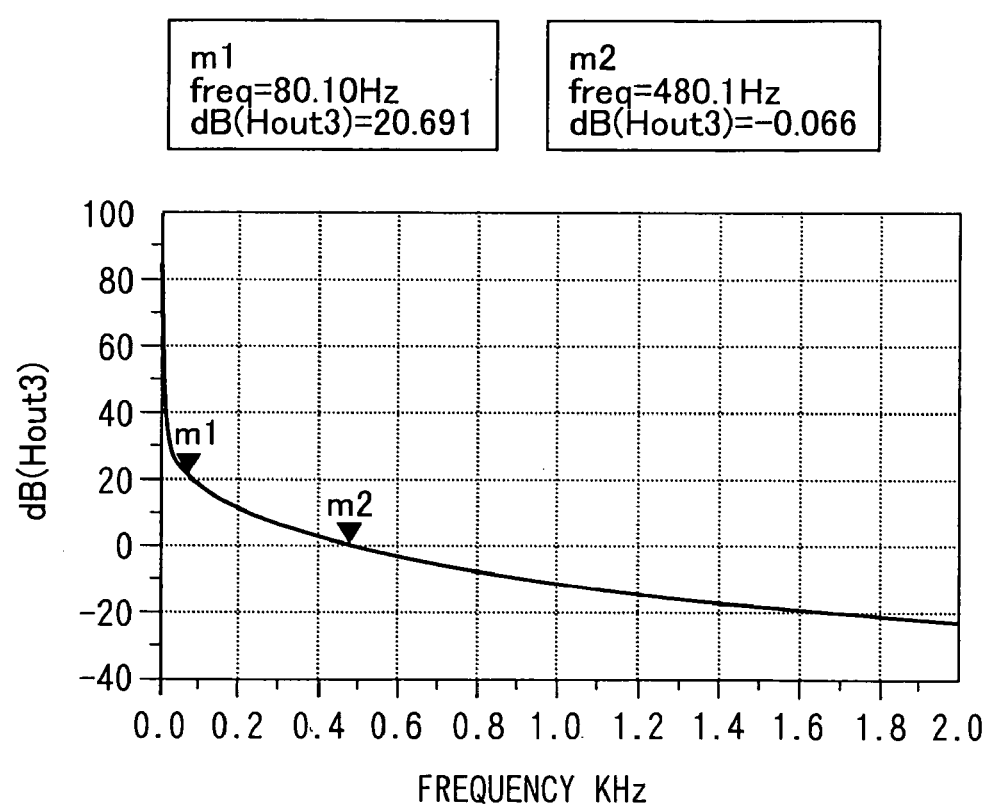
FIG. 8 is a graph exemplifying the transfer function of the detection potential ($\delta$V) of a sensing diode in the start signal output circuit 100, versus the frequency.

Further, FIG. 8 is a graph exemplifying the transfer function (transfer ratio) of the detection potential (δv) of the sensing diode in the start signal output circuit 100, versus the frequency. In this manner by way of example, it is understood that, according to the arrangement of the start signal output circuit 100 described above, the DC component of the detection potential of the sensing diode is amplified overwhelmingly more efficiently than the other frequency values.

According to such a configuration, with respect to the frequency, only the vicinity of the direct current is especially subjected to low pass filtering and amplification, so that the other noise components can be effectively removed. Therefore, the sensitivity can be sharply enhanced more than in the prior art diode detection. In other words, in a case where the configurations are realized by an analog circuit of lower power consumption, the transfer function usually becomes a monotonous decrease function versus the frequency.

[Evaluation and Problems of First Embodiment]

In the first embodiment described above, it cannot be said that consideration for immunity against noise (internal disturbances) developing within the device, for example, channel noise in the MOSFETs, is satisfactory.

Therefore, when the start signal output circuit 100 is used, an S/N ratio deteriorates under, for example, a high-temperature operating environment, and a situation where an erroneous determination occurs, etc. can be sometimes considered. That is, in the first embodiment, a case can be considered where the output of the detection/amplification circuit and the output level of the determination circuit are not always satisfactory, so a detection sensitivity cannot be set satisfactory.

As the principal reasons for considering that a satisfactory S/N ratio cannot be always ensured in the first embodiment, it is pointed out that a sensing amplitude is small in the detection/amplification circuit 110, and that the flicker noise of the MOSFETs is large. Further, it cannot be said that the determination circuit 120 is always in a desirable aspect, because it cannot attain sufficient amplification on account of the resistance loads.

Figure 9:
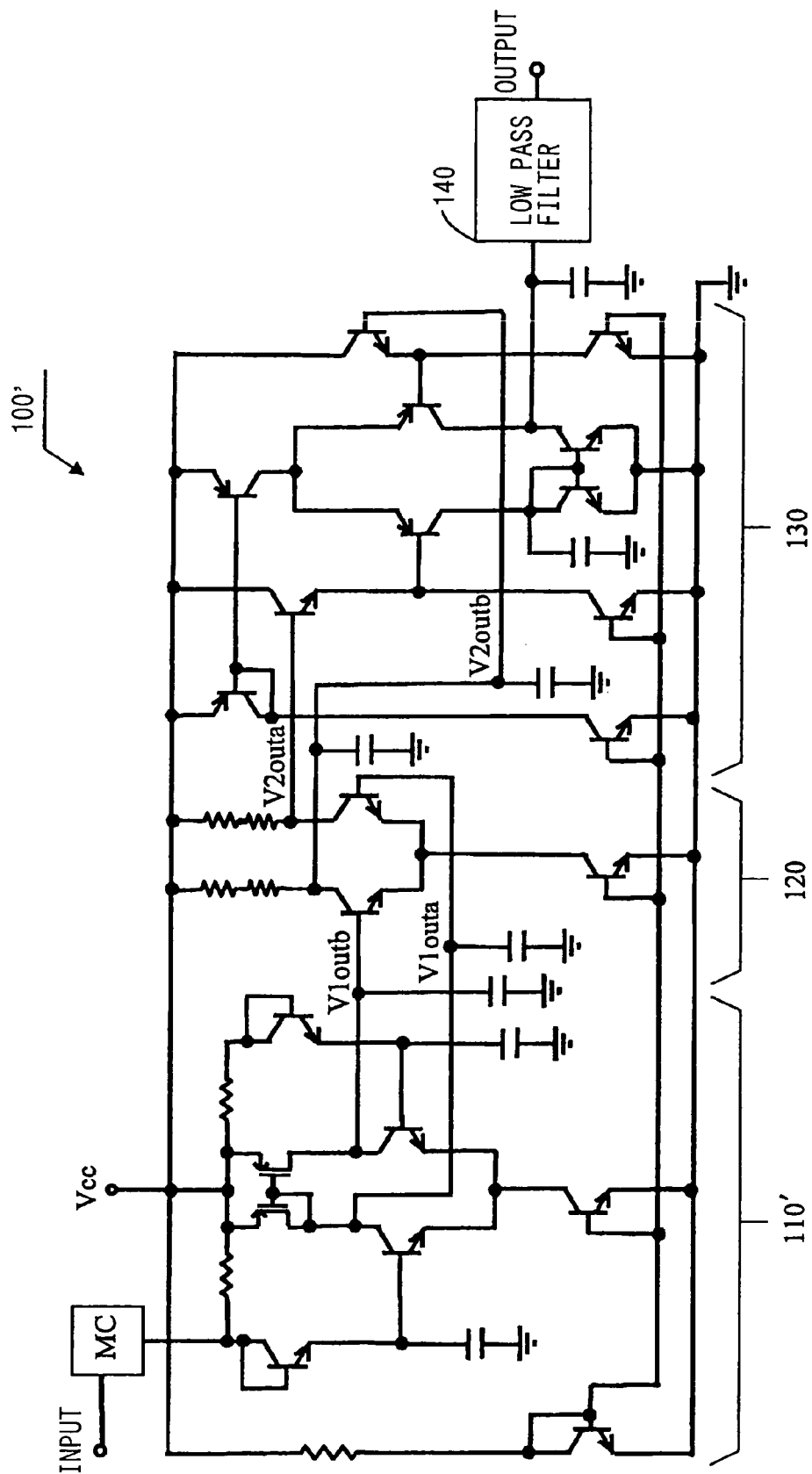
FIG. 9 is a circuit diagram of the start signal output circuit 100'.

In order to verify the relation of the cause and effect concerning the S/N ratio, a simulation was conducted on the wave detection operation of the start signal output circuit 100' (FIG. 9) which is configured on the basis of the above invention (first embodiment).

Figure 10A:
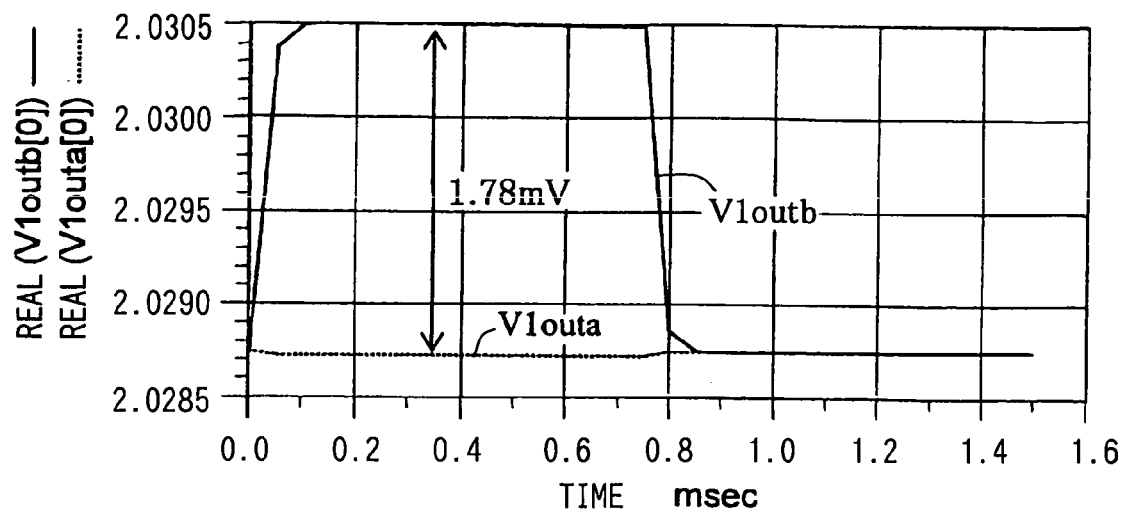
FIG. 10A is a graph showing the input DC potential of the determination circuit 120 in the first embodiment.
Figure 10B:
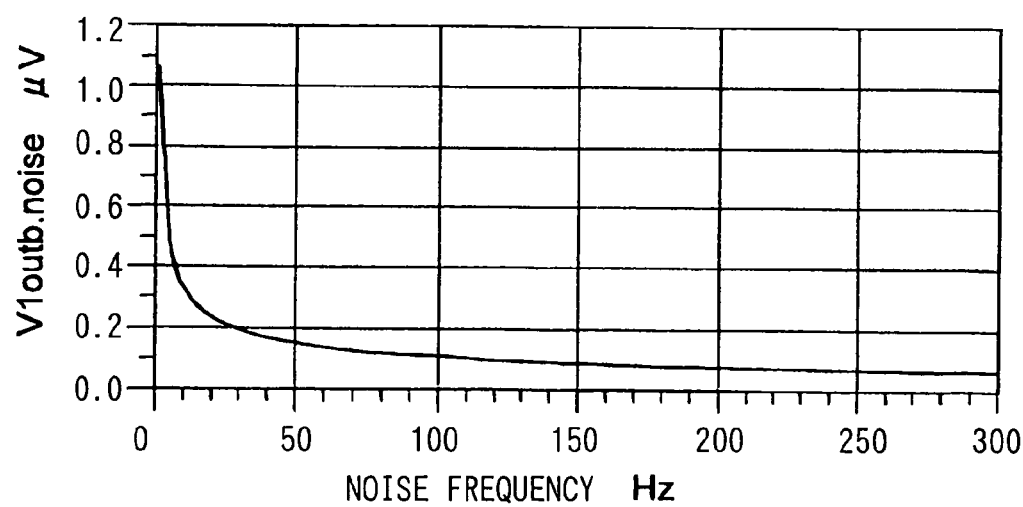
FIG. 10B is a graph showing the spectrum (computed values) of the input noise of the determination circuit 120 in the first embodiment.
Figure 11A:
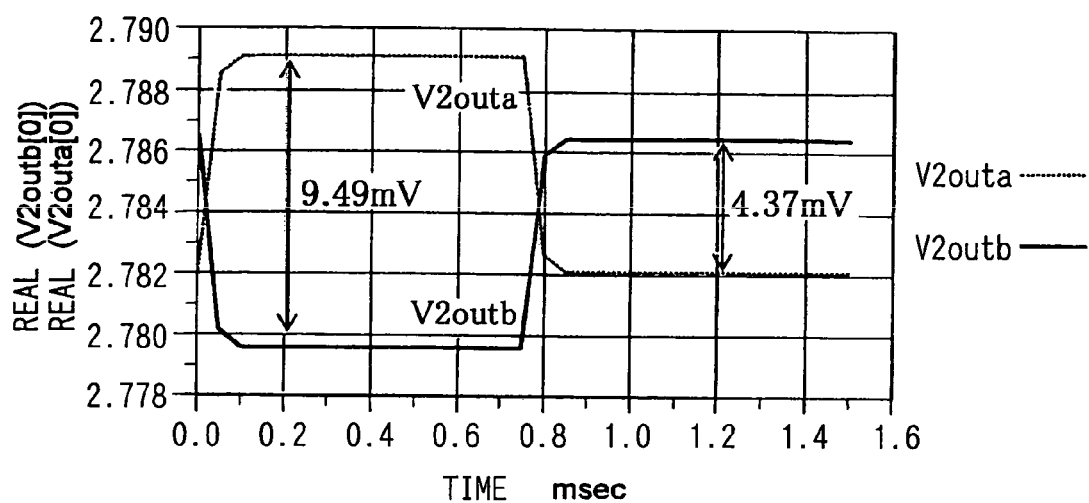
FIG. 11A is a graph showing the output DC potential of the determination circuit 120 in the embodiment.
Figure 11B:
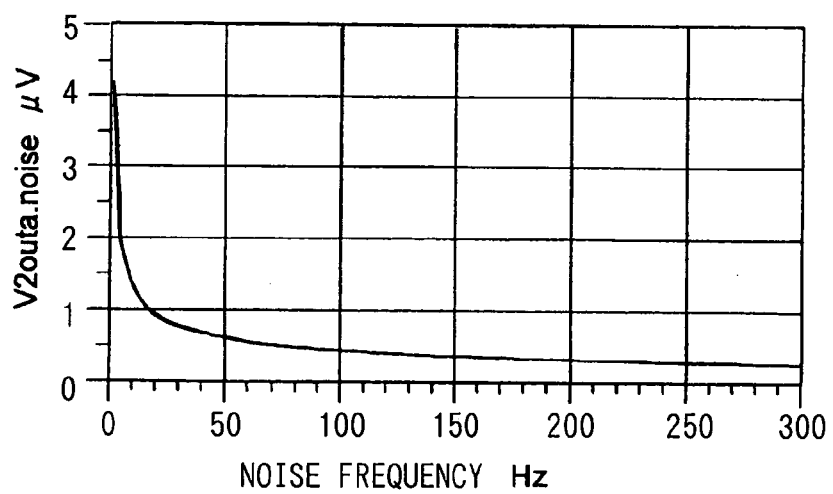
FIG. 11B is a graph showing the spectrum of the output noise of the determination circuit 120.
Figure 12A:
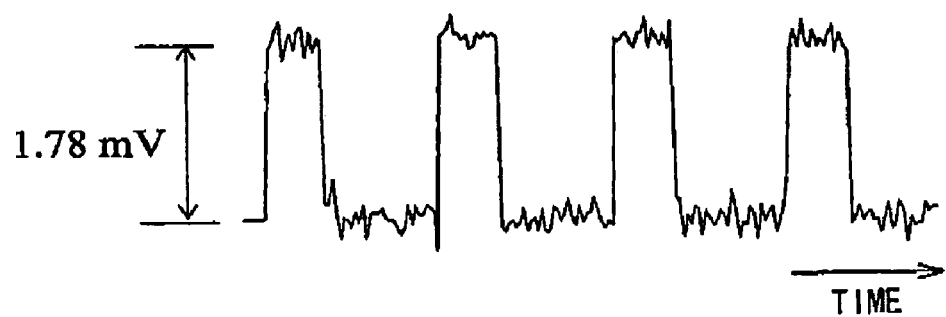
FIG. 12A is a graph obtained by modeling the input waveform of the determination circuit 120 with the conditions of FIGS. 10A and 10B premised.
Figure 12B:
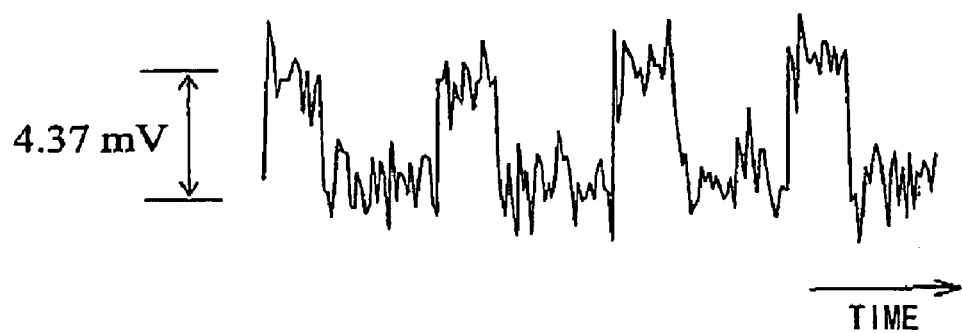
FIG. 12B is a graph obtained by modeling the output characteristic (S/N ratio) of the determination circuit 120 with the conditions of FIGS. 11A and 11B premised.

FIG. 10A is a graph showing the input DC potential of the determination circuit 120, while FIG. 10B is a graph showing the spectrum (computed values) of the input noise of the determination circuit 120. Further, FIG. 11A is a graph showing the output DC potential of the determination circuit 120, while FIG. 11B is a graph showing the spectrum of the output noise of the determination circuit 120. Further, FIG. 12A is a graph obtained by modeling the input waveform of the determination circuit 120 with the conditions of FIGS. 10A and 10B premised. Further, FIG. 12B is a graph obtained by modeling the S/N ratio on the output side of the determination circuit 120 in the case where the radio frequency power does not arrive, under the conditions of FIGS. 11A and 11B.

More specifically, FIG. 12A shows a simulation waveform in the case where the noise corresponding to FIG. 10B is superimposed on the output of the detection/amplification circuit. Further, FIG. 12B shows a waveform simulative of a case where the noise in the determination circuit output is superimposed on the rectangular wave of a voltage width which corresponds to the determination level difference of the output terminals of the determination circuit in the nonexistence of the input of the radio frequency power.

In the simulation, an input was a waveform obtained by subjecting an input signal of 5.8 GHz and −60 dBm to an ASK modulation at a width of 781 μsec and a period of 2.343 msec. Since the intermediate stage (determination circuit 120) of the start signal output circuit 100' in FIG. 9 has the configuration employing resistance loads, noise levels as shown in FIG. 11B appear at both points V2outa and V2outb in the figure, respectively. It was accordingly revealed that, as seen from FIG. 12B, an S/N ratio is considerably low in a comparison result (output signal of the determination circuit) at the intermediate stage (determination circuit 120) of the start signal output circuit 100' in FIG. 9, so an erroneous determination might occur depending upon the level of the developing noise voltage (FIG. 10B).

(Second Embodiment)

The second embodiment exemplified in conjunction with the drawings of FIGS. 13 through 24 is in order to solve these problems. As means for solving the problems, by way of example, the foregoing embodiment is modified so that a voltage doubler wave-detector circuit can be utilized for the detection/amplification circuit, an S/N ratio is enhanced by employing MOSFETs of large gates, or it is permitted to obtain a large amplitude by introducing active loads configured of transistors, into the determination circuit. Further, a combination with a binarization circuit utilizing CMOS is considered so that the power consumption can be further lowered.

[Voltage Doubler Wave-Detector Circuit]

Figure 13:
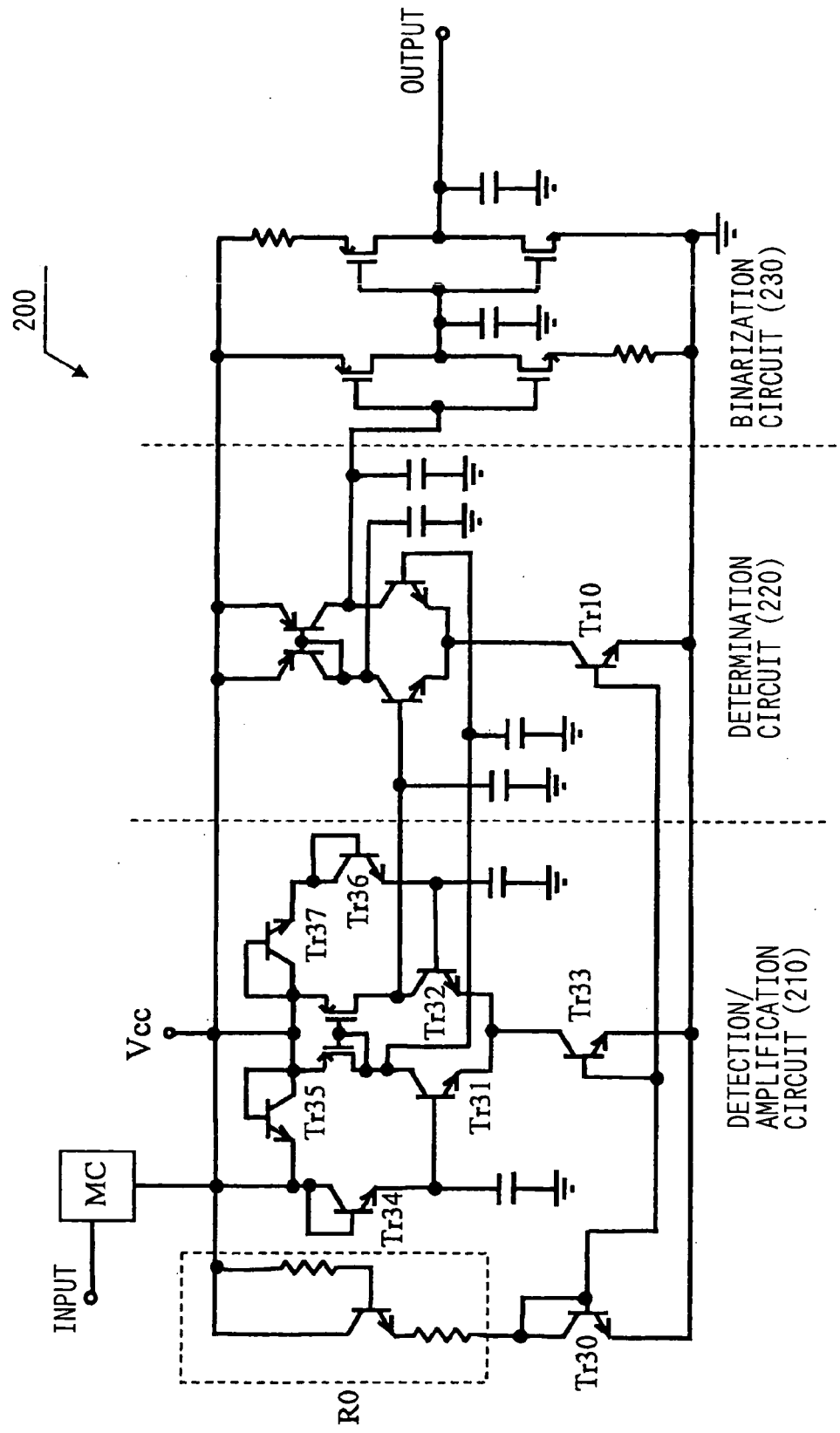
FIG. 13 is a circuit diagram of a start signal output circuit 200 in the second embodiment.
Figure 14:
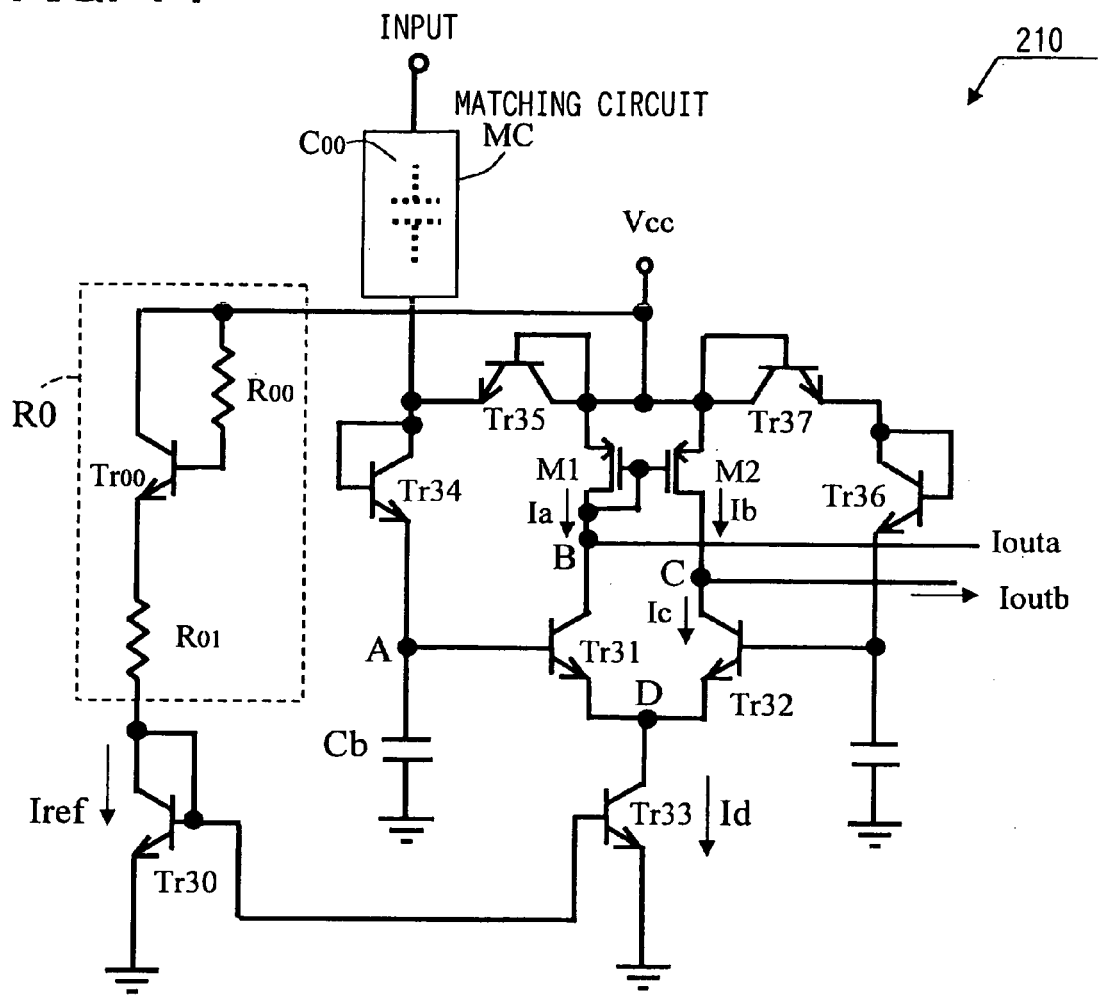
FIG. 14 is a circuit diagram of a detection/amplification circuit 210 which is included in the start signal output circuit 200 of the second embodiment.

FIG. 13 is a circuit diagram exemplifying a start signal output circuit 200 in the second embodiment. Further, FIG. 14 is a circuit diagram of a detection/amplification circuit 210 which is included in the start signal output circuit 200. In the second embodiment, first of all, as shown in FIG. 13, in the start signal output circuit having an RF/DC conversion circuit to which radio frequency power (RF) of specified frequency is inputted and from which a direct current potential (DC) is outputted, there is disposed a detection/amplification circuit which includes a voltage doubler wavedetector circuit that includes a sensing diode for sensing the radio frequency power, a differential amplifier that includes transistors Tr31 and Tr32 corresponding to the differential pair transistors TrL and TrR described above, and a current mirror circuit, wherein the base current of one Tr31 (TrL) of the differential pair transistors is brought into substantial agreement with the DC component of a current flowing through the sensing diode, and the total of currents flowing through the differential pair transistors Tr31 and Tr32 (TrR) is regulated to a substantially constant value by the current mirror circuit.

Figure 15:
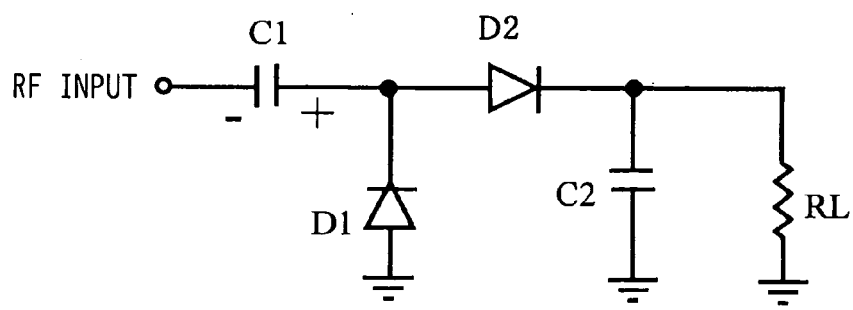
FIG. 15 is a circuit diagram of a conventional voltage doubler wave-detector circuit 10.

Further, the "voltage doubler wave-detector circuit" signifies a wave-detector circuit which is configured by employing a voltage doubler rectification circuit, and the configuration is shown in the eleventh invention described above. Such a voltage doubler wave-detector circuit is known as an example utilized for a power supply circuit, and a detailed disclosure on its functions is contained in "Design and Manufacture of Radio frequency circuit" (written by Kenji Suzuki, and published by CQ Publishing Co., Ltd.) described above. FIG. 15 shows a circuit diagram of a conventional, voltage doubler wave-detector circuit 10. In the second embodiment, a circuit equivalent to such a wave-detector circuit is combined with a differential amplifier and is included in the detection/amplification circuit 210 (FIG. 14).

More specifically, by way of example, the two resistors which are included in the detection/amplification circuit 110 (FIG. 2) in the first embodiment described above are respectively replaced with two diodes (Tr35, Tr37) as exemplified in FIGS. 13 and 14. The configuration equivalent to the voltage doubler wave-detector circuit 10 can be incorporated into the detection/amplification circuit merely by performing such a replacement. The replacement (remodeling) may be considered as corresponding to an improved invention for the detection/amplification circuit 110 (FIG. 2) in the first embodiment (that is, the eleventh invention of the present application). That is, it is to be noted that the voltage doubler wave-detector circuit is incorporated in the detection/amplification circuit 210 in FIG. 14 so advantageously.

The reference transistor of the current mirror circuit in FIGS. 13 and 14 is a transistor Tr30, the load resistor R0 of which is configured of a resistor $R_{00}$, a resistor $R_{01}$ and a transistor $Tr_{00}$ as shown in FIG. 14.

The loads of the transistors Tr31 and Tr32 in FIG. 14 comprise active loads in which MOSFETs (M1, M2) are arranged in a symmetric form. Two diode-connected transistors Tr35 and Tr34 are inserted in series between the base terminal of the transistor Tr31 (TrL) and a feed point (Vcc), and in succession from the feed point side. The output terminal of the matching circuit is connected between the two transistors Tr35 and Tr34. Further, the transistor Tr34 corresponds to the sensing diode, and a transistor Tr36 corresponds to a non-sensing diode. A smoothing capacitor Cb is connected to the base terminal of the transistor Tr31 (TrL). The detection/amplification circuit 210 is configured substantially in left-right symmetry except the presence or absence of a connection node with the matching circuit.

FIG. 15 is a circuit diagram of the voltage doubler wave-detector circuit 10 which is generally known. During the negative half cycle of a supply voltage at an input terminal, a diode D1 is rendered conductive, and a capacitor C1 is charged in a polarity indicated in the figure, up to the maximum value Vm of the input voltage. In the succeeding positive half cycle, the diode D1 is not rendered conductive, and a diode D2 (sensing diode) is rendered conductive. On this occasion, the terminal voltage of a capacitor C2 is charged up to about 2 Vm owing to the addition of the voltage Vm charged in the capacitor C1, as described in, for example, "Textbook: Electronic circuit" (written by Noriyuki Itoh, and published by Nippon Riko Shuppan Kai) or "Design and Manufacture of Radio frequency circuit" (written by Kenji Suzuki, and published by CQ Publishing Co., Ltd.).

Accordingly, if such a voltage doubler wave-detector circuit is usable, a larger detection signal than in the case of the first embodiment described above can be obtained. In actuality, equivalent corresponding relations described below are held in the detection/amplification circuit 210 in the second embodiment, and hence, a reception sensitivity which is double as high as in the detection/amplification circuit 110 (FIG. 2) is attained in the detection/amplification circuit 210.

| <Voltage doubler wave-detector circuit 10> | <Detection/amplification circuit 210> |
|---|---|
| C1 | $C_{00}$ (Capacitance within matching circuit) |
| D1 | Tr35 (Resistor in the first embodiment) |
| D2 | Tr34 (Sensing diode Q1) |
| C2 | Cb |
| RL | Tr31 (Differential pair transistor TrL) |

The circuits in FIGS. 14 and 15 will be more specifically described by comparison. The diode D1 is realized by the diode-connected transistor Tr35. Further, the ground of the diode D1 corresponds to the supply voltage (Vcc), the diode D2 to the diode-connected transistor Tr34, a resistor RL to the input impedance of the transistor Tr31, the capacitor C1 to a capacitor $C_{00}$ which is in series with a signal transfer line within the matching circuit, and the capacitor C2 to the smoothing capacitor Cb. In this manner, this embodiment has the configuration in which the voltage doubler wave-detector circuit is very advantageously incorporated into the differential amplification circuit utilizing the current mirror circuit.

That is, the portion which is the resistor in the detection/amplification circuit 110 of the start signal output circuit 100 in the first embodiment is constructed of the diode (Tr35) in the detection/amplification circuit 210 in the second embodiment, whereby the voltage doubler wave-detector circuit is, in fact, disposed. Thus, in the same manner that the first embodiment incorporates the diode wave-detector circuit into the differential amplifier, the second embodiment incorporates the voltage doubler wave-detector circuit (voltage doubler rectification circuit) into the differential amplifier. Thus, the larger output (sensitivity) than in the detection/amplification circuit 110 in the first embodiment is naturally attained.

[Other Advantages Based on Voltage Doubler Wave-Detector Circuit]

Moreover, as described above, the amplitude of the detection/amplification circuit (210) in the second embodiment is larger than the amplitude (gain) in the foregoing case of the first embodiment. Therefore, when an appropriate amplification circuit (determination circuit 220) is disposed at the intermediate stage of the start signal output circuit (200) as shown in FIG. 13, its output becomes a potential which is sufficient for inverting the output level of a CMOS circuit. It is accordingly permitted to dispose at the succeeding stage of the amplification circuit, a binarization circuit 230 which is constructed of the CMOS circuit as shown in FIG. 13. In the case where the CMOS circuit is disposed behind such an amplifier (determination circuit 220), the input impedance of the CMOS circuit is very high, and hence, the amplitude becomes still larger. That is, it is permitted to replace a wide-range amplifier (limiter amplifier) such as the binarization circuit exemplified in FIG. 41 or FIG. 1, with the CMOS circuit (binarization circuit 230) as exemplified in FIG. 13. According to such a configuration, the amplifier at the final stage (binarization circuit 130) can be removed, so that power consumption can be further suppressed by the configuration.

Furthermore, it is revealed that, according to the above circuit form, the transistors Tr35 and Tr37 in FIG. 14 can be set at more appropriate bias values than in the case where these transistors are substituted by the resistors (that is, in the case of the detection/amplification circuit 110), so the function of increasing the gain of the differential amplifier itself is attained.

Figure 16A:
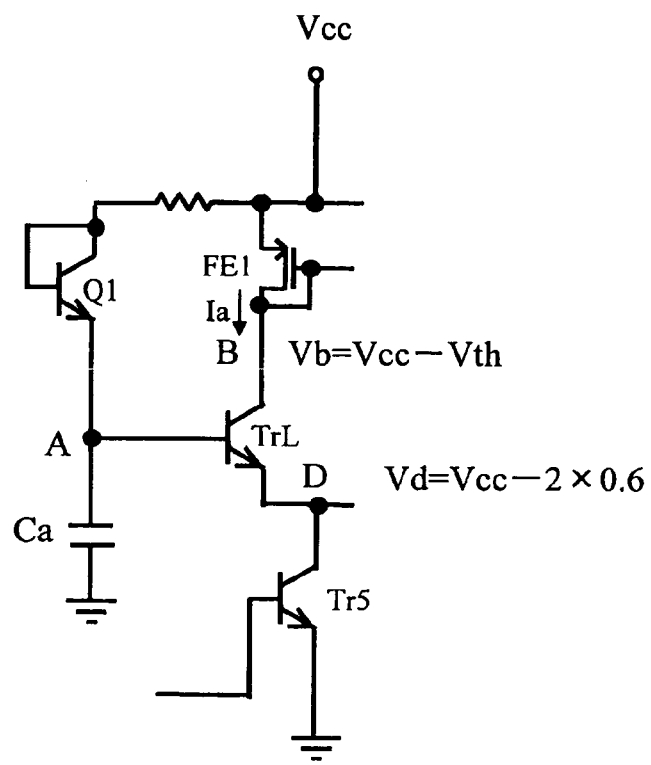
FIG. 16A is a circuit diagram of a wave-detector circuit which is included in the detection/amplification circuit 110 of the start signal output circuit 100.
Figure 16B:
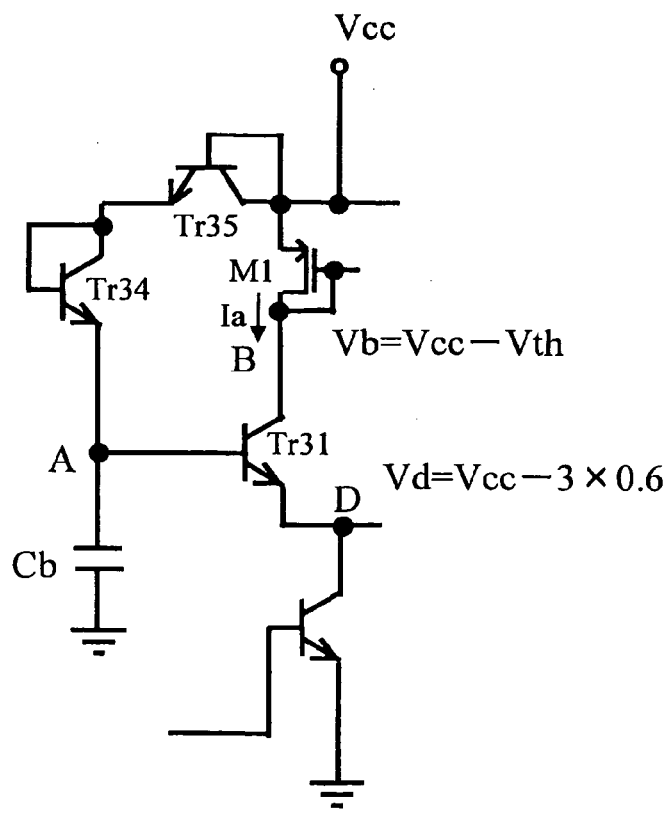
FIG. 16B is a circuit diagram of the wave-detector circuit which is included in the detection/amplification circuit 210 of the start signal output circuit 200.

Shown in FIG. 16A is a diagram of a circuit which is equivalent to the wave-detector circuit included in the detection/amplification circuit 110 of the start signal output circuit 100 in the first embodiment. Also, shown in FIG. 16B is a circuit diagram of a wave-detector circuit which is included in the detection/amplification circuit 210 of the start signal output circuit 200 in the second embodiment. The circuit of FIG. 16A in the first embodiment corresponds to a circuit in the case where the transistor Tr35 of the circuit in the second embodiment shown in FIG. 16B is replaced with a resistor (that is, to part of the detection/amplification circuit 110' in FIG. 9).

In the circuit diagram of FIG. 16A, the base current of the transistor TrL which always flows via transistors Q1 and TrL in succession, from the supply voltage (Vcc≅3.0 V) fed by, for example, a battery, is in the order of nA, and hence, a voltage drop across the resistor is quite negligible. Here, both the potential differences between the bases and emitters of the transistors Q1 and TrL are about 0.6 V, so that the potential Vd of a point D becomes about "Vcc−2×0.6 (V)". Hereinbelow, Vcc≅3.0 V is assumed unless otherwise specified.

Further, the threshold voltage of a MOSFET (FE1) in the case of diode connection is designated by Vth. On this occasion, the potential of a point B becomes Vb=Vcc−Vth or so, and the potential difference between the points B and D becomes 1.2−Vth. The threshold voltage Vth can be variously set depending upon processes, and it is usually 1.0 V or so. Further, since the transistors FE1 and TrL are operated with low currents of μA order in the start signal output circuit 100, the transistor FE1 operates in the vicinity of the threshold voltage Vth.

Under these operating conditions, the collector-emitter potential difference of the transistor TrL becomes about 0.2 V, which is insufficient for the active operation of the transistor TrL, so that the gain of the transistor TrL becomes low.

On the other hand, in FIG. 16B, the potential Vd of the point D becomes about "Vcc−3×0.6 (V)", and hence, the potential difference between the points B and D becomes 1.8−Vth. Further, Vth≅1.0 V holds as described above, with the result that a potential difference of about 0.8 V can be applied and permits the transistor Tr31 to perform the active operation thereof. Accordingly, the gain of the transistor Tr31 is high.

In other words, it can be said that, owing to the voltage drop function based on the disposition of the transistor Tr35, the gain of the transistor Tr31 of the detection/amplification circuit 210 in FIG. 14 (the differential pair transistor TrL on the sensing side) is permitted to be set higher than in the first embodiment. The S/N ratio can be effectively enhanced also by such a function.

[Determination Circuit 1]

Figure 17:
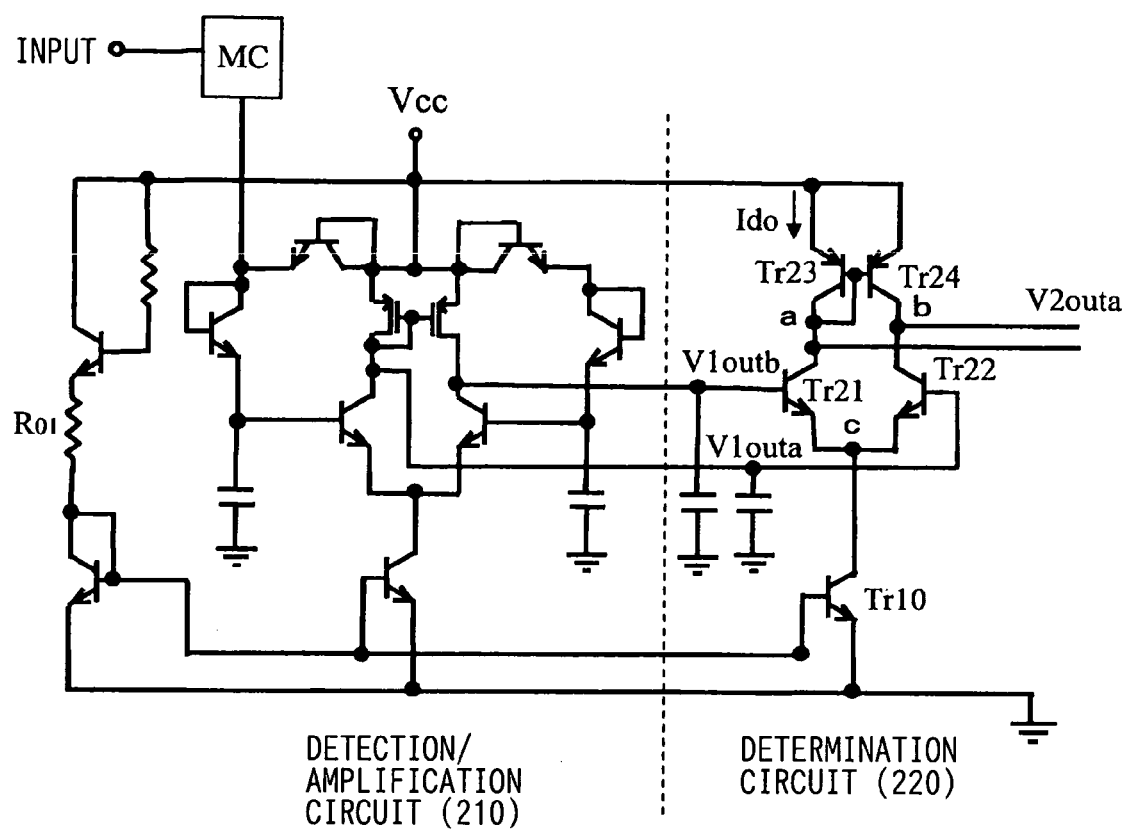
FIG. 17 is a circuit diagram of the preceding stage (detection/amplification circuit 210) and intermediate stage (determination circuit 220) of the start signal output circuit 200.

FIG. 17 is a circuit diagram of the preceding stage (detection/amplification circuit 210) and the intermediate stage (determination circuit 220) of the start signal output circuit 200 according to the second embodiment. That is, FIG. 17 shows a circuit arrangement in which the determination circuit 220 is disposed behind the detection/amplification circuit 210. Further, FIG. 18 shows a circuit diagram of an equivalent circuit to active loads (Tr23, Tr24) which are included in the determination circuit 220.

The determination circuit 220 in FIG. 17 includes a differential amplifier being substantially symmetric logically, which is configured by opposing two transistors (Tr21, Tr22). It compares an input level (V1outb) with a reference potential (V1outa) by using the differential amplifier. A load portion (Tr23, Tr24) which regulates a current flowing through the differential amplifier is constituted by the active loads in FIG. 18 as are actually asymmetric in spite of a current mirror circuit arrangement. More specifically, the active loads (Tr23, Tr24) are configured of two bipolar transistors (Tr23, Tr24). Further, as seen from FIGS. 13 and 17, a current which flows through the determination circuit 220 is regulated and limited to a small value by the subordinate transistor Tr10 described above.

Figure 18:
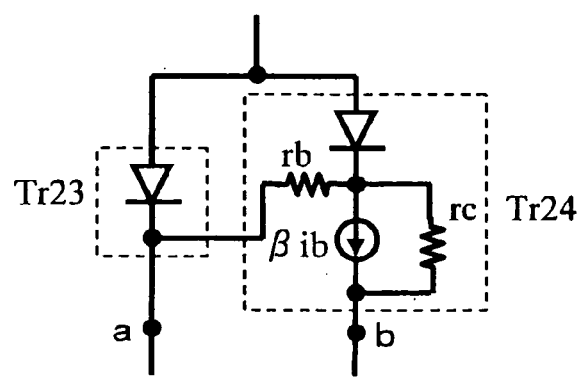
FIG. 18 is a circuit diagram of an equivalent circuit to active loads which are included in the determination circuit 220.

The active loads which are configured of the bipolar transistors as described above, actually become an asymmetric circuit as shown in FIG. 18, even when a substantially symmetric shape as in the determination circuit 220 in FIG. 17 is formed. The reason therefor is that a resistance rc indicated in the equivalent circuit in FIG. 18 is actually interposed, and the potential of a point b consequently becomes lower than that of a point a in correspondence with a voltage drop formed by elements βib and rc. Herein, the potential of the point a lowers in correspondence with the base-emitter potential difference (about 0.6 V) of the transistor Tr23, and it is therefore fixed to about "Vcc−0.6 V".

Figure 19:
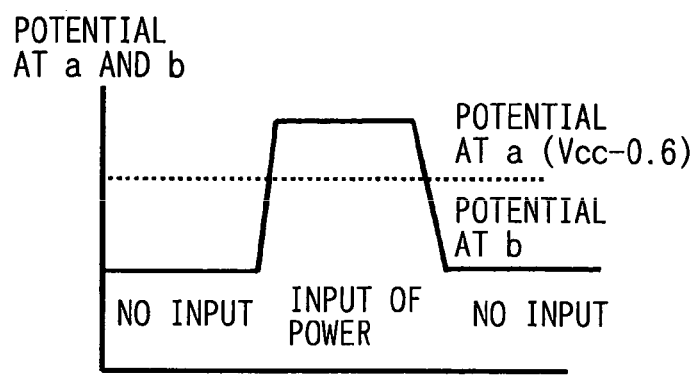
FIG. 19 is a graph showing the potential changes of points a and b in FIG. 17.

Shown in FIG. 19 are the potential changes of the points a and b. As shown in FIG. 19, the reference potential fixed to about "Vcc−0.6 V" is formed at the point a, and the potential of the point b is lower than that of the point a during the nonexistence of a signal. However, when the signal is inputted, the potential of the point b rises, and it exceeds the potential of the point a for the large level of the input signal. In other words, the signal level can be compared with reference to the potential of the point a.

That is, when the asymmetry of the active loads is advantageously utilized as shown in FIGS. 17 and 18, the relation between the magnitudes of the potentials of the points a and b can be effectively reversed in accordance with the existence or nonexistence of the input signal or the magnitude thereof, as exemplified in FIG. 19.

In order to realize such a good inverting operation, the balance of the asymmetric loads (the relation between the magnitudes of the asymmetric loads) need be appropriately adjusted.

[Determination Circuit 2]

Figure 20:
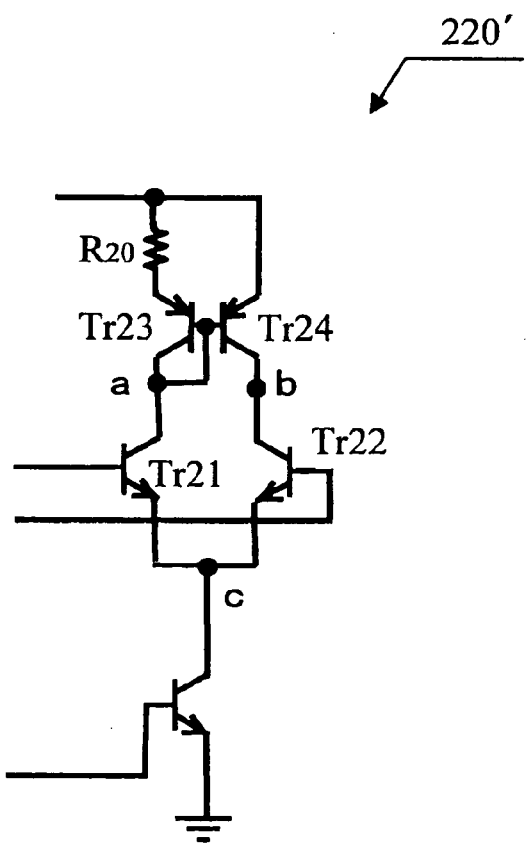
FIG. 20 is a circuit diagram exemplifying a modified embodiment of the determination circuit 220 (a determination circuit 220').

In a case, for example, where the potential of the point a in the state of no input is to be lowered slightly, a resistor R may be inserted on the side of a transistor Tr23 as in FIG. 20. That is, FIG. 20 is a circuit diagram exemplifying that modified embodiment of the determination circuit 220 (a determination circuit 220') in which such an adjustment is made by the resistor $R_{20}$.

Further, the potential of the point b in the state of no input may be similarly adjusted by inserting a resistor on the side of a transistor Tr24, and both the potentials can be finely adjusted. In such a circuit (example: amplification circuit 220" in FIG. 21), the difference between a reference potential and a determination-circuit output level can be enlarged, and hence, the enhancement of an S/N ratio can be easily attained by optimizing individual resistance values.

Further, at the point a in FIGS. 17 and 18, the transistor Tr23 is diode-connected, so that the potential is not amplified even in the existence of the input. Accordingly, noise is much less than at the point b. In contrast, in the case of adopting the configuration of the first embodiment (the determination circuit 120 in FIG. 3) in which the transistors Tr23 and Tr24 are replaced with the resistors, noises at equal degrees are superimposed on both the points a and b. Also in this respect, it can be said that the second embodiment is more excellent.

[Determination Circuit 3]

Figure 21:
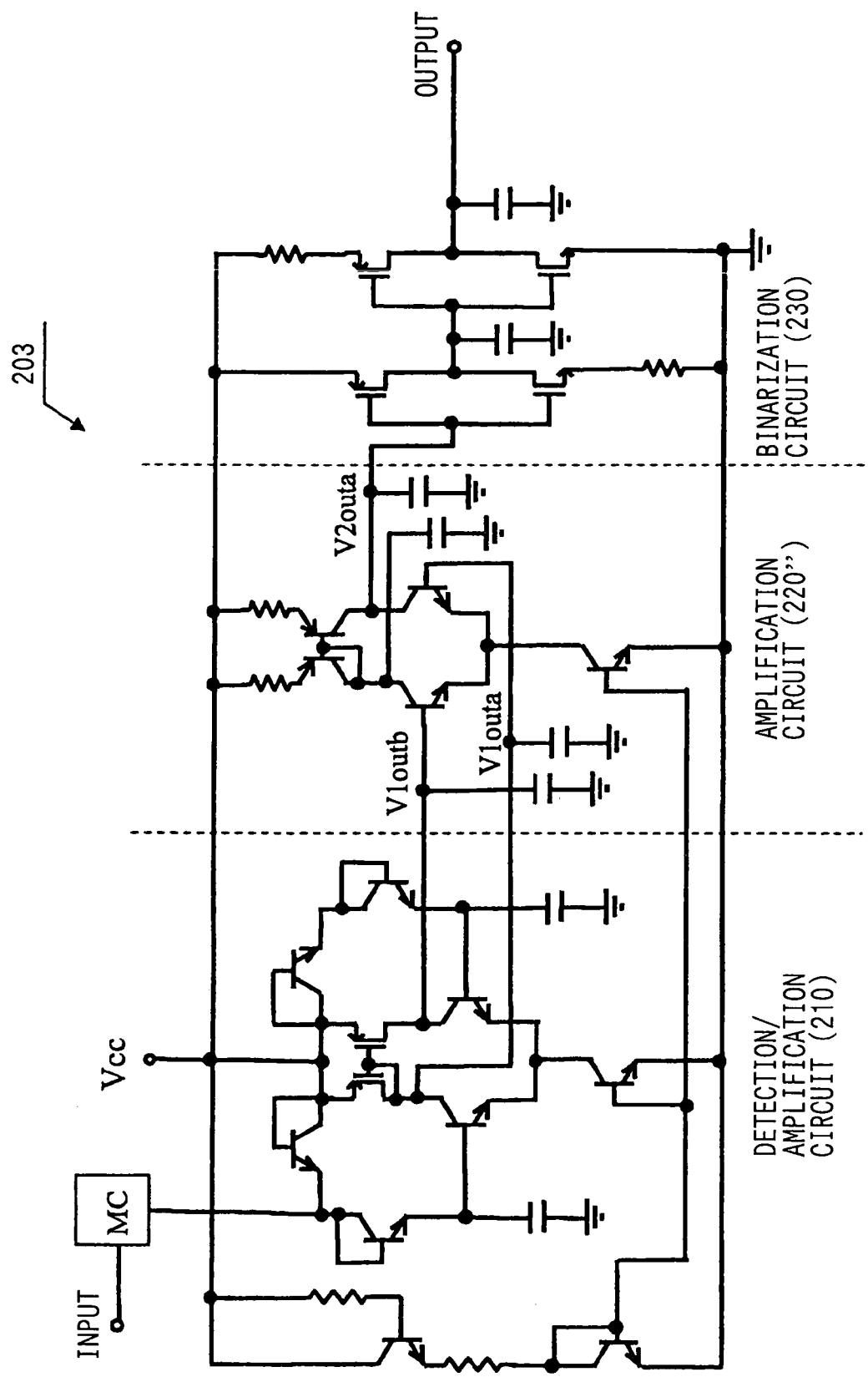
FIG. 21 is a circuit diagram of a start signal output circuit 203 in the second embodiment.

Further, FIG. 21 is a circuit diagram of a start signal output circuit 203 which is obtained by modifying part of the determination circuit of the start signal output circuit 200 in FIG. 13. In the start signal output circuit 203, a binarization circuit 230 employing CMOS functions as a comparison/determination circuit, while the amplification circuit 220" at a intermediate stage operates merely as an amplifier of one output without delivering a reference potential to a succeeding stage.

(Signs)

V1outa: DC input potential of determination circuit (reference side)

V1outb: DC input potential of determination circuit (sensing side)

V2outa: DC output potential of determination circuit (sensing side)

[Evaluation of Start Signal Output Circuit 203]

There will now be described characteristics which concern the S/N ratio of the start signal output circuit 203 of the second embodiment having the amplification circuit 220".

In order to verify the effectiveness (sensitivity) of the start signal output circuit 203 in FIG. 21 employing the determination circuit 3 described above (: determination circuit 220" in FIG. 21), the simulation of a circuit operation was performed. In the simulation, input power was given in a waveform obtained by subjecting a carrier of 5.8 GHz and −60 dBm to an ASK modulation at a width of 781 μsec and a period of 2.343 msec. Further, a supply voltage Vcc was assumed to be 3 V, and an operating current was assumed to be 13.2 μA. These values signify remarkably low power consumption which is more excellent than in the third and fourth embodiments to be described later, and they are actualized by the circuit arrangement of the start signal output circuit 203 in FIG. 21.

Figure 22A:
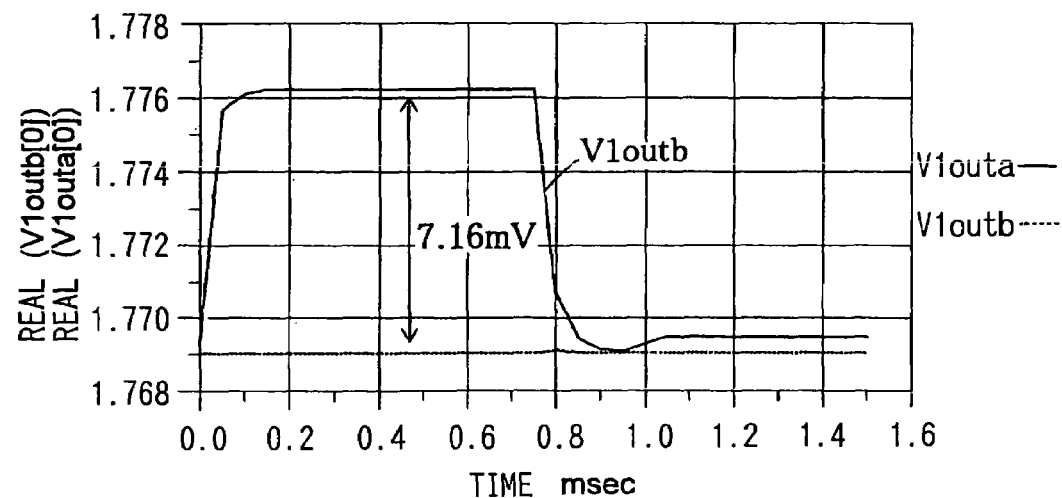
FIG. 22A is a graph showing the input DC potential of an amplification circuit 220" in the second embodiment.
Figure 22B:
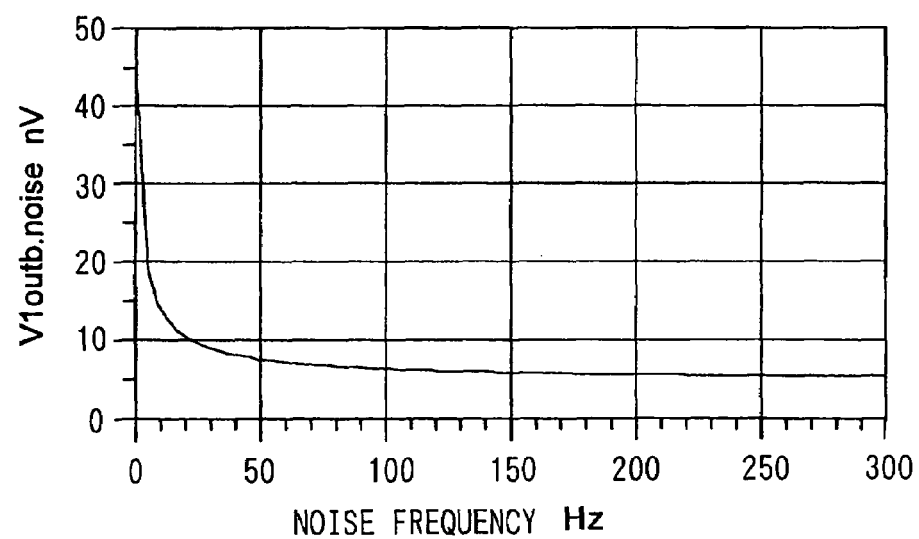
FIG. 22B is a graph showing the spectrum (computed values) of the input noise of the amplification circuit 220" in the second embodiment.

FIG. 22A is a graph showing the input DC potential of the amplification circuit 220", while FIG. 22B is a graph showing the spectrum (computed values) of the input noise of the amplification circuit 220." In the start signal output circuit 203 in the second embodiment, the detection/amplification circuit 210 is employed at a preceding stage. It is understood from FIGS. 22A and 22B that, in the detection/amplification circuit 210 in this embodiment, a level difference exhibited between in a case where radio frequency power is received and in a case where not is larger than in the first embodiment (FIGS. 9 and 10), and that noise is lower. The reason why the level difference (amplitude) has become larger is the introduction of a voltage doubler wave-detector circuit. The reason why the noise becomes lower, is the alteration of the gate sizes of MOSFETs. The MOSFETs M1 and M2 in the detection/amplification circuit 210 have gate widths of 5 μm and gate lengths of 10 μm. On the other hand, in the MOSFETs in the circuit of the first embodiment (FIG. 9), gate widths are 1.3 μm, and gate lengths are 0.4 μm. That is, with the configuration of the start signal output circuit 203 of the second embodiment, functions and advantages owing to the seventh invention of the present application can be appropriately achieved in proper quantities on the basis of, for example, "RF CMOS circuit design technology" (written by Nobuyuki Itoh, and published by Kabushiki-Kaisha Triceps) described above.

Figure 23A:
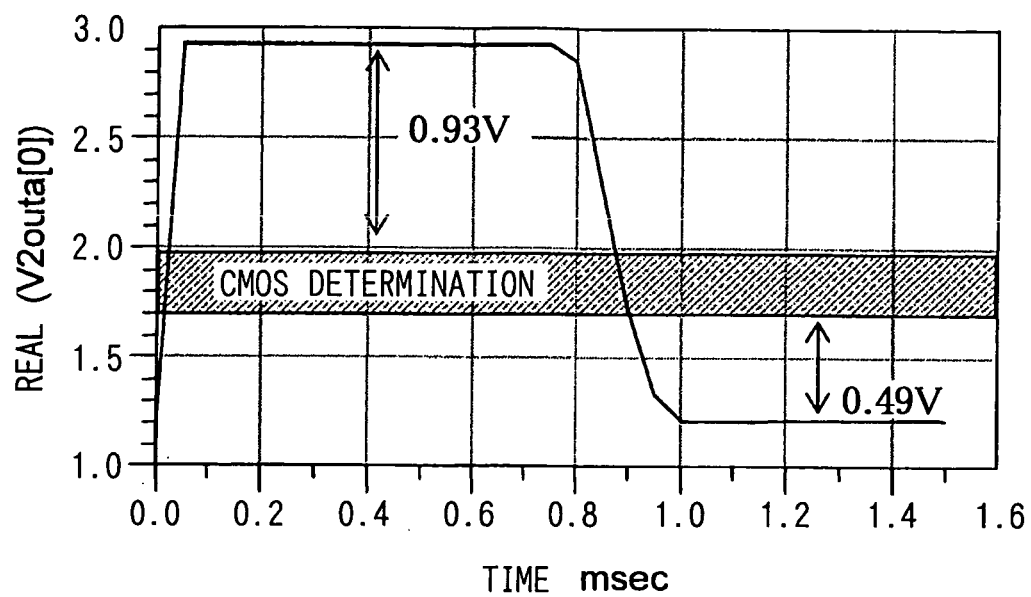
FIG. 23A is a graph showing the output DC potential of the amplification circuit 220".
Figure 23B:
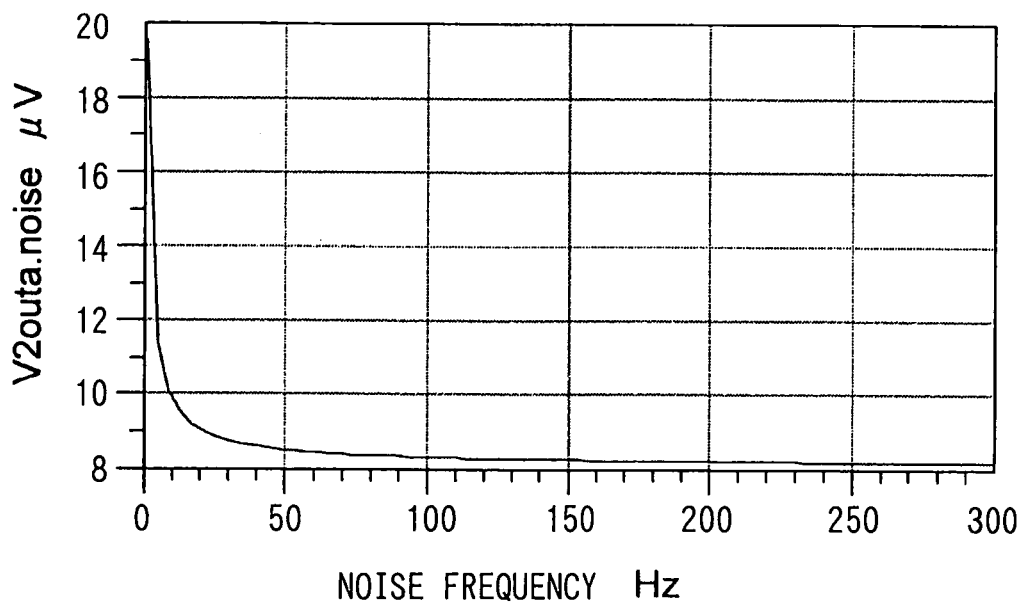
FIG. 23B is a graph showing the spectrum of the output noise of the amplification circuit 220".

FIG. 23A is a graph showing the output DC potential of the amplification circuit 220". Further, shown in FIG. 23B is the spectrum of the output noise of the amplification circuit 220". The amplification circuit 220" includes active loads, and the binarization circuit 230 employing CMOS is further arranged at a succeeding stage. Therefore, the load impedance of the amplification circuit 220" is high, and the start signal output circuit 203 of the second embodiment has a very large gain as seen from the graph of FIG. 23A.

Figure 24A:
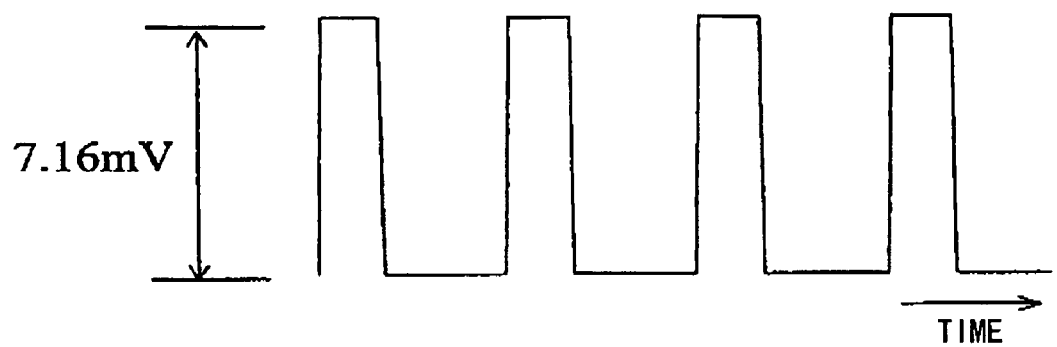
FIG. 24A is a graph obtained by modeling the input waveform of the amplification circuit 220" with the conditions of FIGS. 22A and 22B premised.

FIG. 24A is a graph obtained by modeling the input waveform of the amplification circuit 220" with the conditions of FIGS. 22A and 22B premised. Here, a case is modeled where noise of 40 nV is superimposed on a fundamental waveform having an amplitude of 7.16 mV. The amplitude becomes larger than in a prior art example, and the absolute value of the noise becomes less.

Figure 24B:
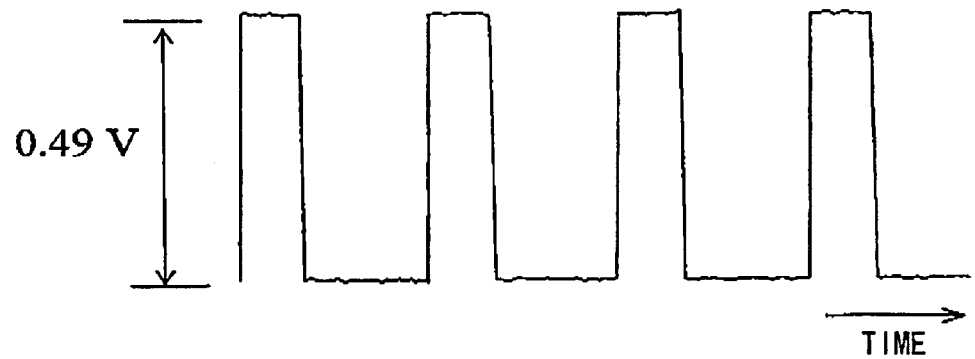
FIG. 24B is a graph obtained by modeling the output characteristic (S/N ratio) of the amplification circuit 220" with the conditions of FIGS. 23A and 23B premised.

FIG. 24B is a graph obtained by modeling the output characteristic (S/N ratio) of the amplification circuit 220" in the case where radio frequency power is not received, with the conditions of FIGS. 23A and 23B premised. This graph represents a state where noise of 19 μV is superimposed on a fundamental wave having an amplitude of 0.49 V. With the start signal output circuit 203 of the second embodiment, as seen from FIG. 24B, the level of the noise after the amplification is larger than in the first embodiment (FIG. 12B), but the S/N ratio is much more excellent.

Further, since the binarization circuit (limiter amplification circuit) at the final stage is the binarization circuit 230 employing CMOS of lowered power consumption, the start signal output circuit 203 of the second embodiment can realize still lower power consumption correspondingly, and it actually operates with power consumption of 3 V and 13.2 μA as is less than half of that of the other embodiment. Also in this respect, the start signal output circuit 203 of the second embodiment is very excellent.

(Third Embodiment)

As a method for attaining a large amplitude (gain) in the determination circuit (example: determination circuit 120 in FIG. 1), there is described, for example, the method in which the appropriate load resistors ($r_a$, $r_b$ and $r_c$) are employed as exemplified in detail in FIG. 3 in the foregoing first embodiment. Alternatively, however, there is a method in which the gain of the differential pair transistors of the differential amplifier of the determination circuit is enhanced. The method is, for example, one in which Darlington connection is employed for the part of the differential pair transistors of the differential amplifier of the determination circuit.

Figure 25:
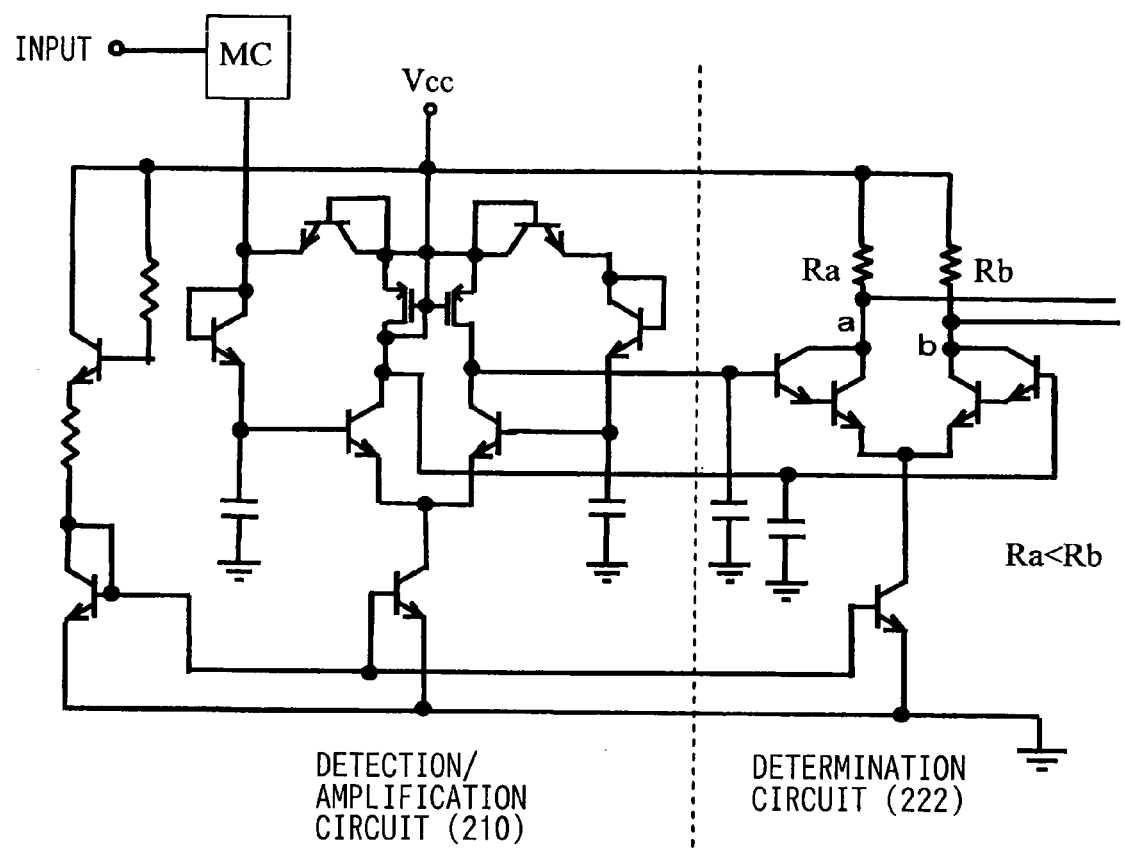
FIG. 25 is a circuit diagram exemplifying a determination circuit 222 in the third embodiment.

FIG. 25 exemplifies a determination circuit 222 in which the determination circuit 120 (FIG. 3) in the foregoing first embodiment is reconfigured using the Darlington connection. Incidentally, also here, load resistors are set at Ra<Rb in the same manner as in the first embodiment. As already explained, this is because the potential of the point a need be higher than that of the point b in case of no input.

Figure 26:
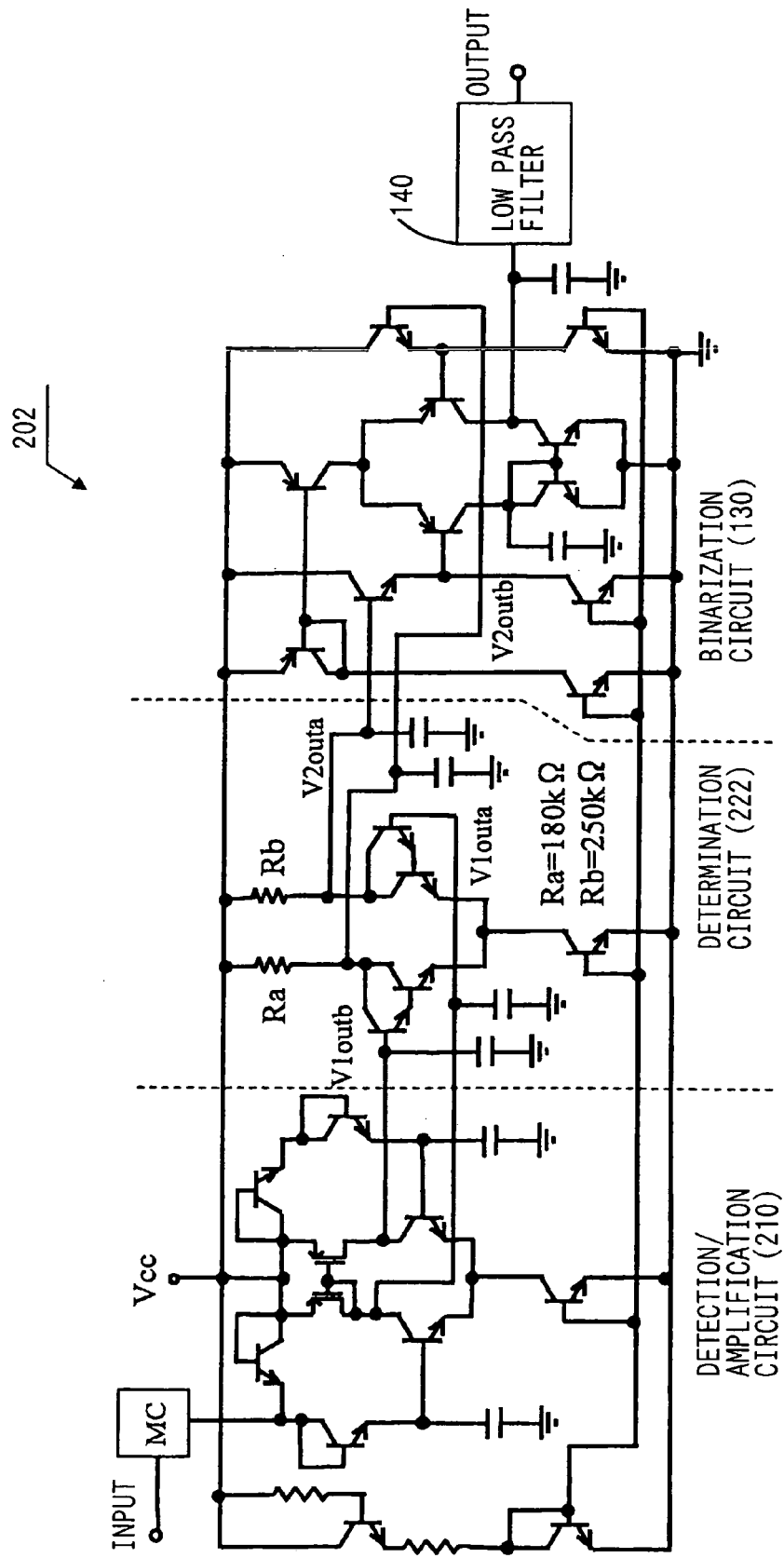
FIG. 26 is a circuit diagram of a start signal output circuit 202 in the third embodiment.

FIG. 26 is a circuit diagram of a start signal output circuit 202 in the third embodiment as is configured using the determination circuit 222. In the start signal output circuit 202, the detection/amplification circuit 210 of the voltage doubler form in FIG. 14 is employed as the detection/amplification circuit, and the binarization circuit 130 at the succeeding stage is the same as in the first embodiment (FIG. 1).

Also for the start signal output circuit 202, a similar simulation was performed under the same conditions as in the foregoing embodiment. However, the supply voltage Vcc was assumed to be 3 V, and the operating current was assumed to be 28.8 µA. These values signify remarkably low power consumption, and they are actualized by the circuit arrangement of the start signal output circuit 202 in FIG. 26.

Figure 27A:
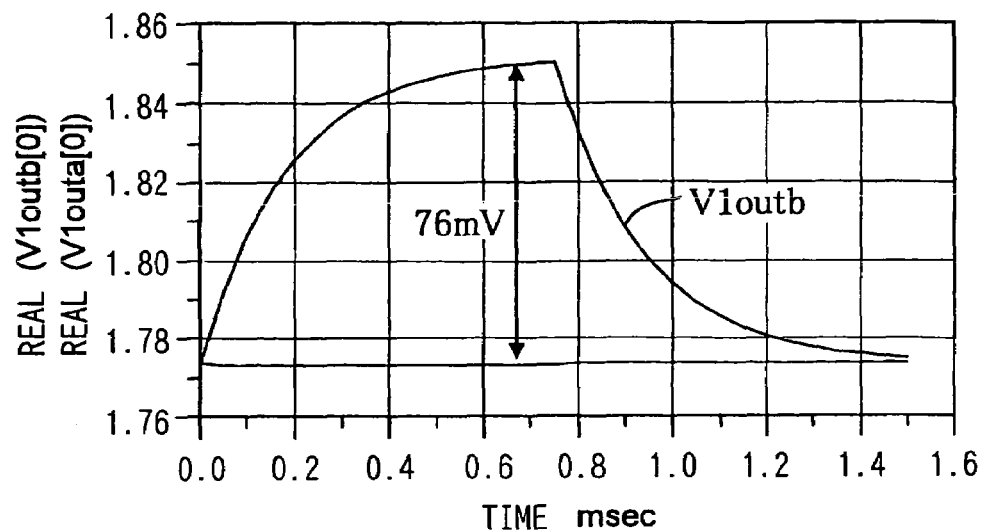
FIG. 27A is a graph showing the input DC potential of the determination circuit 222 in the third embodiment.
Figure 27B:
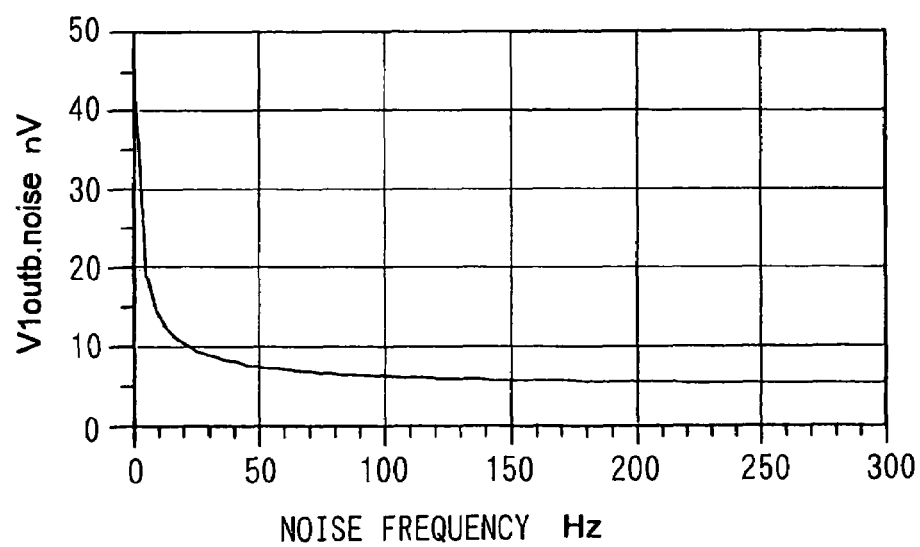
FIG. 27B is a graph showing the spectrum (computed values) of the input noise of the determination circuit 222 in the third embodiment.

FIG. 27A shows the input DC potential of the determination circuit 222. Further, shown in FIG. 27B is the spectrum (computed values) of the input noise of the determination circuit 222. It is seen from these graphs that, with the detection/amplification circuit 210, both the detection waveform and the noise are sharply improved as in the second embodiment. Since the input impedance of the Darlington connection affords the high input impedance of transistors, the amplitude of the detection signal becomes larger than in FIG. 22A referred to in the foregoing second embodiment.

Figure 28A:
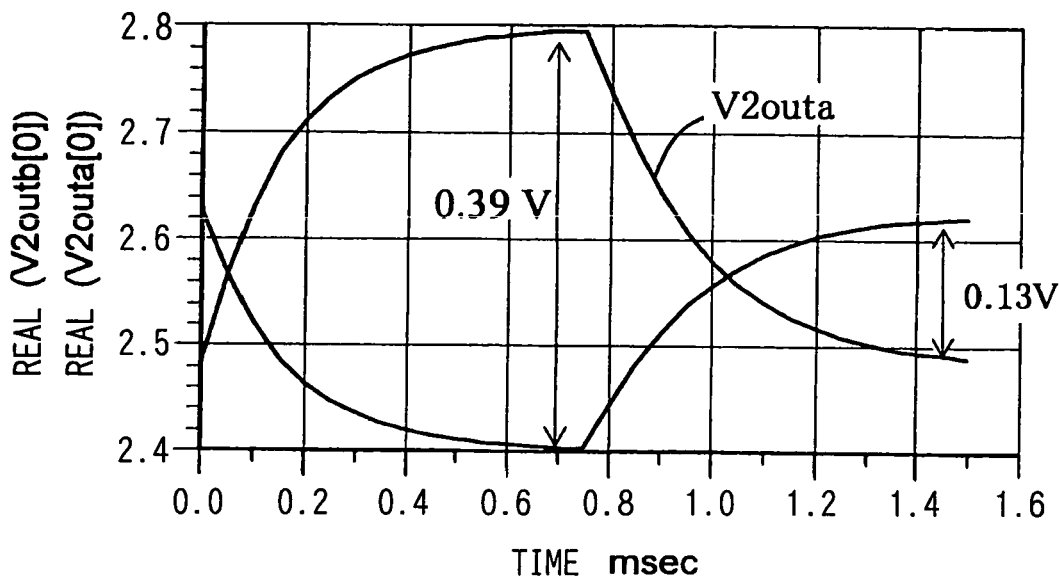
FIG. 28A is a graph showing the output DC potential of the determination circuit 222.
Figure 28B:
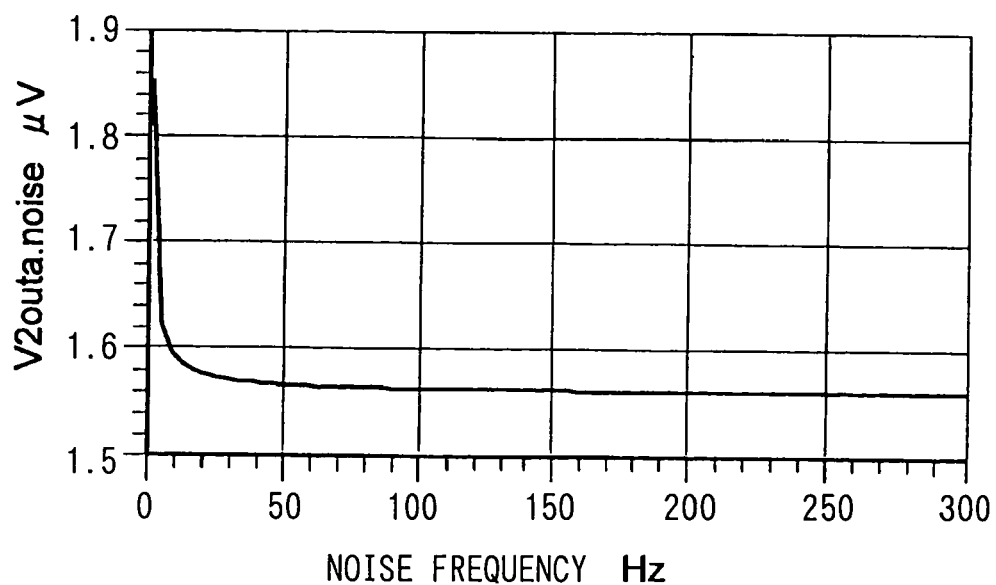
FIG. 28B is a graph showing the spectrum of the output noise of the determination circuit 222.

FIG. 28A is a graph showing the output DC potential of the determination circuit 222, while FIG. 28B is a graph showing the spectrum of the output noise of the determination circuit 222. It is seen from these graphs that, although the values of the noise are at the same degree as in the prior art, the amplitude is improved.

Figure 29A:
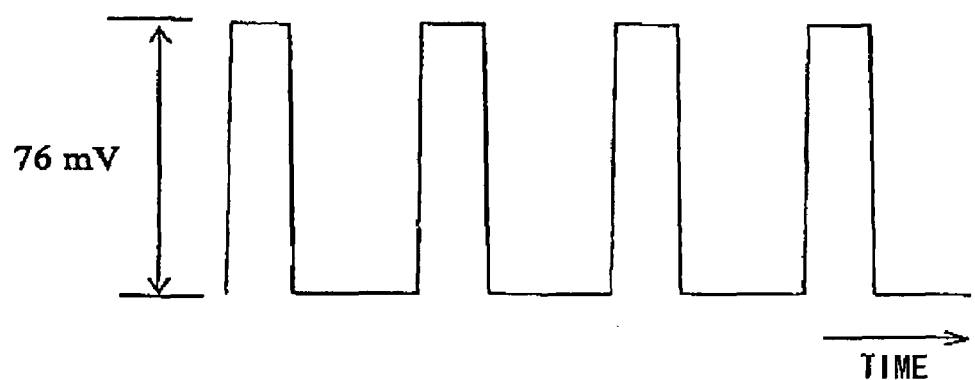
FIG. 29A is a graph obtained by modeling the input waveform of the determination circuit 222 with the conditions of FIGS. 27A and 27B premised.

FIG. 29A is a graph obtained by modeling the input waveform of the determination circuit 222 with the conditions of FIGS. 27A and 27B premised. This illustrates a state where noise of 40 nV is superimposed on a fundamental waveform having an amplitude of 76 mV, and it represents the waveform of a potential V1outb.

Figure 29B:
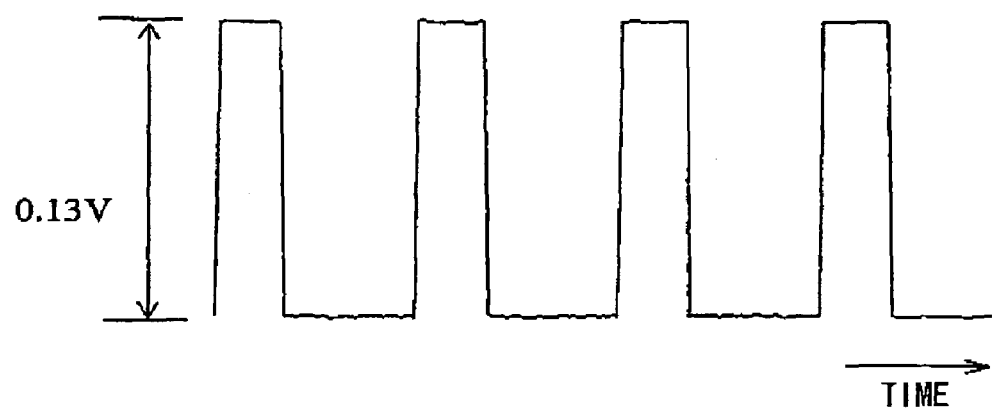
FIG. 29B is a graph obtained by modeling the output characteristic (SIN ratio) of the determination circuit 222 with the conditions of FIGS. 28A and 28B premised.

Further, FIG. 29B is a graph obtained by modeling the output characteristic (S/N ratio) of the determination circuit 222 in the case where radio frequency power is not received, with the conditions of FIGS. 28A and 28B premised. It represents a state where noise of 1.85 µV×2 is superimposed on a fundamental waveform having an amplitude of 0.13 V. That is, it corresponds to a case where the noise is superimposed on the difference between potentials V2outa and V2outb (determination circuit). The reason why the voltage 1.85 µV is doubled is that, in the determination circuit 222, noises at the same level develop in both the potentials V2outa and V2outb.

It is seen from these graphs that the S/N ratio is enhanced much more than in the first embodiment.

(Fourth Embodiment)

Shown in FIG. 30 is a circuit diagram of a start signal output circuit 201 in the fourth embodiment as is provided in such a way that, in the start signal output circuit 200 of the second embodiment, the binarization circuit 230 is replaced with the binarization circuit 130 in the first embodiment.

More specifically, here, the wave-detector circuit of voltage doubler form (voltage doubler wave-detector circuit) in FIG. 16B is employed as a detection/amplification circuit 210, and the active loads (FIGS. 17 and 18) constructed using the bipolar transistors Tr23 and Tr24 are adopted for the loads of the determination circuit 220. However, the output form of the determination circuit 220 is a two-output form, and regarding a low pass filter 140 further disposed at the succeeding stage of the binarization circuit 130, one of the same form as in the foregoing first embodiment (FIG. 1) is employed.

Here, signs in the figure in the fourth embodiment are as follows:

(Signs)

V1outa: DC input potential of determination circuit (reference side)

V1outb: DC input potential of determination circuit (sensing side)

V2outa: DC output potential of determination circuit (sensing side)

V2outb: DC output potential of determination circuit (reference side)

In order to verify the effectiveness of the start signal output circuit 201, the simulation of a circuit operation was performed. In the simulation, input power was given in a waveform obtained by subjecting a carrier of 5.8 GHz and −60 dBm to an ASK modulation at a width of 781 µsec and a period of 2.343 msec. Further, a supply voltage Vcc was assumed to be 3 V, and an operating current was assumed to be 28.8 µA. These values signify remarkably low power consumption, and they are actualized by the circuit arrangement of the start signal output circuit 201 in FIG. 30.

Figure 31A:
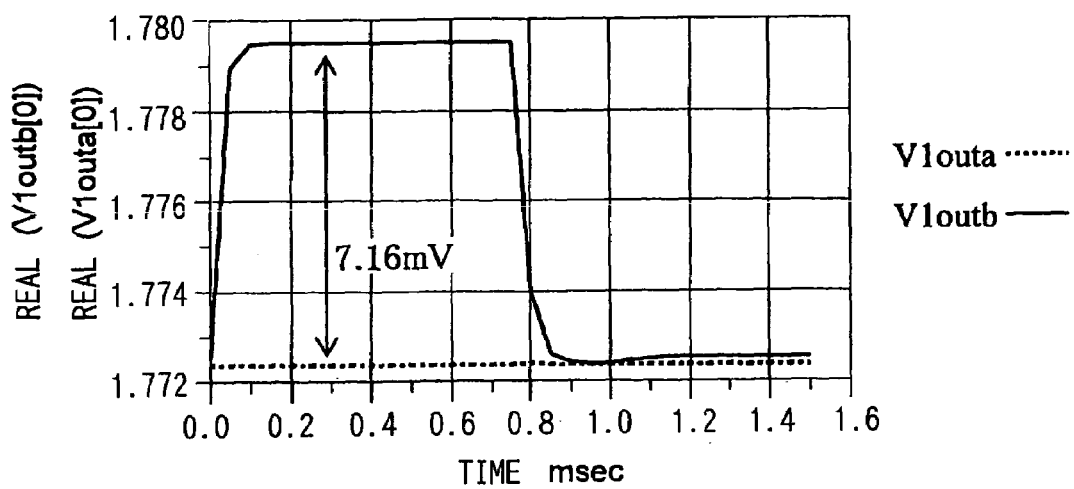
FIG. 31A is a graph showing the input DC potential of a determination circuit 220 in the fourth embodiment.
Figure 31B:
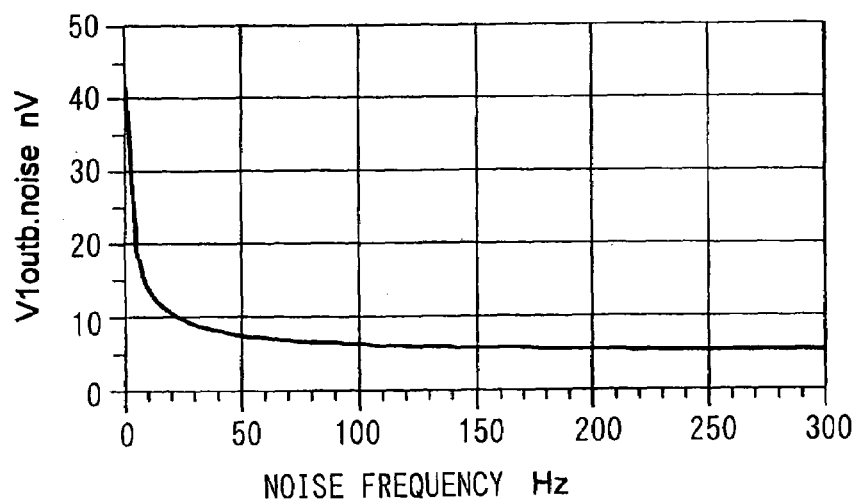
FIG. 31B is a graph showing the spectrum (computed values) of the input noise of the determination circuit 220 in the fourth embodiment.

Shown in FIG. 31A is the input DC potential of the determination circuit 220. Further, shown in FIG. 31B is the spectrum (computed values) of the input noise of the determination circuit 220. It is understood from FIGS. 31A and 31B that, in the detection/amplification circuit 210 in FIG. 30, the amplitude is larger than in the first embodiment (FIGS. 9 and 10), and that noise is lower. The reason why the amplitude becomes larger, is the introduction of the voltage doubler wave-detector circuit. The reason why the noise becomes lower, is the alteration of the gate sizes of MOSFETs. The MOSFETs M1 and M2 in the detection/amplification circuit 210 have gate widths of 5 µm and gate lengths of 10 µm. On the other hand, in the MOSFETs in the circuit of the first embodiment (FIG. 9), gate widths are 1.3 µm, and gate lengths are 0.4 µm. That is, with the configuration in FIG. 31B, functions and advantages owing to the seventh invention of the present application can be appropriately achieved in proper quantities on the basis of, for example, "RF CMOS circuit design technology" (written by Nobuyuki Itoh, and published by Kabushiki-Kaisha Triceps).

Figure 32A:
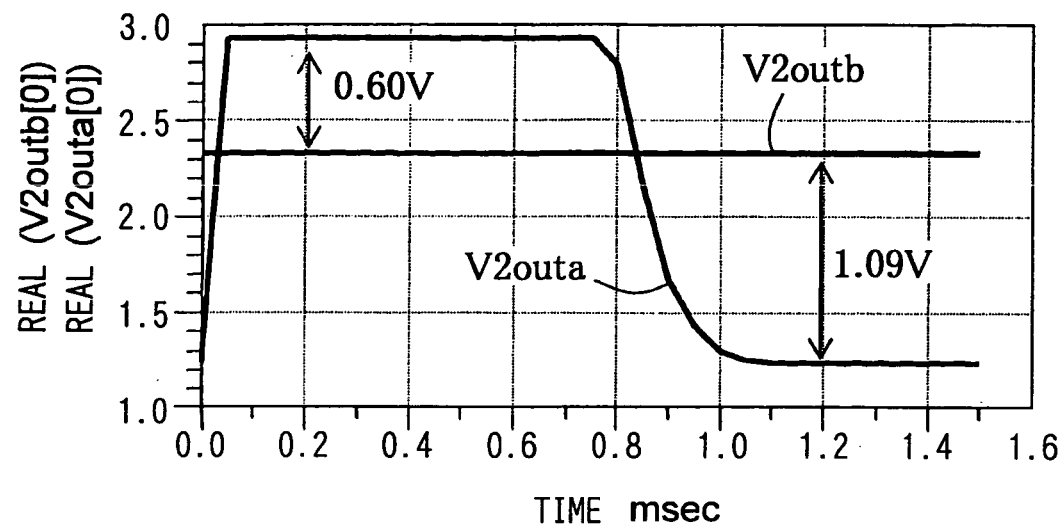
FIG. 32A is a graph showing the output DC potential of the determination circuit 220.
Figure 32B:
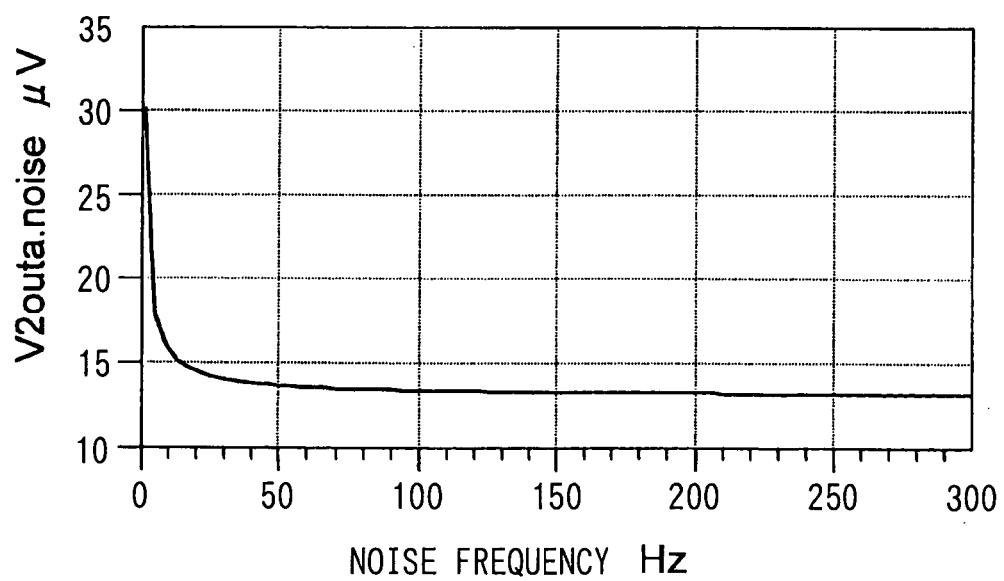
FIG. 32B is a graph showing the spectrum of the output noise of the determination circuit 220.

Shown in FIG. 32A is the output DC potential of the determination circuit 220. Further, shown in FIG. 32B is the spectrum of the output noise of the determination circuit 220. It is seen from these graphs that, although the amplitude is much larger than in the prior art, the noise whose DC component is 30 µV does not increase very much.

Figure 33A:
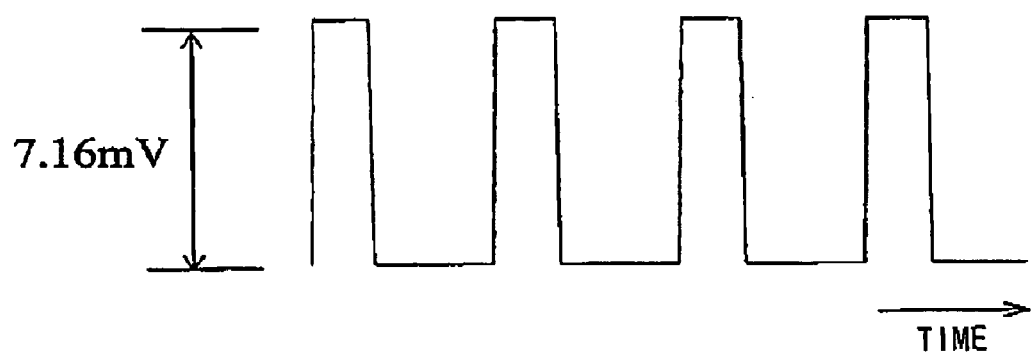
FIG. 33A is a graph obtained by modeling the input waveform of the determination circuit 220 with the conditions of FIGS. 31A and 31B premised.

FIG. 33A is a graph obtained by modeling the input waveform of the determination circuit 220 with the conditions of FIGS. 31A and 31B premised. Therefore, noise of 40 nV is superimposed on the fundamental waveform having an amplitude of 7.16 mV. This corresponds to noise which is superimposed on the potential V1outb (detection/amplification circuit 210). In the input waveform of the determination circuit 220, the amplitude becomes larger than in the first embodiment (FIG. 12A), and the absolute value of the noise becomes less.

Figure 33B:
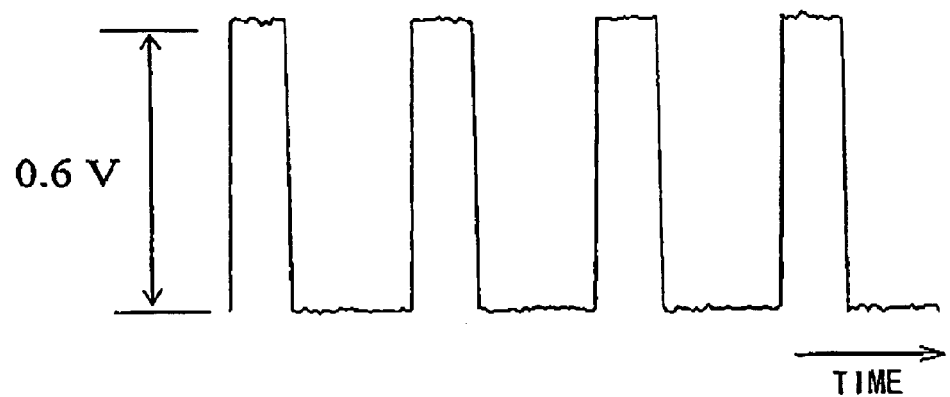
FIG. 33B is a graph obtained by modeling the output characteristic (S/N ratio) of the determination circuit 220 with the conditions of FIGS. 32A and 32B premised.

Further, FIG. 33B is a graph obtained by modeling the output characteristic (S/N ratio) of the determination circuit 220 in the case where radio frequency power is received, with the conditions of FIGS. 32A and 32B premised. Therefore, noise of 30 μV is superimposed on a fundamental waveform having an amplitude of 0.6 V. This corresponds to a case where the noise is superimposed on the difference between the potentials V2outa and V2outb. Here, the voltage difference becomes larger than in the first embodiment (FIG. 12B). Further, the absolute value of the noise becomes larger, but the influence thereof becomes less.

That is, likewise to FIGS. 10A and 10B–FIGS. 12A and 12B, these graphs indicate results obtained by simulating the ratios of the noises. As described above, it is understood that the much more excellent results than in the first embodiment are respectively obtained in both the detection/amplification circuit 210 and the determination circuit 220. Further, in the determination circuit 220, the noise value itself is larger than in the prior art, but the S/N ratio is greatly improved.

(Fifth Embodiment)

Figure 34:
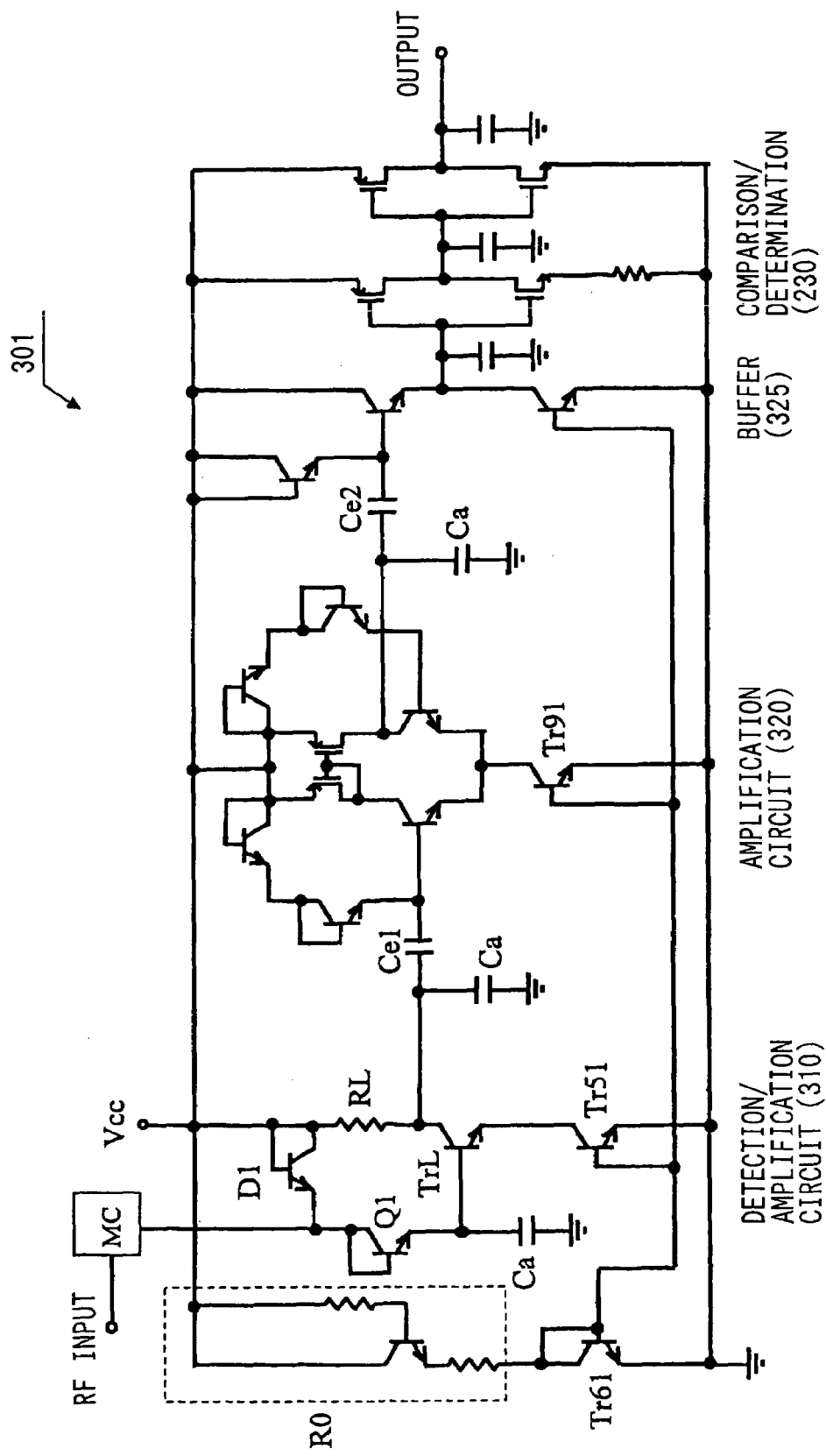
FIG. 34 is a circuit diagram of the whole start signal output circuit 301 in the fifth embodiment.

Shown in FIG. 34 is a circuit diagram of the whole start signal output circuit 301 in the fifth embodiment. Further, FIG. 35 is a circuit diagram of a detection/amplification circuit 310 which forms the start signal output circuit 301.

In a current mirror circuit which forms the outline of the start signal output circuit 301 in FIG. 35, a plurality of subsidiary transistors conforming to one reference transistor are formed and arranged in parallel and into a multiple output type.

In case of, for example, such a circuit arrangement, the emitter terminals of all the transistors of the reference transistor and the subsidiary transistors are respectively grounded (or connected to a feed point). Therefore, unless the temperature-dependent characteristics, etc. of the transistors are considered, the collector currents of the respective transistors are uniquely determined by only the potentials (bias voltages) of the base terminals of the transistors. Further, the characteristics of the transistors of the reference transistor and the subsidiary transistors are identical, and the base terminals of the respective subsidiary transistors are connected with the base terminal of the reference transistor. Therefore, the bias voltages of the respective subsidiary transistors agree with the bias voltage $V_{B-CM}$ of the reference transistor.

Accordingly, the collector currents of the subsidiary transistors are always controlled to the same quantities as the collector current of the reference transistor.

Further, the emitter terminal of a transistor TrL which amplifies the DC component $I_{Q1}$ of a current outputted by a sensing diode Q1 is connected to the collector terminal of the subsidiary transistor, so that the emitter current of the transistor TrL substantially agrees with the collector current of the subsidiary transistor.

According to such a circuit arrangement, all the transistors which form the start signal output circuit of this embodiment can be driven by a single current source. Accordingly, the bias voltages of all the transistors lower uniformly with the lowering of a supply voltage. In consequence, the start signal output circuit of this embodiment can stably operate even in a case where the supply voltage lowers. That is, the start signal output circuit of this embodiment is highly immune to lowering in temperature, deterioration in a battery, etc., and it has a wide operable range versus the supply voltage.

Moreover, according to such a circuit arrangement, the emitter current to flow through the transistor TrL can be suppressed to a sufficiently small value as desired, by utilizing the function of the current mirror circuit, that is, by adjusting and setting the load R0 of the reference transistor to a large resistance. Accordingly, a large-area resistance of MΩ order which has a problematic parasitic component incurring an action equivalent to a capacitor, a grounding resistance or the like need not be directly used on a wave-detector circuit. That is, such a high resistance may be indirectly disposed outside the wave-detector circuit as the load of the reference transistor. Thus, it is permitted to effectively eliminate the above problem of radio frequency leakage.

Figure 36:
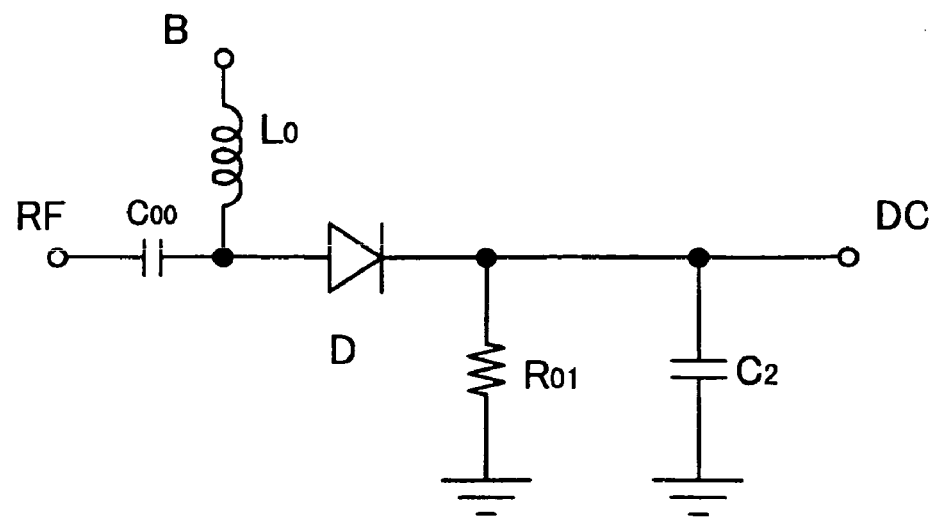
FIG. 36 is a circuit diagram exemplifying a radio-frequency detection circuit in the prior art.
Figure 37:
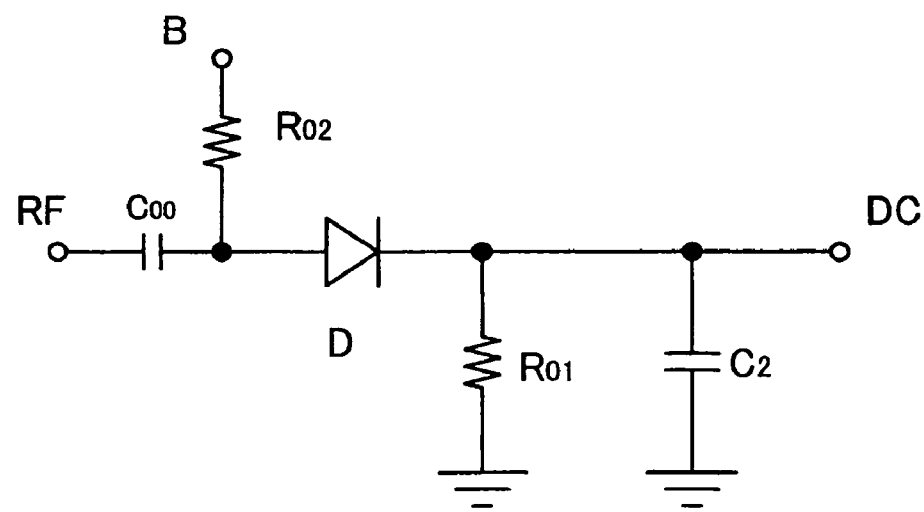
FIG. 37 is a circuit diagram exemplifying the radio-frequency detection circuit in the prior art.

More specifically, with an ordinary diode wave-detector circuit as shown in FIG. 36 or FIG. 37, when a current is to be lowered, a resistance becomes very high, so that the circuit is unsuitable for integration. In contrast, according to this embodiment as described above, the integration (miniaturization) and the lowered current (lowered power consumption) can be simultaneously and easily realized by employing the transistors.

In other words, a large resistance component which corresponds to the resistance R2 of the prior art start signal output circuit 900 in FIG. 38 can be, in fact, generated by resistance components which are included in the subsidiary transistor Tr5 forming one principal part of the current mirror circuit, and the transistor TrL described above. Therefore, the emitter current $I_E$ of the transistor TrL can be confined to the order of μA by utilizing such an operation. That is, according to such a configuration, the base current of the transistor TrL becomes the order of several tens nA surely, with the result that the bias of the low current can be automatically applied to the transistor TrL.

In the case of, for example, the detection/amplification circuit 310 in FIG. 35, the bias current which is fed from the feed point (Vcc) and which is always flowing to the ground point via the diode-connected transistor (D1), the sensing diode Q1, the transistor TrL and the subsidiary transistor Tr5 is in substantial agreement with the base current of the above transistor TrL while radio frequency power is not inputted to the detection/amplification circuit 310. That is, a high resistance is realized by the connection of the sensing diode Q1 and the transistor TrL. Thus, according to this embodiment, the quantity of the base current can be effectively confined to a desired value without employing directly on the wave-detector circuit, the large-area resistance of MΩ order which has the parasitic component capable of incurring the problem of the radio frequency leakage.

Further, the quantity of the base current is effectively confined to the suitable value, whereby the following advantages can be naturally attained:
(1) The rectification action of the sensing diode Q1 can be optimized for the RF input (minute power).
(2) Accordingly, in a case where a smoothing capacitor (with or without a resonator) or the like is arranged posteriorly to the sensing diode Q1, only the component (DC component $I_{Q1}$) near the direct current of a sensed current outputted from the sensing diode Q1 can be effectively amplified at a gain higher relatively to the gains of the other frequency values, when the sensing current is inputted to the base terminal of the transistor TrL.
(3) The power consumption of the wave-detector circuit (detection/amplification circuit) can be effectively suppressed.

Such functions and advantages based on the first or second invention of the present application are, of course, attained in the first to fourth embodiments described before. That is, the range of an operable battery voltage is expanded owing to the single supply voltage based on the current mirror circuit. Further, in connecting an amplification circuit for the DC potential (DC), a bandwidth limitation function is afforded by lowering the current of the amplification circuit on the basis of a configuration as described above. Further, the bandwidth limitation function is intensified by disposing a filter circuit at a stage prior or posterior to the amplification circuit, whereby the sensitivity of the amplification circuit for the vicinity of the outputted DC potential (DC) can be enhanced by the bandwidth limitation. That is, according to the first and second inventions, the lowered power consumption and the enhanced sensitivity of the amplification circuit are compatible. Accordingly, the start signal output circuit of high sensitivity which is free from the radio frequency leakage attendant upon the connection of the high resistance can be easily realized by the circuit arrangement of low power consumption.

Furthermore, when the plurality of subsidiary transistors (Tr5, Tr9, . . . ) are arranged in parallel and into the multiple output type by employing the current mirror circuit as described above, a similar equal current control can be simultaneously performed for a circuit at the next stage or at a further succeeding stage, for example, an amplification circuit. More specifically, according to such a circuit arrangement, the bias voltage controls of the whole circuit, including the detection/amplification circuit and the other succeeding circuit, are very easily and simply realized (organized and designed) in balanced fashion, and the bias voltages and currents of the whole circuit are stabilized in balanced fashion. It is therefore facilitated to effectively prevent detection errors ascribable to the drift of the supply voltage.

The features of the circuit arrangement of the start signal output circuit 301 (FIGS. 34 and 35) of Fifth embodiment are summed up as follows:

(1) The detection/amplification circuit 310 is configured without using any differential amplifier.
(2) The start signal output circuit 301 is current-controlled advantageously in balanced fashion by employing the current mirror circuit.
(3) An amplification circuit 320 at a intermediate stage is configured by utilizing the circuit arrangement of the detection/amplification circuit 210 in the second embodiment.
(4) Preceding and succeeding the amplification circuit 320 at the intermediate stage, capacitors $C_{e1}$ and $C_{e2}$ are respectively inserted in series on a signal transfer path.
(5) A buffer 325 is disposed at a stage preceding to a binarization circuit 230 which makes a comparison and a determination.

FIG. 35 is a circuit diagram of the detection/amplification circuit 310 of the start signal output circuit 301. A matching circuit MC in FIG. 35 is configured including a capacitor $C_{00}$ which is connected and arranged in series with the transfer path of a radio frequency signal from an RF input end, a capacitor $C_0$ which is connected at one end to the output end of the capacitor $C_{00}$ and which is grounded at the other end, an open half stub $S_H$ which is connected at one end to the output end of the capacitor $C_{00}$ and which is not closed at the other end, and a stub S which is connected at one end to the output end of the capacitor $C_{00}$, which is arranged in series on the above transfer path and whose other end serves as the output end of the matching circuit MC.

That is, the matching circuit MC includes the capacitor $C_{00}$ in series therein, whereby a voltage doubler wave-detector circuit is incorporated in the detection/amplification circuit 310 as in the detection/amplification circuit 210 in the second embodiment described before. Further, the current which is fed from the feed point (Vcc) and which is always flowing to the ground point via the diode-connected transistor (D1), sensing diode Q1, transistor TrL and subsidiary transistor Tr5 is in substantial agreement with the base current of the above transistor TrL. Also in this respect, the detection/amplification circuit 310 is configured similarly to the foregoing detection/amplification circuit 210.

The operating principle of the detection/amplification circuit 310 (FIG. 35) is as described below.

The base terminals and emitter terminals of the reference transistor Tr6 and subsidiary transistor Tr5 are respectively connected to each other, so that the collector currents $I_{ref}$ and $I_c$ of the respective transistors become equal. When an RF input is received, the radio frequency power is subjected to voltage doubler rectification by the elements D1 and Q1, and hence, the base current $I_{Q1}$ of the transistor TrL increases. Accordingly, a current $I_e$ flowing through the resistor RL on this occasion increases. Since, however, the collector current $I_c$ of the subsidiary transistor Tr5 is always regulated so as to agree with the collector current $I_{ref}$, the increment of the current $I_e$ charges the smoothing capacitor Ca, and it further flows into the amplification circuit at the next stage (amplification circuit 320 in FIG. 34), so that the potential of a point A rises correspondingly.

It is also allowed to adopt a circuit arrangement in which, instead of using the potential of the point A as the output potential of the detection/amplification circuit 310 (FIG. 35), the potential of the emitter terminal of the transistor TrL (a point G in FIG. 35) is set as the output potential of the detection/amplification circuit 310. When the radio frequency power is received, the resistance of the transistor TrL is lowered by the DC component $I_{Q1}$ of the current outputted by the sensing diode Q1, and hence, the potential of the point G rises. Accordingly, this potential can also be used as a detection signal.

Alternatively, a circuit of the same configuration as that of the circuit between the supply voltage and the ground as is configured of the diode D1, sensing diode Q1, transistor TrL, subsidiary transistor Tr5 and resistor RL in FIG. 35 may well be further prepared separately so as to connect both the circuits in parallel between the supply voltage and the ground and to differentially output the potential difference between both the G points of the two circuits. Of course, in this case, the matching circuit MC is not connected on the side of the circuit which is added in parallel anew. In this case, accordingly, the diode Q1 on the side of the circuit which is added in parallel anew operates as a non-sensing diode.

Next, there will be explained the functions of the capacitors Ce1 and Ce2 which are arranged between the respective stages in the arrangement of the start signal output circuit 301 (FIG. 34).

The amplification circuit 320 is connected with the detection/amplification circuit 310 through the capacitor $C_{e1}$. The cutoff frequency $f_c$ of a signal which can be inputted to the amplification circuit 320 is determined by the input impedance of this amplification circuit 320 and the capacitor $C_{e1}$. That is, the capacitor $C_{e1}$ achieves the function of forming a high-pass filter.

Accordingly, when a target radio frequency input intermittently arrives at an intermittent period of, for example, about 1/300 second in a case where the cutoff frequency $f_c$ is set at, for example, about 40 Hz, the frequency of the intermittent operation of the arrival of the radio frequency input is much higher than the cutoff frequency $f_c$. Even on such an occasion, therefore, a desired amplification function can be attained by the amplification circuit 320.

Further, according to such a configuration, it is possible to effectively avoid or moderate the phenomenon that low frequency noise (example: flicker noise), an unexpected DC offset, or the like is transmitted from the preceding stage to the intermediate stage, or from the intermediate stage to the succeeding stage of the start signal output circuit. Therefore, a high S/N ratio can be attained.

The input end of the buffer 325 is connected with the output end of the amplification circuit 320 through the capacitor $C_{e2}$. The capacitor $C_{e2}$ has a capacitance being approximately equal to that of the capacitor $C_{e1}$, and it achieves a high-pass filter forming function similar to that of the capacitor $C_{e1}$.

The buffer 325 has a known configuration, and the binarization circuit 230 is the same as in the second embodiment described before.

Even when the differential amplifier is not always introduced into the detection/amplification circuit (310) in this manner by way of example, the functions and advantages of the present invention can be attained on the basis of the first means thereof.

[Other Modified Embodiments]

The mode for carrying out the present invention is not restricted to the foregoing embodiments, but it may well be further modified as exemplified below. The advantages of the invention can be attained on the basis of the functions thereof even by such modifications or applications.

(Modified First Embodiment)

By way of example, in the foregoing second embodiment, a stub or a resonator should more desirably be added on the side of that second terminal of the sensing diode to which the radio frequency power is outputted (example: point A in FIG. 14), in such a manner that both terminals of the additional stub or resonator are short-circuited for a target frequency which is to be received. Desired radio frequency power can be efficiently applied onto the side of that first terminal of the sensing diode to which the radio frequency power is inputted, by adopting a configuration in which the sensing diode is held between the matching circuit and the resonator or the like by way of example.

More concretely, the resonance circuits (Reso) which are disposed in, for example, the detection/amplification circuit in FIGS. 1 and 2 should essentially be preferably included also in the detection/amplification circuit 210. The resonance circuits (Reso) are designed so that the corresponding parts may be short-circuited for the radio frequency to-be-detected, and wave detection sensitivity is enhanced by disposing the resonance circuits (Reso).

Further, a differential amplifier may be combined with a low pass filter by utilizing the fact that the function of low pass filtering is attained in case of operating the differential amplifier at a low current, or such differential amplifiers may be disposed into a plurality of stages, whereby only a bandwidth of at most $\frac{1}{1000}$ as compared with the bandwidth of the radio frequency signal is transmitted and amplified. This is more effective in the invention. That is, only the bandwidth in the vicinity of direct current within the bandwidth of the radio frequency is subjected to the low pass filtering and amplification, so that a sensitivity can be enhanced much more than in the prior art diode wave detection.

Further, in order to remove the unnecessary waves of radio frequency components, a transfer function should desirably decrease monotonously versus the frequency.

Further, not only an ordinary semiconductor diode, but also any other element functioning as a diode can be employed as the sensing diode of the invention. In this regard, especially in the case where the N-P-N type transistor or P-N-P type transistor is adopted in accordance with the eleventh invention of the present application, the miniaturization of an integrated circuit or the design of the bias potentials or bias currents of various circuit parts is facilitated.

INDUSTRIAL APPLICABILITY

The present invention relates to a start signal output circuit having an RF/DC conversion circuit to which radio frequency power (RF) is inputted and from which a direct current potential (DC) is outputted, and a determination circuit which is useful for the start signal output circuit, etc. The start signal output circuit of the invention is applicable to mobile communication devices, and an ETC, a "smart plate", a LAN, a monitoring system, a key-free system for vehicles, etc. as fields in which the mobile communication devices in that case are suitable.

The invention claimed is:

1. A start signal output circuit having an RFIDC conversion circuit to which radio frequency power (RF) of specified frequency is inputted and from which a direct current potential (DC) is outputted, the start signal output circuit comprising:
    a detection/amplification circuit which includes:
    a sensing diode Q1 for sensing the radio frequency power;
    a transistor TrL for amplifying a direct current component $I_{Q1}$ of a current outputted by the sensing diode 01; and
    a current mirror circuit including the transistor TrL as a circuit element,
    wherein a base current $I_B$ of the transistor TrL is in agreement with the direct current component $I_{Q1}$, and an emitter current $I_E$ of the transistor TrL is limited by the current mirror circuit.

2. The start signal output circuit as defined in claim 1, wherein the current mirror circuit includes:
    a reference transistor which has its emitter terminal connected to a predetermined ground point or feed point, and which is endowed with a predetermined load thereby to determine a current quantity of the whole start signal output circuit; and
    a plurality of subsidiary transistors which has emitter terminals connected to the emitter terminal of the reference transistor, and which has respective base terminals connected to a base terminal of the reference transistor thereby to pass currents in quantities identical to a current quantity of the reference transistor, respectively.

3. The start signal output circuit as defined in claim 1, further comprising: a differential amplifier,
    wherein the transistor TrL forming one of differential pair transistors which are arranged in a signal input portion of the differential amplifier, and
    a total of currents flowing through the differential amplifier is regulated to a constant value by the current mirror circuit.

4. The start signal output circuit as defined in claim 3, wherein:
    a non-sensing diode Q2 which does not sense the radio frequency power is disposed in symmetry to the sensing diode Q1 at least logically; and
    a cathode terminal of the non-sensing diode Q2 outputs the same voltage as a cathode terminal voltage of the sensing diode Q1 to a base terminal of the other TrR of the differential pair transistors, while the radio frequency power is not inputted to the start signal output circuit.

5. The stan signal output circuit as defined in claim 4, wherein a whole circuit form of a differential circuit centering around the differential amplifier is configured in symmetry.

6. The start signal output circuit as defined in claim 3, wherein loads of the differential amplifier are active loads of current mirror circuit configuration including two MOSFETs.

7. The stan signal output circuit as defined in claim 6; wherein each of the MOSFETs has a gate length of at least 1 μm, and a gate width of at least 2 μm.

8. The start signal output circuit as defined in claim 1, wherein a matching circuit for efficiently inputting the radio frequency power is connected to a first terminal side of the sensing diode Q1 to which the radio frequency power is inputted.

9. The start signal output circuit as defined of claim 1, wherein a stub or a resonator is connected to a second terminal side of the sensing diode Q1 to which the radio frequency power is outputted, so that both terminals of the stub or the resonator may be short-circuited for the specified frequency.

10. The start signal output circuit as defined in claim 1, wherein the sensing diode Q1 is constructed of a transistor of N-P-N type or P-N-P type whose base and collector are directly connected as the first terminal of the sensing diode Q1 to which the radio frequency power is inputted, and whose emitter is used as the second terminal of the sensing diode Q1 to which the radio frequency power is outputted.

11. The start signal output circuit as defined in claim 1, wherein the detection/amplification circuit includes a voltage doubler wave-detector circuit which is configured in such a way that an output end of a capacitor C1 located in an input portion for the radio frequency power, and a cathode end of a diode D1 having its anode end grounded radio-frequency-wise are connected to an anode end of the sensing diode Q1, and that one end of a capacitor C2 having its other end wounded radio-frequency-wise is connected to a cathode end of the sensing diode Q1.

12. The stan signal output circuit as defined in claim 1, wherein a binarization circuit configured using CMOS is disposed at a succeeding stage, and that the binarization circuit binarizes an output signal of the start signal output circuit.

13. A determination circuit comprising:
a differential amplifier that is in symmetry logically, and which compares an input level with a reference potential,
wherein that regarding a pair of load resistances Ra and Rb which oppose to each other in substantial symmetry at least logically, and which regulate currents to flow through the differential amplifier, while constituting a load portion of the differential amplifier, the load resistance Ra on an input fluctuation side whose input level fluctuates in correspondence with existence or nonexistence of an input of the radio frequency power is set lower than the load resistance Rb on a determination criterion input side.

14. The determination circuit as defined in claim 13, wherein a difference $\Delta R(\equiv Rb-Ra>0)$ between the load resistance Ra and the load resistance Rb is variably adjustable, thereby to freely set a sensitivity of an output potential to an input potential.

15. A determination circuit comprising:
a differential amplifier that is in symmetry logically, and which compares an input level with a reference potential,
wherein a load portion of the differential amplifier for regulating currents flowing through the differential amplifier has a current minor circuit configuration, and is configured of asymmetric active loads.

16. The determination circuit as defined in claim 15, wherein the active loads includes two bipolar transistors.

17. The determination circuit as defined in claim 13, wherein the differential amplifier includes two sets of amplification circuits each of which is configured by Darlington-connected two transistors, the two sets being opposed to each other in substantial symmetry at least logically.

18. The determination circuit as defined in claim 13, wherein a binarization circuit configured using CMOS is disposed at a succeeding stage, and the binarization circuit binarizes a determined result outputted by the determination circuit.

19. A start signal output circuit having an RF/DC conversion circuit to which radio frequency power (RF) of specified frequency is inputted, and from which a direct current potential (DC) is outputted, comprising:
the determination circuit as defined in claim 13.

20. The start signal output circuit as defined in claim 1, comprising: the determination circuit as defined in claim 13.

21. The start signal output circuit as defined in claim 1, further comprising:
a low pass filter or a low band amplification circuit which is configured using a stub, a resonator, an inductor or a smoothing capacitor, whereby regarding a transfer function of the direct current potential (DC) for a detected potential (,, v) of the sensing diode Q1, a narrow band low pass filter characteristic which sharply monotonously decreases especially in a vicinity of a direct current versus frequency values is afforded.

22. The determination circuit as defined in claim 15, wherein the differential amplifier includes two sets of amplification circuits each of which is configured by Darlington-connected two transistors, the two sets being opposed to each other in symmetry at least logically.

23. The determination circuit as defined in claim 15, wherein a binarization circuit configured using CMOS is disposed at a succeeding stage, and the binarization circuit binarizes a determined result outputted by the determination circuit.

24. A start signal output circuit having an RF/DC conversion circuit to which radio frequency power (RF) of specified frequency is inputted, and from which a direct current potential (DC) is outputted, comprising:
the determination circuit as defined in claim 15.

25. The start signal output circuit as defined in claim 1, comprising:
the determination circuit as defined in claim 15.

26. The stan signal output circuit as defined claim 19, further comprising:
a low pass filter or a low band amplification circuit which is configured using a stub, a resonator, an inductor or a smoothing capacitor, whereby regarding a transfer function of the direct current potential (DC) for a detected potential (,, v) of the sensing diode Q1, a narrow band low pass filter characteristic which sharply monotonously decreases especially in a vicinity of a direct current versus frequency values is afforded.

27. The start signal output circuit as defined in claim 24, further comprising:
a low pass filter or a low band amplification circuit which is configured using a stub, a resonator, an inductor or a smoothing capacitor, whereby regarding a transfer function of the direct current potential (DC) for a detected potential (,, v) of the sensing diode Q1, a narrow band low pass filter characteristic which sharply monotonously decreases especially in a vicinity of a direct current versus frequency values is afforded.

28. The start signal output circuit as defined in claim 20, further comprising:
a low pass filter or a low band amplification circuit which is configured using a stub, a resonator, an inductor or a smoothing capacitor, whereby regarding a transfer function of the direct current potential (DC) for a detected potential (,, v) of the sensing diode Q1, a narrow band low pass filter characteristic which sharply monotonously decreases especially in a vicinity of a direct current versus frequency values is afforded.

29. The start signal output circuit as defined in claim 25, further comprising:
a low pass filter or a low band amplification circuit which is configured using a stub, a resonator, an inductor or a smoothing capacitor, whereby regarding a transfer function of the direct current potential (DC) for a detected potential (,, v) of the sensing diode Q1, a narrow band low pass filter characteristic which sharply monotonously decreases especially in a vicinity of a direct current versus frequency values is afforded.

* * * * *